(12) United States Patent
Patterson et al.

(10) Patent No.: US 11,294,254 B2
(45) Date of Patent: Apr. 5, 2022

(54) BUILDING NETWORK

(71) Applicant: View, Inc., Milpitas, CA (US)

(72) Inventors: Thomas Alan Patterson, Portola Valley, CA (US); Rao Mulpuri, Saratoga, CA (US); Nitesh Trikha, Pleasanton, CA (US); Stephen Clark Brown, San Mateo, CA (US); Dhairya Shrivastava, Los Altos, CA (US); Robert T. Rozbicki, Los Gatos, CA (US)

(73) Assignee: View, Inc., Milpitas, CA (US)

( * ) Notice: Subject to any disclaimer, the term of this patent is extended or adjusted under 35 U.S.C. 154(b) by 42 days.

(21) Appl. No.: 16/664,089

(22) Filed: Oct. 25, 2019

(65) Prior Publication Data
US 2020/0150508 A1 May 14, 2020

Related U.S. Application Data

(63) Continuation-in-part of application No. PCT/US2019/030467, filed on May 2, 2019, which is
(Continued)

(51) Int. Cl.
*G02F 1/163* (2006.01)
*H02J 50/20* (2016.01)
(Continued)

(52) U.S. Cl.
CPC ............... *G02F 1/163* (2013.01); *E06B 9/24* (2013.01); *G05B 19/042* (2013.01); *H02J 50/20* (2016.02);
(Continued)

(58) Field of Classification Search
CPC . G02F 1/163; H02J 50/80; E06B 9/24; G05B 19/042
(Continued)

(56) References Cited

U.S. PATENT DOCUMENTS 4,129,861 A 12/1978 Giglia
4,553,085 A 11/1985 Canzano
(Continued)

FOREIGN PATENT DOCUMENTS

CN 1161092 A 10/1997
CN 1311935 A 9/2001
(Continued)

OTHER PUBLICATIONS

US Corrected Notice of Allowability dated Jun. 4, 2020 in U.S. Appl. No. 16/298,776.
(Continued)

*Primary Examiner* — Mohammad Ali
*Assistant Examiner* — Joshua T Sanders
(74) *Attorney, Agent, or Firm* — Weaver Austin Villeneuve & Sampson LLP; Ryan Otis

(57) ABSTRACT

A tintable window is described having a tintable coating, e.g., an electrochromic device coating, for regulating light transmitted through the window. In some embodiments, the window has a transparent display in the window's viewable region. Transparent displays may be substantially transparent when not in use, or when the window is viewed in a direction facing away from the transparent display. Windows may have sensors for receiving user commands and/or for monitoring environmental conditions. Transparent displays can display graphical user interfaces to, e.g., control window functions. Windows, as described herein, offer an alternative display to conventional projectors, TVs, and monitors. Windows may also be configured to receive, transmit, or block wireless communications from passing through the window. A window control system may share computational resources between controllers (e.g., at different windows). In some cases, the computational resources of
(Continued)

the window control system are utilized by other building systems and devices.

39 Claims, 32 Drawing Sheets

Related U.S. Application Data a continuation-in-part of application No. PCT/US2018/029460, filed on Apr. 25, 2018, said application No. 16/664,089 is a continuation-in-part of application No. PCT/US2018/029460, filed on Apr. 25, 2018.

(60) Provisional application No. 62/607,618, filed on Dec. 19, 2017, provisional application No. 62/523,606, filed on Jun. 22, 2017, provisional application No. 62/507,704, filed on May 17, 2017, provisional application No. 62/506,514, filed on May 15, 2017, provisional application No. 62/490,457, filed on Apr. 26, 2017.

(51) Int. Cl.
*H02J 50/80* (2016.01)
*G05B 19/042* (2006.01)
*E06B 9/24* (2006.01)

(52) U.S. Cl.
CPC ....... *H02J 50/80* (2016.02); *E06B 2009/2417* (2013.01); *E06B 2009/2464* (2013.01); *G05B 2219/25011* (2013.01); *G05B 2219/25252* (2013.01); *G05B 2219/2614* (2013.01); *G05B 2219/2628* (2013.01)

(58) Field of Classification Search
USPC ....................................................... 700/276
See application file for complete search history.

(56) References Cited

U.S. PATENT DOCUMENTS

| | | |
|---|---|---|
| 5,384,653 A | 1/1995 | Benson et al. |
| 5,416,617 A | 5/1995 | Loiseaux et al. |
| 5,440,317 A * | 8/1995 | Jalloul .................. H01Q 1/084 343/702 |
| 5,477,152 A | 12/1995 | Hayhurst |
| 5,579,149 A | 11/1996 | Moret et al. |
| 6,039,390 A | 3/2000 | Agrawal et al. |
| 6,055,089 A | 4/2000 | Schulz et al. |
| 6,066,801 A | 5/2000 | Kodaira et al. |
| 6,262,831 B1 | 7/2001 | Bauer et al. |
| 6,344,748 B1 | 2/2002 | Gannon |
| 6,407,847 B1 | 6/2002 | Poll et al. |
| 6,567,708 B1 | 5/2003 | Bechtel et al. |
| 6,707,590 B1 | 3/2004 | Bartsch |
| 6,897,936 B1 | 5/2005 | Li et al. |
| 6,965,813 B2 | 11/2005 | Granqvist et al. |
| 7,133,181 B2 | 11/2006 | Greer |
| 7,684,105 B2 | 3/2010 | Lamontagne et al. |
| 7,800,812 B2 | 9/2010 | Moskowitz |
| 7,941,245 B1 | 5/2011 | Popat |
| 8,149,756 B2 | 4/2012 | Hottinen |
| 8,254,013 B2 | 8/2012 | Mehtani et al. |
| 8,705,162 B2 | 4/2014 | Brown et al. |
| 8,843,238 B2 | 9/2014 | Wenzel et al. |
| 8,976,440 B2 | 3/2015 | Berland et al. |
| 9,081,246 B2 | 7/2015 | Rozbicki |
| 9,128,346 B2 | 9/2015 | Shrivastava et al. |
| 9,170,008 B2 | 10/2015 | Reul et al. |
| 9,225,286 B1 | 12/2015 | Tweedie |
| 9,300,581 B1 | 3/2016 | Hui et al. |
| 9,442,338 B2 | 9/2016 | Uhm et al. |
| 9,442,341 B2 | 9/2016 | Shrivastava et al. |
| 9,470,947 B2 | 10/2016 | Nagel et al. |
| 9,494,055 B2 | 11/2016 | Rusche |
| 9,551,913 B2 | 1/2017 | Kim et al. |
| 9,677,327 B1 | 6/2017 | Nagel et al. |
| 9,690,174 B2 | 6/2017 | Wang |
| 9,709,869 B2 | 7/2017 | Baumann et al. |
| 9,740,074 B2 | 8/2017 | Agrawal et al. |
| 9,778,533 B2 | 10/2017 | Bertolini |
| 9,898,912 B1 | 2/2018 | Jordan, II et al. |
| 9,946,138 B2 | 4/2018 | Shrivastava et al. |
| 10,001,691 B2 | 6/2018 | Shrivastava et al. |
| 10,137,764 B2 | 11/2018 | Driscoll et al. |
| 10,268,098 B2 | 4/2019 | Shrivastava et al. |
| 10,286,839 B1 | 5/2019 | Mazuir et al. |
| 10,288,971 B2 | 5/2019 | Philips et al. |
| 10,303,035 B2 | 5/2019 | Brown et al. |
| 10,329,839 B2 | 6/2019 | Fasi et al. |
| 10,387,221 B2 | 8/2019 | Shrivastava et al. |
| 10,409,652 B2 | 9/2019 | Shrivastava et al. |
| 10,481,459 B2 | 11/2019 | Shrivastava et al. |
| 10,488,837 B2 | 11/2019 | Cirino |
| 10,514,963 B2 | 12/2019 | Shrivastava et al. |
| 10,720,766 B2 | 7/2020 | Krammer et al. |
| 10,746,761 B2 | 8/2020 | Rayman et al. |
| 10,747,082 B2 | 8/2020 | Shrivastava et al. |
| 10,768,582 B2 | 9/2020 | Shrivastava et al. |
| 10,859,983 B2 | 12/2020 | Shrivastava et al. |
| 10,917,259 B1 | 2/2021 | Chein et al. |
| 10,921,675 B2 | 2/2021 | Barnum et al. |
| 10,949,267 B2 | 3/2021 | Shrivastava et al. |
| 10,954,677 B1 | 3/2021 | Scanlin |
| 10,956,231 B2 | 3/2021 | Shrivastava et al. |
| 10,989,977 B2 | 4/2021 | Shrivastava et al. |
| 11,016,357 B2 | 5/2021 | Brown et al. |
| 11,054,792 B2 | 7/2021 | Shrivastava et al. |
| 11,073,800 B2 | 7/2021 | Shrivastava et al. |
| 2002/0027504 A1 | 3/2002 | Davis et al. |
| 2002/0149829 A1 | 10/2002 | Mochizuka et al. |
| 2003/0169574 A1 | 9/2003 | Maruyama et al. |
| 2003/0191546 A1 | 10/2003 | Bechtel et al. |
| 2003/0227663 A1 | 12/2003 | Agrawal et al. |
| 2004/0001056 A1 | 1/2004 | Atherton et al. |
| 2004/0215520 A1 | 10/2004 | Butler et al. |
| 2005/0270620 A1 | 12/2005 | Bauer et al. |
| 2005/0270621 A1 | 12/2005 | Bauer et al. |
| 2006/0018000 A1 | 1/2006 | Greer |
| 2006/0107616 A1 | 5/2006 | Ratti et al. |
| 2006/0174333 A1 | 8/2006 | Thomas et al. |
| 2006/0279527 A1 | 12/2006 | Zehner et al. |
| 2007/0053053 A1 | 3/2007 | Moskowitz |
| 2007/0067048 A1 | 3/2007 | Bechtel et al. |
| 2007/0285759 A1 | 12/2007 | Ash et al. |
| 2008/0042012 A1 | 2/2008 | Callahan et al. |
| 2008/0043316 A2 | 2/2008 | Moskowitz |
| 2008/0048101 A1 | 2/2008 | Romig et al. |
| 2008/0147847 A1 | 6/2008 | Pitkow et al. |
| 2008/0186562 A2 | 8/2008 | Moskowitz |
| 2008/0211682 A1 | 9/2008 | Hyland et al. |
| 2008/0238706 A1 | 10/2008 | Kenwright |
| 2009/0271042 A1 | 10/2009 | Voysey |
| 2009/0323160 A1 | 12/2009 | Egerton et al. |
| 2010/0039410 A1 | 2/2010 | Becker et al. |
| 2010/0172010 A1 | 7/2010 | Gustavsson et al. |
| 2010/0188057 A1 | 7/2010 | Tarng |
| 2010/0228854 A1 | 9/2010 | Morrison et al. |
| 2010/0243427 A1 | 9/2010 | Kozlowski et al. |
| 2010/0245973 A1 | 9/2010 | Wang et al. |
| 2010/0274366 A1 | 10/2010 | Fata et al. |
| 2010/0315693 A1 | 12/2010 | Lam et al. |
| 2011/0050756 A1 | 3/2011 | Cassidy et al. |
| 2011/0071685 A1 | 3/2011 | Huneycutt et al. |
| 2011/0097081 A1 | 4/2011 | Gupta et al. |
| 2011/0148218 A1 | 6/2011 | Rozbicki |
| 2011/0164317 A1 | 7/2011 | Verghol et al. |
| 2012/0026573 A1 | 2/2012 | Collins et al. |
| 2012/0033287 A1 | 2/2012 | Friedman et al. |
| 2012/0062975 A1 | 3/2012 | Mehtani et al. |
| 2012/0086363 A1 | 4/2012 | Golding et al. |

(56) References Cited

U.S. PATENT DOCUMENTS

| | | |
|---|---|---|
| 2012/0140492 A1 | 6/2012 | Alvarez |
| 2012/0188627 A1 | 7/2012 | Chen et al. |
| 2012/0190386 A1 | 7/2012 | Anderson |
| 2012/0194895 A1 | 8/2012 | Podbelski et al. |
| 2012/0229275 A1 | 9/2012 | Mattern |
| 2012/0235493 A1 | 9/2012 | Kiuchi et al. |
| 2012/0239209 A1 | 9/2012 | Brown et al. |
| 2012/0259583 A1 | 10/2012 | Noboa et al. |
| 2012/0293855 A1 | 11/2012 | Shrivastava et al. |
| 2013/0013921 A1 | 1/2013 | Bhathena et al. |
| 2013/0060357 A1 | 3/2013 | Li et al. |
| 2013/0085614 A1 | 4/2013 | Wenzel et al. |
| 2013/0085615 A1 | 4/2013 | Barker |
| 2013/0085616 A1 | 4/2013 | Wenzel et al. |
| 2013/0088331 A1 | 4/2013 | Cho et al. |
| 2013/0131869 A1 | 5/2013 | Majewski et al. |
| 2013/0157493 A1 | 6/2013 | Brown |
| 2013/0158790 A1 | 6/2013 | McIntyre, Jr. et al. |
| 2013/0182308 A1 | 7/2013 | Guarr et al. |
| 2013/0196600 A1 | 8/2013 | Capers et al. |
| 2013/0241299 A1 | 9/2013 | Snyker et al. |
| 2013/0243425 A1* | 9/2013 | Franklin ............ H05B 45/382 398/38 |
| 2013/0271812 A1 | 10/2013 | Brown et al. |
| 2013/0271813 A1 | 10/2013 | Brown |
| 2013/0271814 A1 | 10/2013 | Brown |
| 2013/0278989 A1 | 10/2013 | Lam et al. |
| 2014/0156097 A1 | 6/2014 | Nesler et al. |
| 2014/0160550 A1 | 6/2014 | Brown et al. |
| 2014/0170863 A1 | 6/2014 | Brown |
| 2014/0172557 A1 | 6/2014 | Eden et al. |
| 2014/0182350 A1 | 7/2014 | Bhavaraju et al. |
| 2014/0236323 A1 | 8/2014 | Brown et al. |
| 2014/0274458 A1 | 9/2014 | Kronenberg et al. |
| 2014/0303788 A1 | 10/2014 | Sanders et al. |
| 2014/0330538 A1 | 11/2014 | Conklin et al. |
| 2014/0347190 A1 | 11/2014 | Grimm |
| 2014/0349497 A1 | 11/2014 | Brown et al. |
| 2014/0367057 A1 | 12/2014 | Feldstein |
| 2014/0368899 A1* | 12/2014 | Greer ................. E06B 9/24 359/275 |
| 2014/0371931 A1* | 12/2014 | Lin ..................... E06B 7/02 700/287 |
| 2015/0002919 A1 | 1/2015 | Jack et al. |
| 2015/0023661 A1 | 1/2015 | Borkenhagen et al. |
| 2015/0098121 A1 | 4/2015 | Turnbull et al. |
| 2015/0116811 A1 | 4/2015 | Shrivastava et al. |
| 2015/0120297 A1 | 4/2015 | Meruva |
| 2015/0129140 A1 | 5/2015 | Dean et al. |
| 2015/0003822 A1 | 6/2015 | Fukada et al. |
| 2015/0160525 A1 | 6/2015 | Shi |
| 2015/0378230 A1 | 12/2015 | Gudmunson et al. |
| 2015/0378231 A1 | 12/2015 | Greer et al. |
| 2016/0070151 A1 | 3/2016 | Shrivastava et al. |
| 2016/0109778 A1 | 4/2016 | Shrivastava et al. |
| 2016/0134932 A1 | 5/2016 | Karp et al. |
| 2016/0154290 A1 | 6/2016 | Brown et al. |
| 2016/0202589 A1 | 7/2016 | Nagel et al. |
| 2016/0203403 A1 | 7/2016 | Nagel et al. |
| 2016/0225832 A1 | 8/2016 | Kwon et al. |
| 2017/0063429 A1 | 3/2017 | Flask |
| 2017/0075323 A1 | 3/2017 | Shrivastava et al. |
| 2017/0082903 A1 | 3/2017 | Vigano et al. |
| 2017/0097259 A1 | 4/2017 | Brown et al. |
| 2017/0139301 A1 | 5/2017 | Messere et al. |
| 2017/0197494 A1 | 7/2017 | Li |
| 2017/0200424 A1 | 7/2017 | Xu et al. |
| 2017/0212400 A1 | 7/2017 | Shrivastava et al. |
| 2017/0234067 A1 | 8/2017 | Fasi et al. |
| 2017/0251488 A1 | 8/2017 | Urban et al. |
| 2017/0253801 A1 | 9/2017 | Bae et al. |
| 2017/0279930 A1 | 9/2017 | Zhang |
| 2017/0285432 A1 | 10/2017 | Shrivastava et al. |
| 2017/0285433 A1 | 10/2017 | Shrivastava et al. |
| 2017/0347129 A1 | 11/2017 | Levi et al. |
| 2017/0364395 A1 | 12/2017 | Shrivastava et al. |
| 2018/0090992 A1 | 3/2018 | Shrivastava et al. |
| 2018/0129172 A1 | 5/2018 | Shrivastava et al. |
| 2018/0144712 A1 | 5/2018 | Threlkel et al. |
| 2018/0189117 A1 | 7/2018 | Shrivastava et al. |
| 2018/0267380 A1 | 9/2018 | Shrivastava et al. |
| 2018/0284555 A1 | 10/2018 | Klawuhn et al. |
| 2018/0335939 A1 | 11/2018 | Karunamuni et al. |
| 2019/0155122 A1 | 5/2019 | Brown et al. |
| 2019/0235451 A1 | 8/2019 | Shrivastava et al. |
| 2019/0271895 A1 | 9/2019 | Shrivastava et al. |
| 2019/0331978 A1 | 10/2019 | Shrivastava et al. |
| 2019/0347141 A1 | 11/2019 | Shrivastava et al. |
| 2019/0353972 A1 | 11/2019 | Shrivastava et al. |
| 2019/0384652 A1 | 12/2019 | Shrivastava et al. |
| 2020/0041963 A1 | 2/2020 | Shrivastava et al. |
| 2020/0041967 A1 | 2/2020 | Shrivastava et al. |
| 2020/0057421 A1 | 2/2020 | Trikha et al. |
| 2020/0103841 A1 | 4/2020 | Pillai et al. |
| 2020/0387041 A1 | 12/2020 | Shrivastava et al. |
| 2021/0191221 A1 | 6/2021 | Shrivastava et al. |
| 2021/0165696 A1 | 7/2021 | Shrivastava et al. |
| 2021/0232015 A1 | 7/2021 | Brown et al. |
| 2021/0246719 A1 | 8/2021 | Shrivastava et al. |

FOREIGN PATENT DOCUMENTS

| | | |
|---|---|---|
| CN | 1692348 A | 11/2005 |
| CN | 1723658 A | 1/2006 |
| CN | 101154104 A | 4/2008 |
| CN | 101253460 A | 8/2008 |
| CN | 101501757 A | 8/2009 |
| CN | 101510078 A | 8/2009 |
| CN | 102414601 A | 4/2012 |
| CN | 102598469 A | 7/2012 |
| CN | 202443309 U | 9/2012 |
| CN | 103051737 A | 4/2013 |
| CN | 103327126 A | 9/2013 |
| CN | 103345236 A | 10/2013 |
| CN | 103547965 A | 1/2014 |
| CN | 103649826 A | 3/2014 |
| CN | 103842735 A | 6/2014 |
| CN | 103987909 A | 8/2014 |
| EP | 1929701 | 6/2008 |
| EP | 2357544 | 8/2011 |
| EP | 2648086 A2 | 10/2013 |
| EP | 2764998 A1 | 8/2014 |
| EP | 2357544 | 10/2014 |
| EP | 3015915 A1 | 5/2016 |
| EP | 2837205 | 2/2017 |
| EP | 3293941 A1 | 3/2018 |
| EP | 3352053 A1 | 7/2018 |
| JP | H10-215492 A | 8/1998 |
| JP | H11-500838 A | 1/1999 |
| JP | 2003-284160 A | 10/2003 |
| JP | 2007-156909 A | 6/2007 |
| JP | 2012533060 A | 12/2012 |
| KR | 10-1999-0088613 A | 12/1999 |
| KR | 10-2003-0040361 A | 5/2003 |
| KR | 10-2003-0073121 A | 9/2003 |
| KR | 20090066107 A | 6/2009 |
| KR | 10-2012-0045915 | 5/2012 |
| KR | 20120117409 A | 10/2012 |
| KR | 20130023668 A | 3/2013 |
| KR | 10-1323668 | 11/2013 |
| KR | 10-2014-0004175 A | 1/2014 |
| KR | 10-1346862 B | 1/2014 |
| KR | 10-1799323 B1 | 11/2017 |
| RU | 104808 U1 | 5/2011 |
| RU | 2012107324 A | 9/2013 |
| TW | 200532346 A | 10/2005 |
| WO | WO-03092309 A1 | 11/2003 |
| WO | WO2012/079159 | 6/2012 |
| WO | WO2012/125332 A2 | 9/2012 |
| WO | WO-2012125348 A2 | 9/2012 |
| WO | WO2013/046112 A1 | 4/2013 |
| WO | WO2013/155467 A1 | 10/2013 |
| WO | WO2013/158464 A1 | 10/2013 |
| WO | WO2013/177575 A1 | 11/2013 |

(56) References Cited

FOREIGN PATENT DOCUMENTS

| WO | WO2014/059268 A2 | 4/2014 |
|---|---|---|
| WO | WO2014/082092 | 5/2014 |
| WO | WO2014/121809 | 8/2014 |
| WO | WO2014/130471 | 8/2014 |
| WO | WO2015/051262 A1 | 4/2015 |
| WO | WO2015/134789 | 9/2015 |
| WO | WO2016/004109 | 1/2016 |
| WO | WO2016/085964 | 6/2016 |
| WO | WO2016/094445 | 6/2016 |
| WO | WO2016/183059 A1 | 11/2016 |
| WO | WO2017/007841 A1 | 1/2017 |
| WO | WO2017/075059 | 5/2017 |
| WO | WO2017/189618 A1 | 11/2017 |
| WO | WO2018/067377 A1 | 4/2018 |
| WO | WO2018/200702 A1 | 11/2018 |
| WO | WO2018/200740 A1 | 11/2018 |
| WO | WO2018/200752 A1 | 11/2018 |
| WO | WO2019/203931 | 10/2019 |
| WO | WO2020/172187 | 8/2020 |

OTHER PUBLICATIONS

US Notice of Allowance dated Apr. 6, 2020 in U.S. Appl. No. 16/298,776.
US Final Office Action dated Mar. 3, 2020 in U.S. Appl. No. 16/508,099.
US Office Action dated Jul. 23, 2020 in U.S. Appl. No. 16/508,099.
US Final Office Action dated Mar. 18, 2020 in U.S. Appl. No. 16/253,971.
US Office Action dated Jul. 29, 2020 in U.S. Appl. No. 16/253,971.
US Notice of Allowance dated Apr. 9, 2020 in U.S. Appl. No. 15/123,069.
US Notice of Allowance dated May 6, 2020 in U.S. Appl. No. 15/623,237.
US Notice of Allowance dated Jul. 1, 2020 in U.S. Appl. No. 15/623,237.
US Office Action dated May 6, 2020 in U.S. Appl. No. 15/691,468.
US Office Action dated Jul. 21, 2020 in U.S. Appl. No. 16/523,624.
US Office Action dated Jul. 21, 2020 in U.S. Appl. No. 16/555,377.
US Preliminary Amendment dated Dec. 31, 2019 in U.S. Appl. No. 16/608,159.
Taiwanese Office Action dated Feb. 27, 2020 in TW Application No. 108126548.
Australian Examination Report dated Mar. 2, 2020 in AU Application No. 2015353569.
EP Extended Search Report dated Dec. 17, 2019 in EP Application No.
Australian Examination Report dated Dec. 24, 2019 in AU Application No. 2015227056.
CN Office Action dated Jan. 15, 2020 in CN Application No. 201580015979.2.
CN Office Action dated Jun. 3, 2020 in CN Application No. 201580015979.2.
CN Office Action dated Mar. 9, 2020 in CN Application No. 201580040461.4.
CN Office Action dated Feb. 3, 2020 in CN Application No. 201580072749.X.
EP Office Action dated May 14, 2020 in EP Application No. 15868003.3.
JP Office Action dated Jun. 16, 2020 in JP Application No. 2017-549175.
US Final Office Action dated Jan. 27, 2014 in U.S. Appl. No. 13/479,137.
US Final Office Action dated Feb. 26, 2015 in U.S. Appl. No. 13/479,137.
US Notice of Allowance dated May 14, 2015 in U.S. Appl. No. 13/479,137.
US Notice of Allowance (supplemental) dated Jun. 12, 2015 in U.S. Appl. No. 13/479,137.
US Office Action dated Sep. 23, 2013 in U.S. Appl. No. 13/479,137.
US Office Action dated Jul. 3, 2014 in U.S. Appl. No. 13/479,137.
US Final Office Action dated Sep. 19, 2016 in U.S. Appl. No. 14/887,178.
US Final Office Action dated Mar. 17, 2017 in U.S. Appl. No. 14/887,178.
US Notice of Allowance dated Mar. 9, 2018 in U.S. Appl. No. 14/887,178.
US Office Action dated Mar. 25, 2016 in U.S. Appl. No. 14/887,178.
US Office Action dated Oct. 23, 2017 in U.S. Appl. No. 14/887,178.
US Notice of Allowance dated Dec. 13, 2018 in U.S. Appl. No. 15/978,029.
US Office Action dated July 24, 2018 in U.S. Appl. No. 15/978,029.
US Office Action dated Aug. 22, 2019 in U.S. Appl. No. 16/298,776.
US Office Action dated Aug. 21, 2019 in U.S. Appl. No. 16/508,099.
US Final Office Action dated Mar. 15, 2018 in U.S. Appl. No. 14/951,410.
US Notice of Allowance dated Oct. 22, 2018 in U.S. Appl. No. 14/951,410.
US Office Action dated Sep. 11, 2017 in U.S. Appl. No. 14/951,410.
US Office Action dated Jul. 25, 2019 in U.S. Appl. No. 16/253,971.
US Notice of Allowance dated Nov. 28, 2018 in U.S. Appl. No. 15/123,069.
US Notice of Allowance dated Jul. 17, 2019 in U.S. Appl. No. 15/123,069.
US Office Action dated Apr. 27, 2018 in U.S. Appl. No. 15/123,069.
Preliminary Amendment dated Jan. 18, 2017 in U.S. Appl. No. 15/123,069.
US Office Action dated Feb. 7, 2019 in U.S. Appl. No. 15/623,237.
US Final Office Action dated Jul. 3, 2019 in U.S. Appl. No. 15/623,237.
US Office Action dated Feb. 7, 2019 in U.S. Appl. No. 15/691,468.
US Final Office Action dated Jul. 2, 2019 in U.S. Appl. No. 15/691,468.
US Notice of Allowance dated Mar. 20, 2019 in U.S. Appl. No. 15/320,725.
US Notice of Allowance (corrected) dated Apr. 18, 2019 in U.S. Appl. No. 15/320,725.
US Office Action dated Sep. 4, 2018 in U.S. Appl. No. 15/320,725.
US Notice of Allowance dated Jul. 17, 2019 in U.S. Appl. No. 15/320,725.
US Final Office Action dated Jan. 31, 2019 in U.S. Appl. No. 15/534,175.
US Notice of Allowance dated Apr. 17, 2019 in U.S. Appl. No. 15/534,175.
US Notice of Allowance dated July 25, 2019 in U.S. Appl. No. 15/534,175.
US Office Action dated Jul. 6, 2018 in U.S. Appl. No. 15/534,175.
US Office Action dated Feb. 4, 2019 in U.S. Appl. No. 15/623,235.
US Notice of Allowance dated May 14, 2019 in U.S. Appl. No. 15/623,235.
US Notice of Allowance dated Dec. 14, 2018 in U.S. Appl. No. 15/910,936.
US Notice of Allowance dated Apr. 17, 2019 in U.S. Appl. No. 15/910,936.
US Office Action dated Aug. 7, 2018 in U.S. Appl. No. 15/910,936.
Taiwanese Office Action dated Dec. 12, 2018 in TW Application No. 107129150.
CN Office Action dated Aug. 28, 2018 in CN Application No. 201580070776.3.
CN Office Action dated Mar. 19, 2019 in CN Application No. 201580070776.3.
CN Office Action dated Oct. 9, 2019 in CN Application No. 201580070776.3.
EP Extended Search Report dated Nov. 8, 2018 in EP Application No. 15863112.7.
EP Extended Search Report dated Nov. 28, 2019 in EP Application No. 19188907.0.
International Preliminary Report on Patentability dated Jun. 8, 2017 in PCT/US2015/062480.
International Search Report and Written Opinion dated Feb. 15, 2016 in PCT/US2015/062480.
International Search Report and Written Opinion (ISA/KR) dated Jun. 14, 2019 in PCT/US2019/019455.

(56) References Cited

OTHER PUBLICATIONS

CN Office Action dated Feb. 2, 2019 in CN Application No. 201580015979.2.
CN Office Action dated Aug. 16, 2019 in CN Application No. 201580015979.2.
EP Extended Search Report dated Jun. 19, 2017 in EP Application No. 15758538.1.
EP Office Action dated August 21, 2018 in EP Application No. 15758538.1.
RU Office Action dated Sep. 24, 2018 in RU Application No. 2016139012.
International Preliminary Report on Patentability dated Sep. 15, 2016 in Application No. PCT/US2015/019031.
International Search Report and Written Opinion dated May 29, 2015 in Application No. PCT/US2015/019031.
EP Extended Search Report dated Feb. 15, 2018 in EP Application No. 15814233.1.
EP Examination Report dated Mar. 4, 2019 in EP Application No. 15814233.1.
International Preliminary Report on Patentability dated Jan. 12, 2017 in PCT Application No. PCT/US15/38667.
International Search Report and Written Opinion dated Oct. 16, 2015 in PCT Application No. PCT/US15/38667.
EP Extended Search Report dated Jun. 5, 2018 in EP Application No. 15868003.3.
JP Office Action dated Nov. 19, 2019 in JP Application No. 2017-549175.
International Preliminary Report on Patentability dated Jun. 22, 2017 in PCT Application No. PCT/US15/64555.
International Search Report and Written Opinion dated Oct. 16, 2015 in PCT Application No. PCT/US15/64555.
Russian Office Action dated Jul. 10, 20019 in RU Application No. 2017123902.
International Preliminary Report on Patentability dated Apr. 18, 2019 in PCT Application No. PCT/US17/54120.
International Search Report and Written Opinion (ISA/KR) dated Jan. 9, 2018 in PCT Application No. PCT/US17/54120.
International Search Report and Written Opinion dated Nov. 16, 2018 in PCT Application No. PCT/US2018/029460.
International Search Report and Written Opinion dated Oct. 15, 2018 in PCT Application No. PCT/US2018/029406.
International Preliminary Report on Patentability dated Nov. 7, 2019 in PCT Application No. PCT/US2018/029460.
International Preliminary Report on Patentability dated November 7, 2019 in PCT Application No. PCT/US2018/029406.
Taiwanese Office Action dated May 13, 2019 in TW Application No. 104139217.
International Search Report and Written Opinion dated Jul. 11, 2019 in PCT Application No. PCT/US2019/030467.
APC by Schneider Electric, Smart-UPS 120V Product Brochure, 2013, 8 pp.
National Aeronautics & Space Administration, "Cloud Remote Sensing and Modeling," (undated) [http://atmospheres.gsfc.nasa.gov/climate/index.php?section=134].
Kipp & Zonen, "Solar Radiation" (undated) [http://www.kippzonen.com/Knowledge-Center/Theoretical-info/Solar-Radiation].
Duchon, Claude E. et al., "Estimating Cloud Type from Pyranometer Observations," Journal of Applied Meteorology, vol. 38, Jan. 1999, pp. 132-141.
"SageGlass Unplugged™—wireless dynamic glass", 2014, 2 pages.
"Ossia Wireless Charging", screenshot and picture of Cota device, accessed Apr. 20, 2015, 1 page.
"SageGlass Mobile App" screenshot, accessed Aug. 28, 2015, 1 page.
"Sage Product Highlights" screenshot, accessed Aug. 28, 2015, 1 page.
"SageGlass Unplugged" screenshot, accessed Aug. 28, 2015, 1 page.
U.S. Appl. No. 16/338,403, filed Mar. 29, 2019, Shrivastava et al.
U.S. Appl. No. 16/555,377, filed Aug. 29, 2019, Shrivastava et al.
U.S. Appl. No. 16/655,032, filed Oct. 16, 2019, Shrivastava et al.
U.S. Appl. No. 16/608,159, filed Oct. 24, 2019, Trikha et al.
U.S. Appl. No. 16/664,089, filed Oct. 25, 2019, Patterson et al.
EP Extended European Search Report dated Sep. 14, 2021, in the application EP21182449.7.
EP office action dated Aug. 25, 2021, in EP Application No. EP19202054.3.
JP office action dated Sep. 7, 2021, in JP Application No. 2020-175033.
US Corrected Notice of Allowability dated Sep. 23, 2021, in U.S. Appl. No. 16/338,403.
U.S. Pat. Appl. No. PCT/US2021/017946, filed on Feb. 12, 2021.
US Notice of Allowance dated Dec. 7, 2020 in U.S. Appl. No. 16/508,099.
US Notice of Allowance dated Feb. 4, 2021 in U.S. Appl. No. 16/253,971.
US Corrected Notice of Allowability dated May 3, 2021 in U.S. Appl. No. 16/253,971.
US Notice of Allowability (supplemental) dated Sep. 30, 2020 in U.S. Appl. No. 15/123,069.
US Notice of Allowance dated Nov. 3, 2020 in U.S. Appl. No. 15/691,468.
US Notice of Allowance dated Mar. 10, 2021 in U.S. Appl. No. 15/691,468.
US Office Action dated Sep. 30, 2020 in U.S. Appl. No. 16/254,434.
US Notice of Allowance dated Mar. 26, 2021 in U.S. Appl. No. 16/254,434.
US Notice of Allowance dated Dec. 31, 2020 in U.S. Appl. No. 16/523,624.
US Notice of Allowance dated Dec. 31, 2020 in U.S. Appl. No. 16/555,377.
US Office Action dated Aug. 7, 2020 in U.S. Appl. No. 16/338,403.
US Final Office Action dated Dec. 23, 2020 in U.S. Appl. No. 16/338,403.
US Notice of Allowance dated Jun. 14, 2021 in U.S. Appl. No. 16/338,403.
CN Office Action dated Jun. 29, 2021 in CN Application No. 202010466929.9.
European Office Action dated Feb. 25, 2021 in EP Application No. 15863112.7.
Indian Office Action dated Feb. 24, 2021 in IN Application No. 201737021981.
International Preliminary Report on Patentability dated Oct. 29, 2020 in PCT/US2019/019455.
EP Office Action dated Nov. 19, 2020 in EP Application No. 15758538.1.
IN Office Action dated Aug. 2, 2021 in IN Application No. 201637028587.
KR Office Action dated Jan. 22, 2021 in KR Application No. 10-2016-7025862.
KR Office Action dated Jul. 31, 2021 in KR Application No. 10-2016-7025862.
CN Office Action dated Oct. 21, 2020 in CN Application No. 201580040461.4.
CN Notice of Allowance with Supplemental Search Report (w/translation) dated Mar. 1, 2021 in CN Application No. 201580040461.4.
Australian Office Action dated Aug. 10, 2020 in AU Application No. 2015360714.
Australian Office Action dated Dec. 4, 2020 in AU Application No. 2015360714.
Australian Office Action dated Jun. 4, 2021 in AU Application No. 2015360714.
Australian Office Action dated Aug. 9, 2021 in AU Application No. 2015360714.
CN Office Action dated Sep. 30, 2020 in CN Application No. 201580072749.X.
CN Office Action dated Mar. 8, 2021 in CN Application No. 201580072749.X.
CN Office Action dated Jun. 3, 2021 in CN Application No. 201580072749.X.
EP Office Action dated Jan. 29, 2021 in EP Application No. 15868003.3.

(56) References Cited

OTHER PUBLICATIONS

IN Office Action dated Nov. 24, 2020 in IN Application No. 201737020192.
JP Examination Report dated Nov. 26, 2020 in JP Application No. 2017-549175.
JP Office Action dated Jul. 20, 2021 in JP Application No. 2017-549175.
EP Extended Search Report dated Oct. 1, 2020 in EP Application No. 17858928.9.
TW Notice of Allowance & Search Report (translated) dated Jul. 30, 2021 in TW Application No. 106133985.
EP Extended Search Report dated Nov. 11, 2020 in EP Application No. 18791117.7.
International Preliminary Report on Patentability dated Nov. 12, 2020 in PCT Application No. PCT/US2019/030467.
International Search Report and Written Opinion dated Apr. 28, 2020 in PCT Application No. PCT/US2020/018677.
Cecilio, J., et al., "A configurable middleware for processing heterogenous industrial intelligent sensors," IEEE 16th International Conference on Intelligent Engineering Systems (INES), Jun. 15, 2012, pp. 145-149.
Sim, S., "Next generation data interchange: tool-to-tool application programming interfaces," IEEE Working Conference on Reverse Engineering, Nov. 25, 2000, pp. 278-280.
U.S. Appl. No. 15/733,765, filed Oct. 19, 2020, Shrivastava et al.
U.S. Appl. No. 63/146,365, filed Feb. 5, 2021, Brown et al.
U.S. Appl. No. 63/124,673, filed Dec. 11, 2020, Tai et al.
U.S. Appl. No. 63/163,305, filed Mar. 19, 2021, Trikha et al.
U.S. Appl. No. 63/181,648, filed Apr. 29, 2021, Makker et al.
U.S. Appl. No. 63/187,632, filed May 12, 2021, Hur et al.
U.S. Appl. No. 63/226,127, filed Jul. 21, 2021, Lee et al.
AU Office Action dated Jan. 11, 2022, in Application No. AU2021201145.
CA Office Action dated Dec. 13, 2021, in Application No. CA2970300.
CN Office Action dated Dec. 29, 2021, in application No. 202010466929.9.
CN Office Action dated Dec. 1, 2021, in application No. CN201780069604 with English translation.
EP Office Action dated Jan. 17, 2022, in Application No. 17858928.9.
IN Office Action dated Jan. 13, 2022, in Application No. 201937044701.
KR Office Action dated Dec. 22, 2021, in Application No. KR1020177018491 with English translation.
AU Office action dated Oct. 22, 2021, in AU Application No. AU2020226999.
CA Office Action dated Dec. 23, 2021, in Application No. CA2941526.
CN Office Action dated Dec. 1, 2021, in application No. CN201780069604.
CN Office Action dated Nov. 12, 2021, in Application No. CN20158072749 with English translation.
EP Search Report dated Dec. 10, 2021, in Application No. EP19787808.5.
JP Office Action dated Dec. 7, 2021, in Application No. JP20170549175 with English translation.
KR Office Action dated Oct. 26, 2021, in KR Application No. KR1020217028044 with English translation.
U.S. Non-Final Office Action dated Oct. 28, 2021 in U.S. Appl. No. 15/733,765.
U.S. Non-Final Office Action dated Oct. 29, 2021 in U.S. Appl. No. 16/527,554.
U.S. Appl. No. 63/124,673, inventors Tai et al., filed Dec. 11, 2020.
U.S. Appl. No. 63/146,365, inventors Brown et al., filed Feb. 5, 2021.
U.S. Appl. No. 63/163,305, inventors Trikha et al., filed Mar. 19, 2021.
U.S. Appl. No. 63/181,648, inventors Makker et al., filed Apr. 29, 2021.
U.S. Appl. No. 63/187,632, inventors Hur et al., filed May 12, 2021.
U.S. Appl. No. 63/226,127, inventors Lee et al., filed Jul. 21, 2021.

* cited by examiner

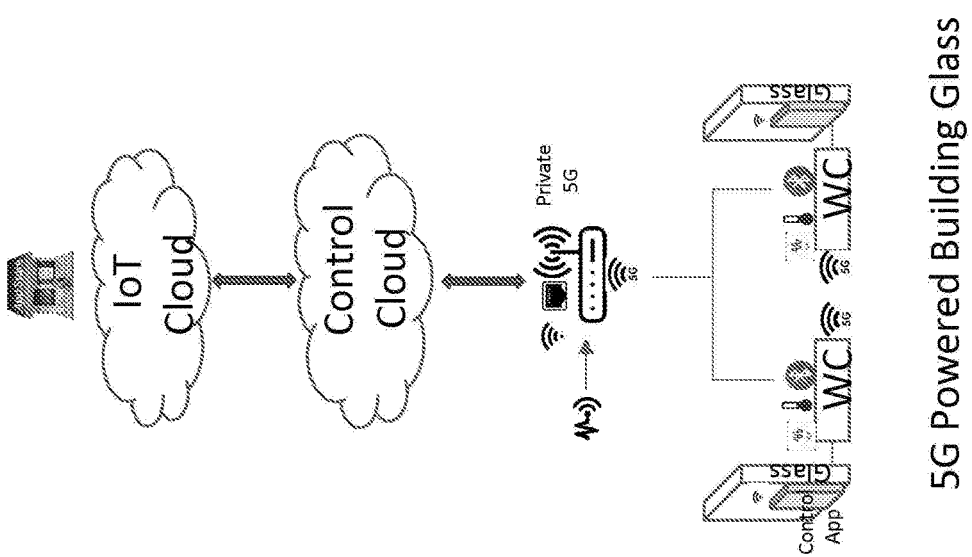
*FIGURE 11c*
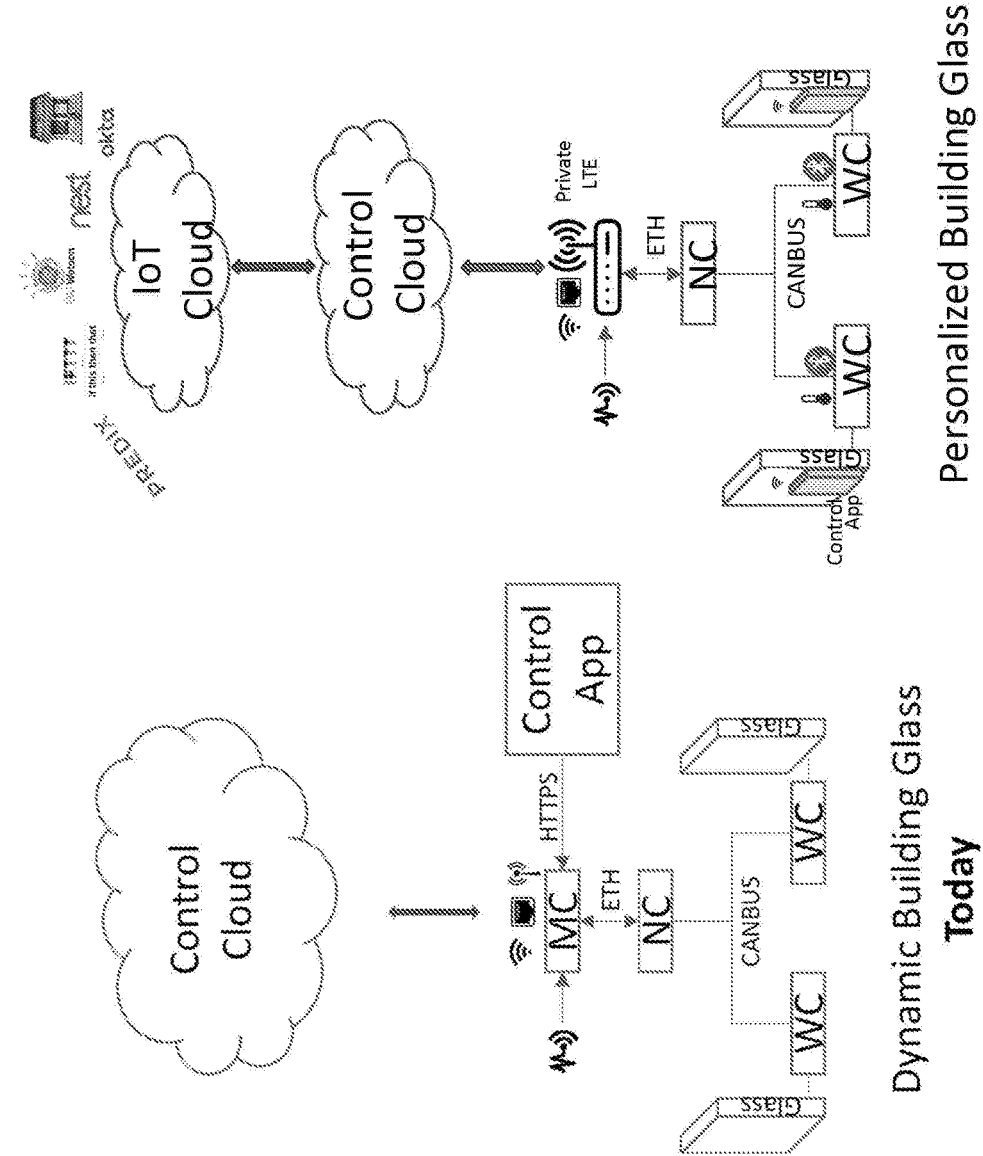
*FIGURE 11b*
*FIGURE 11a*

Sensor Glass

Building Security Glass

Display Building Glass

| Function | Outer Lite | | Inner Lite | | Window Controller | Mullion [Window Frame] | Implementation |
|---|---|---|---|---|---|---|---|
| | S1 | S2 | S3 | S4 | | | |
| Anti Jammer | GP* | EC | GP | GP* | | RF gasket from the frame to the IGU to complete the shield | RF blocking transparent film deposited on S1, S3, or S4 of an IGU. One embodiment is S3. Another embodiment is a film on both S3 and S4 (two films for higher performance). |
| Wi-Fi Repeater | | | EC | Antenna | X | | Omni directional antenna (for interior and exterior coverage) patterned on S3, with Wi-Fi signal processing on window controller. |
| | | | EC | Antenna | GP | X | | Exterior radiating antenna patterned on S3, with Wi-Fi signal processing on window controller. |
| | | | EC | GP | Antenna | X | | Interior radiating antenna patterned on S4, with Wi-Fi signal processing on window controller. |
| | Antenna | EC | GP | Antenna | X | | Selective exterior and interior radiating antennas patterned on S1 and S4, with Wi-Fi signal processing on window controller. |
| | | EC | | | X | Antenna | Omni directional Wi-Fi embedded antenna(s) on mullions' inside surface, Wi-Fi signal processing on window controller. |
| | Antenna | EC | | | X | | Omni directional embedded antenna on S1 wired through the pigtail wire, Wi-Fi signal processing on Window Controller. |

FIGURE 19

BUILDING NETWORK

CROSS-REFERENCES TO RELATED APPLICATIONS

This application is continuation-in-part of PCT Patent Application No. PCT/US19/30467, filed May 2, 2019, and titled "EDGE NETWORK FOR BUILDING SERVICES," which claims benefit of U.S. Provisional Patent Application No. 62/666,033, filed May 2, 2018, and titled "EDGE NETWORK FOR BUILDING SERVICES"; PCT Patent Application No. PCT/US19/30467 is also a continuation-in-part of PCT Patent Application No. PCT/US18/29460, filed Apr. 25, 2018, and titled "TINTABLE WINDOW SYSTEM FOR BUILDING SERVICES," which claims benefit of the following US Provisional patent applications: Application No. 62/490,457, filed Apr. 26, 2017, and titled "ELECTROCHROMIC WINDOWS WITH TRANSPARENT DISPLAY TECHNOLOGY"; Application No. 62/506,514, filed May 15, 2017, and titled "ELECTROCHROMIC WINDOWS WITH TRANSPARENT DISPLAY TECHNOLOGY"; Application No. 62/507,704, filed May 17, 2017, and titled "ELECTROCHROMIC WINDOWS WITH TRANSPARENT DISPLAY TECHNOLOGY"; Application No. 62/523,606, filed Jun. 22, 2017, and titled "ELECTROCHROMIC WINDOWS WITH TRANSPARENT DISPLAY TECHNOLOGY"; and Application No. 62/607,618, filed Dec. 19, 2017, and titled "ELECTROCHROMIC WINDOWS WITH TRANSPARENT DISPLAY TECHNOLOGY FIELD."; and this application is also a continuation-in-part of PCT Patent Application No. PCT/US18/29460. Each of the above applications is incorporated herein by reference in its entirety and for all purposes.

BACKGROUND

Electrochromism is a phenomenon in which a material exhibits a reversible electrochemically-mediated change in an optical property when placed in a different electronic state, typically by being subjected to a voltage change. The optical property is typically one or more of color, transmittance, absorbance, and reflectance.

Electrochromic materials may be incorporated into, for example, windows for home, commercial and other uses as thin film coatings on the window glass. The color, transmittance, absorbance, and/or reflectance of such windows may be changed by inducing a change in the electrochromic material, for example, electrochromic windows are windows that can be darkened or lightened electronically. A small voltage applied to an electrochromic device of the window will cause them to darken; reversing the voltage polarity causes them to lighten. This capability allows control of the amount of light that passes through the windows, and presents an opportunity for electrochromic windows to be used as energy-saving devices.

While electrochromic devices, and particularly electrochromic windows, are finding acceptance in building designs and construction, they have not begun to realize their full commercial potential.

SUMMARY

One aspect of this disclosure pertains to building façade platform including (1) a network of electrochromic windows between the interior and exterior of the building; (2) one or more window controllers; (3) a power distribution network in electrical communication with the window controllers and the network of electrochromic windows; (4) a communication network in communication with the window controllers and the network of electrochromic windows; and (5) one or more wireless power transmitters. The building façade platform is configured to control light entry and heat gain into the building, communications, and deliver wireless power transmissions. In certain embodiments, the platform does not employ electrochromic windows and/or window controllers. In some cases, the platform does not employ any optically switchable windows. In such cases, the platform may include controllers, but the controllers do not control windows. In some cases, the platform is a building envelope computing platform, that may or may not control building functions such as tintable windows, HVAC, and the like.

In some embodiments, the power distribution network receives power from a building power supply, and in some cases, the power distribution network receives power from one or more photovoltaic cells which are on components connected to the network of windows. In some cases, the power distribution network only receives power from the one or more photovoltaic cells. The building façade platform in a communication with a building management system (BMS) and/or may be controlled at least in part by the BMS. The BMS may receive heat load and occupancy information from the building façade platform or receive HVAC control instructions from the building façade platform. In some cases, the building façade platform itself serves as a building management system (BMS).

Another aspect of this disclosure pertains to a building façade platform that includes (1) a network of electrochromic windows between the interior and exterior of the building; (2) one or more window controllers; (3) a power distribution network in electrical communication with the controllers and the network of electrochromic windows; and (4) a communication network in communication with the controllers and the network of electrochromic windows. The building façade platform is configured to control light entry and heat gain into the building, communications, and serve as a building management system (BMS) of the building. In certain embodiments, the building façade platform does not employ electrochromic windows and/or window controllers.

Another aspect of this disclosure pertains to a system for providing power and data transmission in a building. The system has: (a) a plurality of optically switchable windows disposed at a plurality of locations on and/or proximate to an exterior of the building; (b) a plurality of window controllers, each electrically coupled to one or more of the optically switchable windows and configured to control tint states of the optically switchable windows; (c) a communications network having one or more communications interfaces to one or more data processing modules and/or one or more other communications networks, and a plurality of data communications paths connecting the window controllers to the one or more communications interfaces; and (d) a power distribution system which has a plurality of power transmission paths connecting one or more power sources in the building to the window controllers, where the communications network and/or the power distribution system are configured to provide data and/or power for external electronic devices and/or a building system that does not include the optically switchable windows. In certain embodiments, the building façade platform does not employ optically switchable windows and/or window controllers.

The building system includes a building management system, a HVAC system, a security system, a lighting system, a door lock system, a fire system, an elevator system, a video display system, a geofencing system, an asset tracking system, a wireless power delivery system or a wireless communications system.

The communications interface(s) may, in some cases, interface with a data processing module and/or a communications network for the building system. In some embodiments, the system also includes one or more antennas disposed on at least one of the optically switchable windows and/or at least one of the window controllers, where the antenna(s) are communicatively connected to the communications network. The antenna(s) may be directly connected to the communications network or connected to the communications network via at least one of the window controllers. The antenna(s) may be configured to provide data and/or power for the external electronic devices and/or the building system.

In some cases, the system includes one or more displays disposed on and/or registered with an IGU, at least one of the optically switchable windows, and/or at least one of the window controllers, where the one or more displays are communicatively connected to the communications network. In some cases, display(s) may include a transparent display disposed on at least one of the optically switchable windows. In some embodiments, display(s) may be video displays and or transparent organic light emitting diode (OLED) display(s)

The data processing module(s) may include a master controller, network controllers, building management system controllers, security system controllers, door lock system controllers, elevator system controllers, and/or lighting system controllers. The communications networks may include a building management system network, a building lighting network, a security system network, a door lock network, an elevator network, and/or the Internet.

The data communications paths may include wired connections and/or wireless connections. In some cases, power transmission occurs over one or more trunk lines. Power transmission paths may include, e.g., class 1 rated cable and/or class 2 rated cable. In some instances, at least some of the of the power transmission paths may be wireless power transmission paths. The power transmission paths may include both wired (e.g., trunk lines) and wireless transmission paths. In some cases, the power source(s) may include one or more photovoltaic power sources.

In some cases, at least one of the window controllers has logic for receiving a tint-state-transition command, determining drive parameters for affecting the tint state transition, and applying the drive parameters to at least one of the optically switchable windows. In some cases, data processing modules include a master controller or a network controller. In some cases, the external electronic devices include smartphones, personal computers, electronic tablets, or any combination thereof. In some cases, least one of the external electronic devices is a lock, a security camera, an elevator, an alarm, an environmental sensor, or a lighting device.

In some cases, the communications interface(s) include network adaptors configured to permit the data processing module(s) and/or the other communications network(s) to communicate over the communications network using a defined network protocol.

Another aspect of this disclosure pertains to a method of constructing a building. The method includes: (a) constructing or deploying an exterior frame of the building; (2) installing a plurality of optically switchable windows at a plurality of locations on or proximate to the exterior frame of the building; (c) installing a plurality of window controllers, where after constructing the building, each of the window controllers is electrically coupled to one or more of the optically switchable windows and where each of the window controllers is configured to control tint states of the optically switchable windows; (d) installing a communications network having one or more communications interfaces for connecting to one or more data processing modules and/or one or more other communications networks, and a plurality of data communications paths connecting the window controllers to the communications interfaces; and (e) installing a power distribution system having a plurality of power transmission paths connecting one or more power sources in the building to the window controllers, where the communications network and/or the power distribution system are configured to provide data and/or power for external electronic devices and/or a building system that does not include the optically switchable windows. In certain embodiments, the method of constructing a building does not include installing optically switchable windows and/or window controllers. Embodiments may use traditional building windows that have no tinting function, passive tinting windows such as thermochromic and/or photochromic windows. In certain embodiments, transparent displays are used in lieu of conventional building windows or smart windows. In such embodiments, the transparent displays may take the form of insulated glass units (they may or may not tint as a light and/or heat blocking function per se, but may be used only as displays/GUI's in some instances).

Another aspect of this disclosure pertains to a method of providing power and data transmission in a building having (a) a plurality of optically switchable windows disposed at a plurality of locations on and/or proximate to an exterior of the building, (b) a plurality of window controllers, each electrically coupled to one or more of the optically switchable windows and configured to control tint states of said one or more optically switchable windows, (c) a communications network including: (i) one or more communications interfaces to one or more data processing modules and/or one or more other communications networks, and (ii) a plurality of data communications paths connecting the window controllers to the communications interface(s), and (d) a power distribution system having a plurality of power transmission paths connecting one or more power sources in the building to the window controllers. The method includes operations of: (1) providing tinting data over the communications network via at least one of the data communication paths for identifying tint states of the optically switchable windows; (2) providing non-tint data over the communications network via at least one of the data communication paths, where the non-tint data is used by a building system or an external electronic device that does not include the optically switchable windows; (3) providing power over the power distribution system via at least one of the power transmission paths to control tint states of the optically switchable windows; and (d) providing power over the power distribution system via at least one of the power transmission paths to control the building system or the external electronic device that does not include the optically switchable windows. In certain embodiments, the building does not employ optically switchable windows and/or window controllers, e.g., the method pertains to delivering power and data processing to the building envelope.

In some cases, the building system is a building management system, a HVAC system, a security system, a lighting system, a fire system, a door lock system, an elevator system, a video display system, a geofencing system, an asset tracking system, a wireless power delivery system, or a wireless communications system.

In some cases, providing tinting data and/or non-tinting data over the communications network includes electromagnetic transmissions by one or more antennas disposed on at least one of the optically switchable windows and/or at least one of the window controllers, where the antenna(s) are communicatively connected to the communications network.

In some cases, providing power over the power distribution system includes electromagnetic transmissions by one or more antennas disposed on at least one of the optically switchable windows and/or at least one of the window controllers.

In some cases, the method can further include displaying the tinting data and/or non-tinting data at one or more displays disposed on and/or registered with an IGU, at least one of the optically switchable windows, and/or at least one of the window controllers, where the display(s) are communicatively connected to the communications network. In some cases, the display(s) include a transparent display disposed on at least one of the optically switchable windows.

In some cases, the method also includes an operation of providing tinting data and or non-tinting data to a building management system network, a building lighting network, a security system network, and/or the Internet via one of the communications interface(s).

In some cases, the data communications paths include wired connections. In some cases, providing tinting data and/or non-tinting data via at least one of the communication paths includes providing tinting data and/or non-tinting data via a wired or wireless communication path.

In some cases, providing power via at least one of the power transmission paths includes providing power over one or more trunk lines. Providing power via the power transmission paths may include providing power over wireless power transmission paths, wired transmission pathed (e.g., trunk lines), or both wired and wireless transmission paths.

In some the external electronic device is a smartphone, personal computer, or an electronic tablet. In other cases, the external electronic device is a lock, a security camera, an environmental sensor, an elevator, or a lighting device. In some cases, providing tinting data and/or non-tinting data over the communications network involves using a defined network protocol.

Another aspect of this disclosure pertains to a system for providing power and data transmission in a building. The system includes (a) a plurality of optically switchable windows disposed at a plurality of locations on and/or proximate to an exterior of the building; (b) a plurality of window controllers, each electrically coupled to one or more of the optically switchable windows and configured to control tint states of said one or more optically switchable windows; (c) a communications network having one or more communications interfaces to one or more data processing modules and/or one or more other communications networks, and a plurality of data communications paths connecting the window controllers to the one or more communications interfaces; and (d) a power distribution system having a plurality of power transmission paths connecting one or more power sources in the building to the window controllers, where the communications network and/or the power distribution system are configured to provide data and/or power for one or more devices controlled by a building management system and/or one or more building systems controlled by the building management system. In certain embodiments, the system does not employ optically switchable windows and/or window controllers.

Another aspect of this disclosure pertains to a building management system (BMS) for controlling one or more building systems. The BMS includes: (a) a plurality of optically switchable windows disposed at a plurality of locations on and/or proximate to an exterior of the building; (b) a plurality of window controllers, each electrically coupled to one or more of the optically switchable windows and configured to control tint states of said one or more optically switchable windows; (c) a communications network having one or more communications interfaces to one or more data processing modules and/or one or more other communications networks, and a plurality of data communications paths connecting the window controllers to the one or more communications interfaces; and (d) a power distribution system having a plurality of power transmission paths connecting one or more power sources in the building to the window controllers, where the communications network and/or the power distribution system are configured to provide data and/or power (i) for the one or more building systems and/or (ii) one or more devices controlled by the BMS. In certain embodiments, the BMS does not employ optically switchable windows and/or window controllers.

In some cases, the building systems include a HVAC system, a security system, a fire system, a lighting system, a door lock system, an elevator system, a video display system, a geofencing system, an asset tracking system, a wireless power delivery system and/or a wireless communications system.

In some cases, the device(s) controlled by the building management system include an HVAC device, a security device, a lighting device, a door lock, an elevator, or a video display device. In some cases, the data provided to the devices controlled by the building management system is provided via a plurality of wireless nodes on the communications network, where each wireless node is located at one of the optically switchable windows or one of the window controllers.

In some cases, the wireless nodes are configured to wirelessly transmit and receive data from the devices controlled by the building management system. The plurality wireless nodes may be configured to receive status information data of the devices controlled by the building management system. In some embodiments, the wireless nodes are configured to receive user input for controlling one of the devices controlled by the building management system.

In some cases, the wireless nodes are configured to transmit data for controlling the devices controlled by the building management system. In some cases, the communications network can be configured to send and receive wireless communications between at least two of the devices controlled by the building management system. In some cases, wireless nodes are configured to operate on a wireless communication protocol selected from the group consisting of Bluetooth, WiFi, ZigBee, Z-Wave, Neul, Sigfox, LoRaWaN, and ultra-wideband (UWB).

In some cases, at least one of data processing modules and/or one or more other communications networks is configured to: (1) display a three-dimensional building model; (2) display information regarding at least one of the optically switchable windows and/or at least one of the devices controlled by the building management system; (3) receive user input for controlling a user selected device, where the user selected device is selected from one of the optically switchable windows and/or one of the devices controlled by the building management system; and provide control information to the user selected device via the communication network based on user input.

In some cases, at least one of the one or more data processing modules and/or one or more other communications networks is further configured to display one or more smart objects within the building model to represent the devices controlled by the building management system and/or the optically switchable windows, where the one or more smart objects are placed in accordance with the locations of the devices controlled by the building management system and/or the optically switchable windows.

In some cases, at least one or more data processing modules and/or one or more other communications networks is further configured to receive status information regarding the devices controlled by the building management system and/or the optically switchable windows over the communication network. Each of the smart objects may be configured to provide status information corresponding to at least one of the devices controlled by the building management system and/or the optically switchable windows.

In some cases, at least one of the smart objects is configured to receive user input for controlling the devices controlled by the building management system and/or the optically switchable windows.

In some cases, at least one of the data processing modules and/or one or more other communications networks is further configured to allow a user to navigate the three-dimensional building model. In some cases, at least one of the one or more data processing modules and/or one or more other communications networks further includes logic for controlling at least one of the devices controlled by the building management system and/or at least one of the optically switchable windows based on information received over the communications network.

In some embodiments, data provided to the devices controlled by the building management system is provided via a plurality of wireless nodes on the communications network, where each wireless node is located at one of optically switchable windows or one of the window controllers; and there is logic for determining location of one or more portable electronic devices via analysis of wireless signals transmitted between the wireless nodes and the one or more portable electronic devices. A portable electronic devices may be, e.g., a phone, tablet, or a personal computer. In some cases, at least one of the one or more portable electronic device has a radio frequency identification (RFID) tag. The logic for determining the location of the one or more portable electronic devices uses a triangulation algorithm and/or a received signal strength indicator.

In some embodiments, the logic for determining locations of the one or more portable electronic devices is further configured to display one or more smart objects within the building model to represent the one or more portable electronic devices, where the one or more smart objects are placed in accordance with determined locations of the one or more portable electronic devices. In some cases, the logic may be configured to identify movement patterns of the one or more portable electronic devices and allow a user to configure permissible movement patterns for the one or more portable electronic devices or provide an alert if the identified movement patterns deviate from the permissible patterns for one or more portable electronic devices.

In some embodiments logic for determining locations of the one or more portable electronic devices can control at least one of the one or more devices controlled by a building management system and/or at least one of the optically switchable windows based on a determined position of the portable electronic device(s).

In some embodiments, the data processing modules and/or one or more other communications networks are configured to: (1) receive audio information via the communication network; (2) identify commands for controlling a selected device from the received audio information via a speech recognition module, where the selected device is one of the optically switchable windows or one of the devices controlled by the building management system; and (3) provide a control signal to the selected devices via the communication network.

In some other embodiments, data processing modules and/or one or more other communications networks is configured to: (1) receive audio information via the communication network; (2) identify user inquiries from the received audio information via the speech recognition module; (3) determine an answer for the identified user inquiries; and (4) provide the answer via a user interface. The user interface may include a display (e.g., in the viewable portion of a window) or a speaker. The system may also include a microphone configured to provide audio information via the communication network.

In some embodiments, at least one of the one or more data processing modules and/or one or more other communications networks is configured to monitor power distribution to the devices controlled by the building management system and control power provided by the power distribution system to the devices controlled by the building management system. During operation, power may be distributed to at least one of the devices controlled by the building management system wirelessly. Wirelessly distributed power can, in some embodiments, be transmitted via one or more wireless nodes on the communications network, where each wireless node is located at one of the optically switchable windows or one of the window controllers.

Monitoring power distribution during operation may include receiving power use information or information corresponding to an expected power use for at least one of the devices controlled by the building management system over the communication network. The system, in some cases, has an energy storage device and/or a generator.

In some embodiments, at least one of the one or more data processing modules and/or one or more other communications networks is configured to control at least one of the devices controlled by the building management system to reduce power consumption.

The data processing modules may include a master controller and/or a network controller, either being configured to issue window tint commands to at least some of the window controllers. A master controller and/or the network controller may be configured to control the one or more devices controlled by a building management system and/or the one or more systems controlled by the building management system.

Another aspect of this disclosure pertains to a method of providing power and data transmission in a building that includes (a) a plurality of optically switchable windows disposed at a plurality of locations on and/or proximate to an exterior of the building, (b) a plurality of window controllers, each electrically coupled to one or more of the optically switchable windows and configured to control tint states of said one or more of the optically switchable windows, (c) a communications network including: (i) one or more communications interfaces to one or more data processing modules and/or one or more other communications networks, and (ii) a plurality of data communications paths connecting the window controllers to the one or more communications interfaces, and (d) a power distribution system having a plurality of power transmission paths connecting one or more power sources in the building to the window controllers. The method includes operations of: (1) providing tinting data over the communications network via at least one of the data communication paths for identifying tint states of the optically switchable windows; (2) providing non-tint data over the communications network via at least one of the data communication paths for one or more devices controlled by a building management system (BMS) and/or for one or more building systems controlled by the building management system, where the one or more devices and/or the one or more building systems does not include the optically switchable windows; (3) providing power over the power distribution system via at least one of the power transmission paths to control tint states of the optically switchable windows; and (4) providing power over the power distribution system via at least one of the power transmission paths to control the one or more devices controlled by the BMS and/or to control the one or more building systems controlled by the building management system. In certain embodiments, the building does not include optically switchable windows and/or window controllers.

Another aspect of this disclosure pertains to a method of providing power and data transmission to a building management system having (a) a plurality of optically switchable windows disposed at a plurality of locations on and/or proximate to an exterior of the building, (b) a plurality of window controllers, each electrically coupled to one or more of the optically switchable windows and configured to control tint states of said one or more of the optically switchable windows, (c) a communications network including: (i) one or more communications interfaces to one or more data processing modules and/or one or more other communications networks, and (ii) a plurality of data communications paths connecting the window controllers to the one or more communications interfaces, and (d) a power distribution system having a plurality of power transmission paths connecting one or more power sources in the building to the window controllers. The method includes operations of: (1) providing non-tint data over the communications network via at least one of the data communication paths for one or more devices controlled by the BMS and/or building systems controlled by the BMS, where the one or more devices controlled by the BMS and/or one or more building systems controlled by the BMS does not include the optically switchable windows; and (2) providing power over the power distribution system via at least one of the power transmission paths to control the one or more devices controlled by the BMS and/or to control the one more building systems controlled by the BMS. In certain embodiments, the building management system does not include optically switchable windows and/or window controllers.

Aspects of this disclosure pertain to building data communications systems that may include the building structure itself (inner walls, outer walls, floors, ceilings, roofs, windows, etc.) as well subsystems for providing data and computation resources and for providing electrical power to various devices in the building such as HVAC and other appliances, computers, processors, sensors, display screens, etc. In various embodiments, an electrical power distribution subsystem includes control panels and current carrying lines that provide electrical power to computational resources on a data communications network (e.g., computers and network devices such as switches and/or routers). In some cases, some components of the data communications network is configured to additionally carry voice information for telephone calls, etc.

In various embodiments, the building data communications systems includes a building data communications network that itself includes: (a) a plurality of processors disposed within the building; (b) a plurality of data storage devices disposed within the building; (c) communications lines connecting the plurality of processors and the plurality of data storage devices, wherein the communications lines are disposed in or on outer walls and/or one or more façades of the building; (d) a connection to an external network on the building data communications network; and (e) an edge computing processing device or system comprising computer program instructions for implementing edge computing using the building data communications network. In certain embodiments, the computer program instructions include instructions for: (i) receiving software and/or data, via the connection to the external network, from a remote site that is remote from the building; (ii) installing or store the software and/or data on a first data storage device that is one of the plurality of data storage devices disposed on the building data communications network; and (iii) providing the software and/or data from the first storage device, or providing results of executing the software, to a computational device in the building via the building data communications network. Typically, the software and/or data is a copy or instance of a master version of software and/or data stored on the remote site. As is typical, a remote site maintains the most current and complete version of the data or software used in edge computing, and in fact, the remote site may for some users or applications directly serve the content or execute the software in real time for remote users. In other cases such as those that employ building data communications networks for edge computing, an instance of the remote site's data or content is provided to the building's network so that it can be served locally for real time use by end users in or near the building. Examples of data include database data for enterprises, entertainment content, etc.

The connection to an external network may we wired or wireless. In some embodiments, it includes an antenna and an associated receiver or transceiver for receiving cellular or other wireless transmissions of data.

In various embodiments, the building data communications system additionally includes power lines in the building frame, which power lines are configured to provide power to the plurality of processors. In certain embodiments, the external network is a public network such as the internet, and the building data communications network is a private network. In some cases, the building data communications network additionally includes a connection to the internet or other public network.

In certain embodiments, the computational device in the building is a handheld computational device, a laptop, a terminal, or a desk top computer. In certain embodiments, the computational device in the building is a processor configured to provide or assist in providing a building service such as a HVAC service, a security service, a building lighting service, an electrically tintable window control service, or a building occupant information delivery service. The last example may provide building occupants with guidance pertaining the building such as the building's status, floor plan, directory, air quality, energy savings, security issues, etc.

In certain embodiments, the building data communications network additionally includes a plurality of window controllers comprising electrical circuits configured to control tint states of an electrically tintable window installed in the building. Electrically tintable windows and window controllers are described elsewhere herein. In some cases, also as described elsewhere herein, the building data communications network additionally includes a display device disposed on a window in the building.

Some or all of the resources of the building data communications system need not support of electrically tintable windows. For example, in certain embodiments, no processors from among the plurality of processors are provided in electrically tintable window controllers. As a further example, no processors from among the plurality of processors are dedicated to controlling electrically switchable window tint states.

In certain embodiments, the building data communications network additionally includes a plurality of antennas and a plurality of radios or transceivers electrically connected to the plurality of antennas and wherein the plurality of radios or transceivers is configured to send and/or receive wireless communications via the plurality of antennas. In certain embodiments, the building data communications network additionally includes a plurality of sensors comprising a temperature sensor, an irradiance sensor, a humidity sensor, a carbon dioxide sensor, a motion sensor, an occupant tracking sensor, a biometric sensor, and/or a VOC sensor.

In certain embodiments, the building data communications network includes a vertical data plane that links computational nodes on different floors of the building. The vertical data plane may include a network switch and communications links configured to transmit data at speeds of at least about 1 gigabit/second. In certain embodiments, the communications links of the vertical data plane include current carrying lines, optical fibers, and/or wireless connections. In some implementations, the vertical data plane includes a first control panel on a first floor of the building and a second control panel on a second floor of the building. The first and second control panels may be linked on building data communications network in a manner that supports gigabit/sec Ethernet communications. In some configurations, a building data communications network additionally includes a plurality of trunk lines connected to the first control panel, extending to locations on the first floor of the building, and arranged in manner that provides network service to a plurality of network nodes on the first floor. In some such configurations, the building data communications network additionally includes a plurality of drop lines providing data connections between the trunk lines and the plurality of network nodes on the first floor. A vertical data plane with high speed connectivity may be referred to as a backbone for the building data communications network. In certain embodiments, the vertical data plane is directly connected to a high speed, high bandwidth data connection line external to the building, e.g., a switch or other component of the data plane may connect with an optical fiber line provided by the a municipality or other entity that deploys high speed lines in the vicinity of the building.

In certain embodiments, the plurality of processors, the plurality of data storage devices, and the communications lines were installed during construction of the building. In certain embodiments, the communications lines are disposed in one or more mullions of the building.

In some implementations, the first data storage device is located in master controller or a control panel connected to the building data communications network.

In certain embodiments, the edge computing processing device or system includes program instructions for executing the software and providing the results of executing the software to the computational device. In certain embodiments, the software includes video conferencing software. In certain embodiments, the data includes a subset of data in a database stored on the remote site. In certain embodiments, the data includes a patch or an upgrade to software installed on the computational device in the building.

In some cases, the edge computing processing device or system additionally includes program instructions for: receiving an update to the software and/or data, via the connection to an external network, from the remote site; and installing the update applying the update to the software and/or data on a first data storage device on a building data communications network.

Aspects of this disclosure pertain to methods of conducting edge computing in a building. Such methods may be characterized by the following operations: (a) receiving software and/or data, via a connection to an external network, from a remote site that is remote from the building, wherein the software and/or data is a copy or instance of a master version of software and/or data stored on the remote site; (b) installing or storing the software and/or data on a first data storage device on a building data communications network; and (c) providing the software and/or data from the first storage device, or providing results of executing the software, to a computational device in the building via the building data communications network. In certain embodiments, the building data communications network includes a plurality of processors disposed within the building, and a plurality of data storage devices, including the first data storage device, also disposed within the building. The building data communications network also includes communications lines connecting the plurality of processors and the plurality of data storage devices. These communications lines are disposed in or on outer walls and/or one or more façades of the building.

In certain of the method embodiments, the external network is a public network such as the internet, and the building data communications network is a private network. In some cases, the building data communications network additionally includes a connection to the internet or other public network.

In certain of the method embodiments, the computational device in the building is a handheld computational device, a laptop, a terminal, or a desk top computer. In certain embodiments, the computational device in the building is a processor configured to provide or assist in providing a building service such as a HVAC service, a security service, a building lighting service, an electrically tintable window control service, or a building occupant information delivery service.

In certain embodiments, the building data communications network additionally includes a plurality of window controllers comprising electrical circuits configured to control tint states of an electrically tintable window installed in the building. In some cases, the building data communications network additionally includes a display device disposed on a window in the building.

Some or all of the resources of the building data communications system need not support of electrically tintable windows. For example, in certain embodiments, no processors from among the plurality of processors are provided in electrically tintable window controllers. As a further example, no processors from among the plurality of processors are dedicated to controlling electrically switchable window tint states.

In certain of the method embodiments, the building data communications network additionally includes a plurality of antennas and a plurality of radios or transceivers electrically connected to the plurality of antennas and wherein the plurality of radios or transceivers is configured to send and/or receive wireless communications via the plurality of antennas. In certain embodiments, the building data communications network additionally includes a plurality of sensors comprising a temperature sensor, an irradiance sensor, a humidity sensor, a carbon dioxide sensor, a motion sensor, an occupant tracking sensor, a biometric sensor, and/or a VOC sensor.

In certain of the method embodiments, the building data communications network includes a vertical data plane that links computational nodes on different floors of the building. The vertical data plane may include a network switch and communications links configured to transmit data at speeds of at least about 1 gigabit/second. In certain embodiments, the communications links of the vertical data plane include current carrying lines, optical fibers, and/or wireless connections. In some implementations, the vertical data plane includes a first control panel on a first floor of the building and a second control panel on a second floor of the building. The first and second control panels may be linked on building data communications network in a manner that supports gigabit/sec Ethernet communications. In some configurations, a building data communications network additionally includes a plurality of trunk lines connected to the first control panel, extending to locations on the first floor of the building, and arranged in manner that provides network service to a plurality of network nodes on the first floor. In some such configurations, the building data communications network additionally includes a plurality of drop lines providing data connections between the trunk lines and the plurality of network nodes on the first floor.

In certain of the method embodiments, the plurality of processors, the plurality of data storage devices, and the communications lines are installed during construction of the building. In certain embodiments, the communications lines are disposed in one or more mullions of the building, which action may be performed during construction.

In some implementations of the methods, the first data storage device is located in master controller or a control panel connected to the building data communications network.

In certain embodiments, the edge computing processing device or system includes program instructions for executing the software and providing the results of executing the software to the computational device. In certain of the method embodiments, the software includes video conferencing software. In certain embodiments, the data includes a subset of data in a database stored on the remote site. In certain embodiments, the data includes a patch or an upgrade to software installed on the computational device in the building.

In some cases, the edge computing processing device or system additionally includes program instructions for: receiving an update to the software and/or data, via the connection to an external network, from the remote site; and installing the update applying the update to the software and/or data on a first data storage device on a building data communications network.

These and other features of the disclosure will be described in more detail below.

BRIEF DESCRIPTION OF THE DRAWINGS

FIGS. 11a-11g depict network architectures that may be used by the window control system.

FIG. 19 provides a table showing a number of configurations where an electrochromic window can enable RF communications and/or serve as a signal blocking device.

DETAILED DESCRIPTION

Introduction

Figure 1:
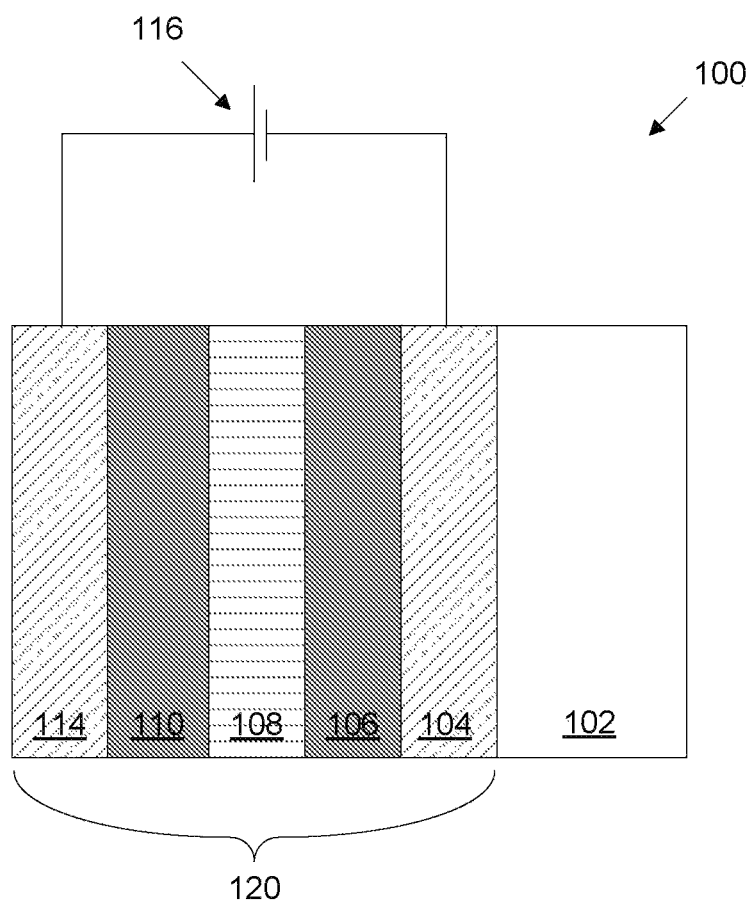
FIG. 1 shows a cross-sectional view of an electrochromic device coating that may be used in a tintable window

The following detailed description is directed to certain embodiments or implementations for the purposes of describing the disclosed aspects. However, the teachings herein can be applied and implemented in a multitude of different ways. In the following detailed description, references are made to the accompanying drawings. Although the disclosed implementations are described in sufficient detail to enable one skilled in the art to practice the implementations, it is to be understood that these examples are not limiting; other implementations may be used and changes may be made to the disclosed implementations without departing from their spirit and scope. Furthermore, while the disclosed embodiments focus on electrochromic windows (also referred to as optically switchable windows, tintable and smart windows), the concepts disclosed herein may apply to other types of switchable optical devices including, for example, liquid crystal devices and suspended particle devices, among others. For example, a liquid crystal device or a suspended particle device, rather than an electrochromic device, could be incorporated into some or all of the disclosed implementations. Additionally, the conjunction "or" is intended herein in the inclusive sense where appropriate unless otherwise indicated; for example, the phrase "A, B or C" is intended to include the possibilities of "A," "B," "C," "A and B," "B and C," "A and C" and "A, B, and C."

Tintable Windows—

A tintable window (sometimes referred to as an optically switchable window) is a window that exhibits a controllable and reversible change in an optical property when a stimulus is applied, e.g., an applied voltage. Tintable windows can be used to control lighting conditions and the temperature within a building by regulating the transmission of solar energy and thus heat load imposed on the interior of the building. The control may be manual or automatic and may be used for maintaining occupant comfort while reducing the energy consumption of heating, air conditioning and/or lighting systems. In some cases, tintable windows may be responsive to environmental sensors and user control. In this application, tintable windows are most frequently described with reference to electrochromic windows located between the interior and the exterior of a building or structure. However, this need not be the case. Tintable windows may operate using liquid crystal devices, suspended particle devices, microelectromechanical systems (MEMS) devices (such as microshutters), or any technology known now, or later developed, that is configured to control light transmission through a window. Windows with MEMS devices for tinting are further described in U.S. patent application Ser. No. 14/443,353, filed May 15, 2015, and titled "MULTI-PANE WINDOWS INCLUDING ELECTROCHROMIC DEVICES AND ELECTROMECHANICAL SYSTEMS DEVICES," which is herein incorporated by reference in its entirety. In some cases, tintable windows can be located within the interior of a building, e.g., between a conference room and a hallway. In some cases, tintable windows can be used in automobiles, trains, aircraft, and other vehicles in lieu of a passive or non-tinting window.

Electrochromic (EC) device coatings—An EC device coating (sometimes referred to as an EC device (ECD) is a coating comprising at least one layer of electrochromic material that exhibits a change from one optical state to another when an electric potential is applied across the EC device. The transition of the electrochromic layer from one optical state to another optical state can be caused by reversible ion insertion into the electrochromic material (for example, by way of intercalation) and a corresponding injection of charge-balancing electrons. In some instances, some fraction of the ions responsible for the optical transition is irreversibly bound up in the electrochromic material. In many EC devices, some or all of the irreversibly bound ions can be used to compensate for "blind charge" in the material. In some implementations, suitable ions include lithium ions (Li+) and hydrogen ions (H+) (i.e., protons). In some other implementations, other ions can be suitable. Intercalation of lithium ions, for example, into tungsten oxide ($WO_{3-y}(0<y\leq\sim 0.3)$) causes the tungsten oxide to change from a transparent state to a blue state. EC device coatings as described herein are located within the viewable portion of the tintable window such that the tinting of the EC device coating can be used to control the optical state of the tintable window.

A schematic cross-section of an electrochromic device 100 in accordance with some embodiments is shown in FIG. 1. The EC device coating is attached to a substrate 102, a transparent conductive layer (TCL) 104, an electrochromic layer (EC) 106 (sometimes also referred to as a cathodically coloring layer or a cathodically tinting layer), an ion conducting layer or region (IC) 108, a counter electrode layer (CE) 110 (sometimes also referred to as an anodically coloring layer or anodically tinting layer), and a second TCL 114. Elements 104, 106, 108, 110, and 114 are collectively referred to as an electrochromic stack 120. A voltage source 116 operable to apply an electric potential across the electrochromic stack 120 effects the transition of the electrochromic coating from, e.g., a clear state to a tinted state. In other embodiments, the order of layers is reversed with respect to the substrate. That is, the layers are in the following order: substrate, TCL, counter electrode layer, ion conducting layer, electrochromic material layer, TCL.

In various embodiments, the ion conductor region 108 may form from a portion of the EC layer 106 and/or from a portion of the CE layer 110. In such embodiments, the electrochromic stack 120 may be deposited to include cathodically coloring electrochromic material (the EC layer) in direct physical contact with an anodically coloring counter electrode material (the CE layer). The ion conductor region 108 (sometimes referred to as an interfacial region, or as an ion conducting substantially electronically insulating layer or region) may then form where the EC layer 106 and the CE layer 110 meet, for example through heating and/or other processing steps. Electrochromic devices fabricated without depositing a distinct ion conductor material are further discussed in U.S. patent application Ser. No. 13/462,725, filed May 2, 2012, and titled "ELECTROCHROMIC DEVICES," which is herein incorporated by reference in its entirety. In some embodiments, an EC device coating may also include one or more additional layers such as one or more passive layers. For example, passive layers can be used to improve certain optical properties, to provide moisture or to provide scratch resistance. These or other passive layers also can serve to hermetically seal the EC stack 120. Additionally, various layers, including transparent conducting layers (such as 104 and 114), can be treated with anti-reflective or protective oxide or nitride layers.

In certain embodiments, the electrochromic device reversibly cycles between a clear state and a tinted state. In the clear state, a potential is applied to the electrochromic stack 120 such that available ions in the stack that can cause the electrochromic material 106 to be in the tinted state reside primarily in the counter electrode 110. When the potential applied to the electrochromic stack is reversed, the ions are transported across the ion conducting layer 108 to the electrochromic material 106 and cause the material to enter the tinted state.

It should be understood that the reference to a transition between a clear state and tinted state is non-limiting and suggests only one example, among many, of an electrochromic transition that may be implemented. Unless otherwise specified herein, whenever reference is made to a clear-tinted transition, the corresponding device or process encompasses other optical state transitions such as non-reflective-reflective, transparent-opaque, etc. Further, the terms "clear" and "bleached" refer to an optically neutral state, e.g., untinted, transparent or translucent. Still further, unless specified otherwise herein, the "color" or "tint" of an electrochromic transition is not limited to any particular wavelength or range of wavelengths. As understood by those of skill in the art, the choice of appropriate electrochromic and counter electrode materials governs the relevant optical transition.

In certain embodiments, all of the materials making up electrochromic stack 120 are inorganic, solid (i.e., in the solid state), or both inorganic and solid. Because organic materials tend to degrade over time, particularly when exposed to heat and UV light as tinted building windows are, inorganic materials offer the advantage of a reliable electrochromic stack that can function for extended periods of time. Materials in the solid state also offer the advantage of not having containment and leakage issues, as materials in the liquid state often do. It should be understood that any one or more of the layers in the stack may contain some amount of organic material, but in many implementations, one or more of the layers contain little or no organic matter. The same can be said for liquids that may be present in one or more layers in small amounts. It should also be understood that solid state material may be deposited or otherwise formed by processes employing liquid components such as certain processes employing sol-gels or chemical vapor deposition.

Figure 2:
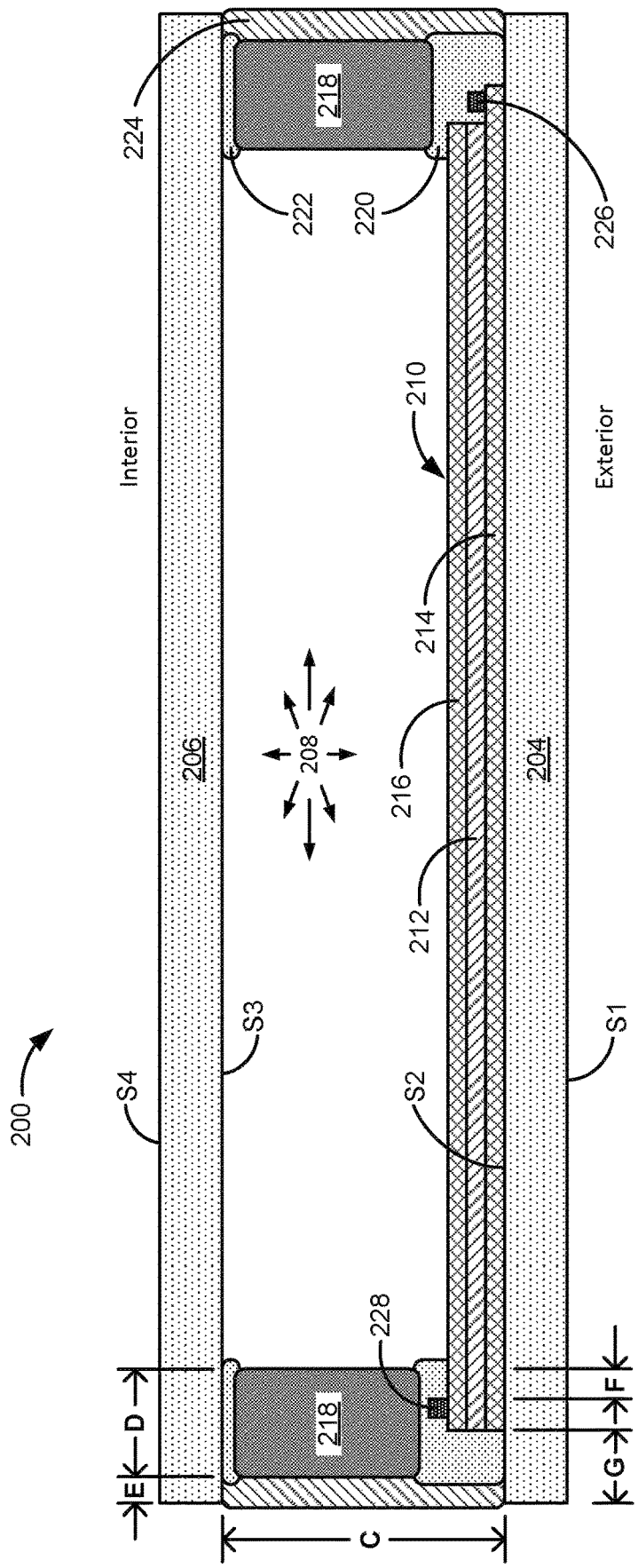
FIG. 2 shows a cross-sectional side view of a tintable window constructed as an IGU.

FIG. 2 shows a cross-sectional view of an example tintable window taking the form of an insulated glass unit ("IGU") 200 in accordance with some implementations. Generally speaking, unless stated otherwise, the terms "IGU," "tintable window," and "optically switchable window" are used interchangeably. This depicted convention is generally used, for example, because it is common and because it can be desirable to have IGUs serve as the fundamental constructs for holding electrochromic panes (also referred to as "lites") when provided for installation in a building. An IGU lite or pane may be a single substrate or a multi-substrate construct, such as a laminate of two substrates. IGUs, especially those having double- or triple-pane configurations, can provide a number of advantages over single pane configurations; for example, multi-pane configurations can provide enhanced thermal insulation, noise insulation, environmental protection and/or durability when compared with single-pane configurations. A multi-pane configuration also can provide increased protection for an ECD, for example, because the electrochromic films, as well as associated layers and conductive interconnects, can be formed on an interior surface of the multi-pane IGU and be protected by an inert gas fill in the interior volume, 208, of the IGU. The inert gas fill provides at least some of the (heat) insulating function of an IGU. Electrochromic IGU's have added heat blocking capability by virtue of a tintable coating that absorbs (or reflects) heat and light.

FIG. 2 more particularly shows an example implementation of an IGU 200 that includes a first pane 204 having a first surface S1 and a second surface S2. In some implementations, the first surface S1 of the first pane 204 faces an exterior environment, such as an outdoors or outside environment. The IGU 200 also includes a second pane 206 having a first surface S3 and a second surface S4. In some implementations, the second surface S4 of the second pane 206 faces an interior environment, such as an inside environment of a home, building or vehicle, or a room or compartment within a home, building or vehicle.

In some implementations, each of the first and the second panes 204 and 206 are transparent or translucent—at least to light in the visible spectrum. For example, each of the panes 204 and 206 can be formed of a glass material and especially an architectural glass or other shatter-resistant glass material such as, for example, a silicon oxide ($SO_x$)-based glass material. As a more specific example, each of the first and the second panes 204 and 206 can be a soda-lime glass substrate or float glass substrate. Such glass substrates can be composed of, for example, approximately 75% silica ($SiO_2$) as well as $Na_2O$, CaO, and several minor additives. However, each of the first and the second panes 204 and 206 can be formed of any material having suitable optical, electrical, thermal, and mechanical properties. For example, other suitable substrates that can be used as one or both of the first and the second panes 204 and 206 can include other glass materials as well as plastic, semi-plastic and thermoplastic materials (for example, poly(methyl methacrylate), polystyrene, polycarbonate, allyl diglycol carbonate, SAN (styrene acrylonitrile copolymer), poly(4-methyl-1-pentene), polyester, polyamide), or mirror materials. In some implementations, each of the first and the second panes 204 and 206 can be strengthened, for example, by tempering, heating, or chemically strengthening.

Generally, each of the first and the second panes 204 and 206, as well as the IGU 200 as a whole, is a rectangular solid. However, in some other implementations other shapes are possible and may be desired (for example, circular, elliptical, triangular, curvilinear, convex or concave shapes). In some specific implementations, a length "L" of each of the first and the second panes 204 and 206 can be in the range of approximately 20 inches (in.) to approximately 10 feet (ft.), a width "W" of each of the first and the second panes 204 and 206 can be in the range of approximately 20 in. to approximately 10 ft., and a thickness "T" of each of the first and the second panes 204 and 206 can be in the range of approximately 0.3 millimeters (mm) to approximately 10 mm (although other lengths, widths or thicknesses, both smaller and larger, are possible and may be desirable based on the needs of a particular user, manager, administrator, builder, architect or owner). In examples where thickness T of substrate 204 is less than 3 mm, typically the substrate is laminated to an additional substrate which is thicker and thus protects the thin substrate 204. Additionally, while the IGU 200 includes two panes (204 and 206), in some other implementations, an IGU can include three or more panes. Furthermore, in some implementations, one or more of the panes can itself be a laminate structure of two, three, or more layers or sub-panes.

The first and second panes 204 and 206 are spaced apart from one another by a spacer 218, which is typically a frame structure, to form an interior volume 208. In some implementations, the interior volume is filled with Argon (Ar), although in some other implementations, the interior volume 108 can be filled with another gas, such as another noble gas (for example, krypton (Kr) or xenon (Xn)), another (non-noble) gas, or a mixture of gases (for example, air). Filling the interior volume 208 with a gas such as Ar, Kr, or Xn can reduce conductive heat transfer through the IGU 200 because of the low thermal conductivity of these gases as well as improve acoustic insulation due to their increased atomic weights. In some other implementations, the interior volume 208 can be evacuated of air or other gas. Spacer 218 generally determines the height "C" of the interior volume 208; that is, the spacing between the first and the second panes 204 and 206. In FIG. 2, the thickness of the ECD, sealant 220/222 and bus bars 226/228 is not to scale; these components are generally very thin but are exaggerated here for ease of illustration only. In some implementations, the spacing "C" between the first and the second panes 204 and 206 is in the range of approximately 6 mm to approximately 30 mm. The width "D" of spacer 218 can be in the range of approximately 5 mm to approximately 25 mm (although other widths are possible and may be desirable).

Although not shown in the cross-sectional view, spacer 218 is generally a frame structure formed around all sides of the IGU 200 (for example, top, bottom, left and right sides of the IGU 200). For example, spacer 218 can be formed of a foam or plastic material. However, in some other implementations, spacers can be formed of metal or other conductive material, for example, a metal tube or channel structure having at least 3 sides, two sides for sealing to each of the substrates and one side to support and separate the lites and as a surface on which to apply a sealant, 224. A first primary seal 220 adheres and hermetically seals spacer 218 and the second surface S2 of the first pane 204. A second primary seal 222 adheres and hermetically seals spacer 218 and the first surface S3 of the second pane 206. In some implementations, each of the primary seals 220 and 222 can be formed of an adhesive sealant such as, for example, polyisobutylene (PIB). In some implementations, IGU 200 further includes secondary seal 224 that hermetically seals a border around the entire IGU 200 outside of spacer 218. To this end, spacer 218 can be inset from the edges of the first and the second panes 204 and 206 by a distance "E." The distance "E" can be in the range of approximately 4 mm to approximately 8 mm (although other distances are possible and may be desirable). In some implementations, secondary seal 224 can be formed of an adhesive sealant such as, for example, a polymeric material that resists water and that adds structural support to the assembly, such as silicone, polyurethane and similar structural sealants that form a watertight seal.

In the implementation shown in FIG. 2, an ECD 210 is formed on the second surface S2 of the first pane 204. In some other implementations, ECD 210 can be formed on another suitable surface, for example, the first surface S1 of the first pane 204, the first surface S3 of the second pane 206 or the second surface S4 of the second pane 206. The ECD 210 includes an electrochromic ("EC") stack 212, which itself may include one or more layers as described with reference to FIG. 1.

Window Controllers—Window controllers are associated with one or more tintable windows and are configured to control a window's optical state by applying a stimulus to the window—e.g., by applying a voltage or a current to an EC device coating. Window controllers as described herein may have many sizes, formats, and locations with respect to the optically switchable windows they control. Typically, the controller will be attached to a lite of an IGU or laminate but it can also be in a frame that houses the IGU or laminate or even in a separate location. As previously mentioned, a tintable window may include one, two, three or more individual electrochromic panes (an electrochromic device on a transparent substrate). Also, an individual pane of an electrochromic window may have an electrochromic coating that has independently tintable zones. A controller as described herein can control all electrochromic coatings associated with such windows, whether the electrochromic coating is monolithic or zoned.

If not directly, attached to a tintable window, IGU, or frame, the window controller is generally located in proximity to the tintable window. For example, a window controller may be adjacent to the window, on the surface of one of the window's lites, within a wall next to a window, or within a frame of a self-contained window assembly. In some embodiments, the window controller is an "in situ" controller; that is, the controller is part of a window assembly, an IGU or a laminate, and may not have to be matched with the electrochromic window, and installed, in the field, e.g., the controller travels with the window as part of the assembly from the factory. The controller may be installed in the window frame of a window assembly, or be part of an IGU or laminate assembly, for example, mounted on or between panes of the IGU or on a pane of a laminate. In cases where a controller is located on the visible portion of an IGU, at least a portion of the controller may be substantially transparent. Further examples of on glass controllers are provided in U.S. patent application Ser. No. 14/951,410, filed Nov. 14, 2015, and titled "SELF CONTAINED EC IGU," which is herein incorporated by reference in its entirety. In some embodiments, a localized controller may be provided as more than one part, with at least one part (e.g., including a memory component storing information about the associated electrochromic window) being provided as a part of the window assembly and at least one other part being separate and configured to mate with the at least one part that is part of the window assembly, IGU or laminate. In certain embodiments, a controller may be an assembly of interconnected parts that are not in a single housing, but rather spaced apart, e.g., in the secondary seal of an IGU. In other embodiments the controller is a compact unit, e.g., in a single housing or in two or more components that combine, e.g., a dock and housing assembly, that is proximate the glass, not in the viewable area, or mounted on the glass in the viewable area.

In one embodiment, the window controller is incorporated into or onto the IGU and/or the window frame prior to installation of the tintable window, or at least in the same building as the window. In one embodiment, the controller is incorporated into or onto the IGU and/or the window frame prior to leaving the manufacturing facility. In one embodiment, the controller is incorporated into the IGU, substantially within the secondary seal. In another embodiment, the controller is incorporated into or onto the IGU, partially, substantially, or wholly within a perimeter defined by the primary seal between the sealing separator and the substrate.

Having the controller as part of an IGU and/or a window assembly, the IGU can possess logic and features of the controller that, e.g., travels with the IGU or window unit. For example, when a controller is part of the IGU assembly, in the event the characteristics of the electrochromic device(s) change over time (e.g., through degradation), a characterization function can be used, for example, to update control parameters used to drive tint state transitions. In another example, if already installed in an electrochromic window unit, the logic and features of the controller can be used to calibrate the control parameters to match the intended installation, and for example if already installed, the control parameters can be recalibrated to match the performance characteristics of the electrochromic pane(s).

In other embodiments, a controller is not pre-associated with a window, but rather a dock component, e.g., having parts generic to any electrochromic window, is associated with each window at the factory. After window installation, or otherwise in the field, a second component of the controller is combined with the dock component to complete the electrochromic window controller assembly. The dock component may include a chip which is programmed at the factory with the physical characteristics and parameters of the particular window to which the dock is attached (e.g., on the surface which will face the building's interior after installation, sometimes referred to as surface 4 or "S4"). The second component (sometimes called a "carrier," "casing," "housing," or "controller") is mated with the dock, and when powered, the second component can read the chip and configure itself to power the window according to the particular characteristics and parameters stored on the chip. In this way, the shipped window need only have its associated parameters stored on a chip, which is integral with the window, while the more sophisticated circuitry and components can be combined later (e.g., shipped separately and installed by the window manufacturer after the glazier has installed the windows, followed by commissioning by the window manufacturer). Various embodiments will be described in more detail below. In some embodiments, the chip is included in a wire or wire connector attached to the window controller. Such wires with connectors are sometimes referred to as pigtails.

As discussed, an "IGU" includes two (or more) substantially transparent substrates, for example, two panes of glass, where at least one substrate includes an electrochromic device disposed thereon, and the panes have a separator disposed between them. An IGU is typically hermetically sealed, having an interior region that is isolated from the ambient environment. A "window assembly" may include an IGU or for example a stand-alone laminate, and includes electrical leads for connecting the IGUs or laminates one or more electrochromic devices to a voltage source, switches and the like, and may include a frame that supports the IGU or laminate. A window assembly may include a window controller as described herein, and/or components of a window controller (e.g., a dock).

As used herein, the term outboard means closer to the outside environment, while the term inboard means closer to the interior of a building. For example, in the case of an IGU having two panes, the pane located closer to the outside environment is referred to as the outboard pane or outer pane, while the pane located closer to the inside of the building is referred to as the inboard pane or inner pane. As labeled in FIG. 2, the different surfaces of the IGU may be referred to as S1, S2, S3, and S4 (assuming a two-pane IGU). S1 refers to the exterior-facing surface of the outboard lite (i.e., the surface that can be physically touched by someone standing outside). S2 refers to the interior-facing surface of the outboard lite. S3 refers to the exterior-facing surface of the inboard lite. S4 refers to the interior-facing surface of the inboard lite (i.e., the surface that can be physically touched by someone standing inside the building). In other words, the surfaces are labeled S1-S4, starting from the outermost surface of the IGU and counting inwards. In cases where an IGU includes three panes, this same trend holds (with S6 being the surface that can be physically touched by someone standing inside the building). In certain embodiments employing two panes, the electrochromic device (or other optically switchable device) is disposed on S3.

Further examples of window controllers and their features are presented in U.S. patent application Ser. No. 13/449,248, filed Apr. 17, 2012, and titled "CONTROLLER FOR OPTICALLY-SWITCHABLE WINDOWS"; U.S. patent application Ser. No. 13/449,251, filed Apr. 17, 2012, and titled "CONTROLLER FOR OPTICALLY-SWITCHABLE WINDOWS"; U.S. patent application Ser. No. 15/334,835, filed Oct. 26, 2016, and titled "CONTROLLERS FOR OPTICALLY-SWITCHABLE DEVICES"; and International Patent Application No. PCT/US17/20805, filed Mar. 3, 2017, and titled "METHOD OF COMMISSIONING ELECTROCHROMIC WINDOWS," each of which is herein incorporated by reference in its entirety Window Control System—When a building is outfitted with tintable windows, window controllers may be connected to one another and/or other entities via a communications network sometimes referred to as a window control network or a window network. The network and the various devices (e.g., controllers and sensors) that are connected via the network (e.g., wired or wireless power transfer and/or communication) are referred to herein as a window control system. Window control networks may provide tint instructions to window controllers, provide window information to master controllers or other network entities, and the like. Examples of window information include current tint state or other information collected by window controller. In some cases, a window controller has one or more associated sensors including, for example, a photosensor, a temperature sensor, an occupancy sensor, and/or gas sensors that provide sensed information over the network. In some cases, information transmitted over a window communication network need not impact window control. For example, information received at a first window configured to receive a WiFi or LiFi signal may be transmitted over the communication network to a second window configured to wirelessly broadcast the information as, e.g., a WiFi or LiFi signal. A window control network need not be limited to providing information for controlling tintable windows, but may also be able to communicate information for other devices interfacing with the communications network such as HVAC systems, lighting systems, security systems, personal computing devices, and the like.

Figure 3:
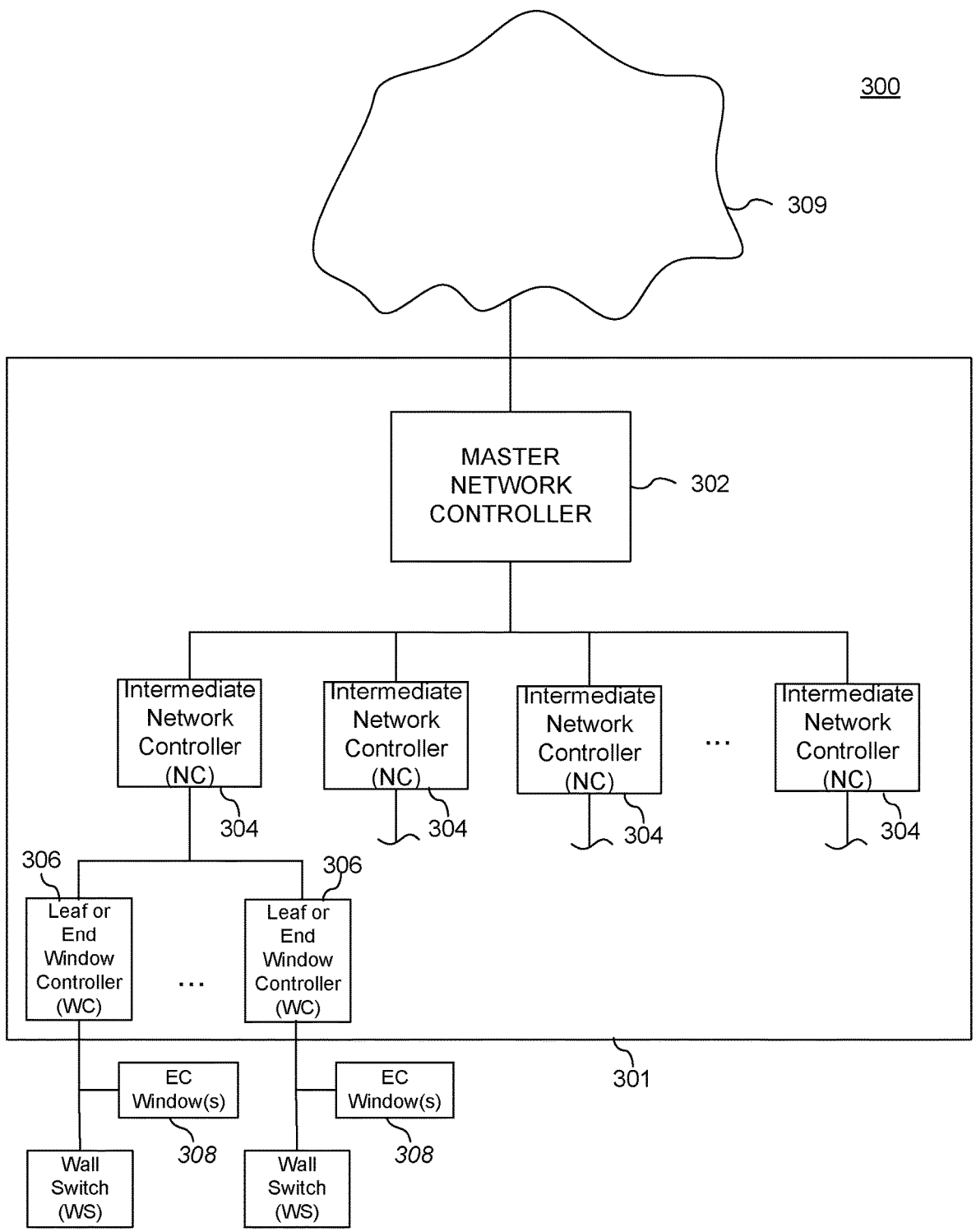
FIG. 3 depicts a window control network provided by of a window control system having one or more tintable windows.

FIG. 3 provides an example of a control network 301 of a window control system 300. The network may distribute both control instructions and feedback, as well as serving as a power distribution network. A master controller 302 communicates and functions in conjunction with multiple network controllers 304, each of which network controllers is capable of addressing a plurality of window controllers 306 (sometimes referred to herein as leaf controllers) that apply a voltage or current to control the tint state of one or more optically switchable windows 308. Communication controllers (304, 306, and 308) may occur via wired (e.g., Ethernet) or via a wireless (e.g., WiFi or LiFi) connection. In some implementations, the master controller issues the high-level instructions (such as the final tint states of the electrochromic windows) to the network controllers, and the network controllers then communicate the instructions to the corresponding window controllers. Typically a master controller is configured to communicate with one or more outward face networks 309. Window control network 301 can include any suitable number of distributed controllers having various capabilities or functions and need not be arranged in the hierarchical structure depicted in FIG. 3. As discussed elsewhere herein, network 301 may also be used as a communication network between distributed controllers (e.g., 302, 304, 306) that act as communication nodes to other devices or systems (e.g., 309).

In some embodiments, outward facing network 309 is part of or connected to a building management system (BMS). A BMS is a computer-based control system that can be installed in a building to monitor and control the building's mechanical and electrical equipment. A BMS may be configured to control the operation of HVAC systems, lighting systems, power systems, elevators, fire systems, security systems, and other safety systems. BMSs are frequently used in large buildings where they function to control the environment within the building. For example, a BMS may monitor and control the lighting, temperature, carbon dioxide levels, and humidity within the building. In doing so, a BMS may control the operation of furnaces, air conditioners, blowers, vents, gas lines, water lines, and the like. To control a building's environment, the BMS may turn on and off these various devices according to rules established by, for example, a building administrator. One function of a BMS is to maintain a comfortable environment for the occupants of a building. In some implementations, a BMS can be configured not only to monitor and control building conditions, but also to optimize the synergy between various systems—for example, to conserve energy and lower building operation costs. In some implementations, a BMS can be configured with a disaster response. For example, a BMS may initiate the use of backup generators and turn off water lines and gas lines. In some cases, a BMS has a more focused application—e.g., simply controlling the HVAC system—while parallel systems such as lighting, tintable window, and/or security systems stand alone or interact with the BMS.

In some embodiments, network 309 is a remote network. For example, network 309 may operate in the cloud or on a device remote from the building having the optically switchable windows. In some embodiments, network 309 is a network that provides information or allows control of optically switchable windows via a remote wireless device. In some cases, network 309 includes seismic event detection logic. Further examples of window control systems and their features are presented in U.S. patent application Ser. No. 15/334,832, filed Oct. 26, 2016, and titled "CONTROLLERS FOR OPTICALLY-SWITCHABLE DEVICES" and International Patent Application No. PCT/US17/62634, filed on Nov. 23, 2016, and titled "AUTOMATED COMMISSIONING OF CONTROLLERS IN A WINDOW NETWORK," both of which are herein incorporated by reference in its entirety.

While the depicted embodiment shows windows 308 and a window control network 301, it should be understood that some embodiments do not include EC windows or any other type of optically switchable windows. Further, in certain embodiments, the network includes controllers, but the controllers do not control windows. In some embodiments, the network has a topology similar to that depicted in FIG. 3, but it does not necessarily serve to control windows. Such network may serve various other purposes, and might or might not include providing instructions for controlling tint states of optically switchable windows or other building functions. In some cases, the network is initially deployed without optically switchable windows, but later such windows are installed and attached to the network. With or without the windows attached, the network can provide various functions unrelated to window control. For example, in certain embodiments a building façade (envelope) computing and power distribution system, with or without switchable windows, is described. Such systems can be installed early in a building's construction, and thus supply power and computing power, e.g. an edge computing platform and/or cloud that can be used to complete construction and/or be used by the building occupants when the building construction is complete and the building is occupied for its intended purpose.

Electrochromic Windows with Transparent Display Technology:

Applicant has previously developed IGUs with integrated photovoltaics, onboard storage, integrated antennas, integrated sensors, an API to serve up valuable data, etc. It has been found that electrochromic windows can be further improved in surprising ways, e.g., by combining with transparent display technology as well as augmenting sensor, onboard antenna, and software applications.

Figure 4:
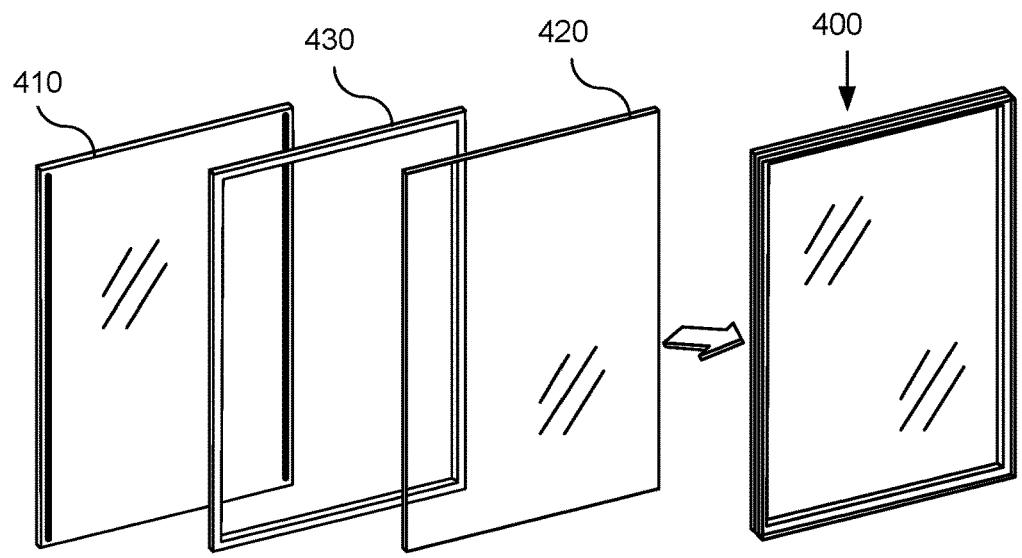
FIG. 4 depicts an electrochromic (EC) window lite, or IGU or laminate, with a transparent display.

One embodiment, depicted in FIG. 4, includes an electrochromic (EC) window lite, or IGU or laminate, combined with a transparent display. The transparent display area may be co-extensive with the EC window viewable area. An electrochromic lite, 410, including a transparent pane with an electrochromic device coating thereon and bus bars for applying driving voltage for tinting and bleaching, is combined with a transparent display panel, 420, in a tandem fashion. In this example, 410 and 420 are combined using a sealing spacer, 430, to form an IGU, 400. The transparent display may be a standalone lite for the IGU, or be e.g. a flexible panel laminated or otherwise attached to a glass lite, and that combination is the other lite of the IGU. In typical embodiments, the transparent display is the, or is on the, inboard lite of the IGU, for use by the building occupants. In other embodiments, an electrochromic device coating and transparent display mechanism are combined on a single substrate. In other embodiments, a laminate, rather than an IGU, are formed from 410 and 420, without a sealing spacer.

The transparent display can be used for many purposes. For example, the display can be used for conventional display or projection screen purposes, such as displaying video, presentations, digital media, teleconferencing, web-based meetings including video, security warnings to occupants and/or people outside the building (e.g., emergency response personnel) and the like. The transparent display can also be used for displaying controls for the display, the electrochromic window, an electrochromic window control system, an inventory management system, a security system, a building management system, and the like. In certain embodiments, the transparent display can be used as a physical alarm element. That is, the electrochromic lite of an IGU can be used as a breakage detector to indicate a security breach of the building's perimeter. The transparent display could also, alone or in combination with the electrochromic lite, serve this function. In one example, the electrochromic lite is used as a breakage detection sensor, i.e., breaking the EC pane triggers an alarm. The transparent display may also serve this function, and/or be used as a visual alarm indicator, e.g., displaying information to occupants and/or external emergency personnel. For example, in certain implementations, a transparent display may have a faster electrical response than the electrochromic lite, and thus could be used to indicate alarm status, for example, externally to firefighters, etc. or internally to occupants, e.g., to indicate the nature of the threat and/or escape routes. In one embodiment, breakage of the outboard electrochromic lite sends a signal to the transparent display, via the window controller, such that the transparent display conveys a security breach. In one embodiment, the transparent display flashes a warning message and/or flashes red, e.g., the entire transparent display pane may flash brightly in red to indicate trouble and be easily seen, e.g., a large window flashing in this manner would be easily noticeable to occupants and/or outside personnel. In another example, one or more neighboring windows may indicate damage to a window. For example, in a curtain wall where a first window has four adjacent windows, breakage to the first window triggers one or more of the four adjacent windows to flash red or display large arrows pointing to the first window, to make it easier for occupants or external personnel to know where the trouble is. In a large skyscraper, with many windows, it would be very easy for first responders to see four windows adjacent a central window flashing, i.e., forming a flashing cross to indicate where the trouble is located. If more than one window is broken, this method would allow instant visual confirmation of where the trouble lies. In certain embodiments, one or more transparent displays may be used to display a message to first responders, indicating both the location and nature of the emergency. It may be breakage of one or more windows or indicate, e.g., hotspots within the building for firefighters.

The electrochromic window can be used as a contrast element to aid visualization of the transparent display, e.g., by tinting the EC pane the transparent display will have higher contrast. In turn, the transparent display can be used to augment the color, hue, % T, switching speed, etc. of the electrochromic device. There are many novel symbiotic relationships that can be exploited by the combination of EC window and transparent display technology. When the EC pane and the transparent display are both in their clear state, IGU 400 appears and functions as a conventional window. Transparent display 420 may have some visually discernable conductive grid pattern but otherwise is transparent, and can be uni- or bidirectional in the display function. One of ordinary skill in the art would appreciate that as transparent display technology advances, the clarity and transparency of such devices will improve. Improvements in micro and nanostructured addressable grids, as well as transparent conductor technology, allow for transparent displays where there is no visually discernable conductive grid.

Figure 5:
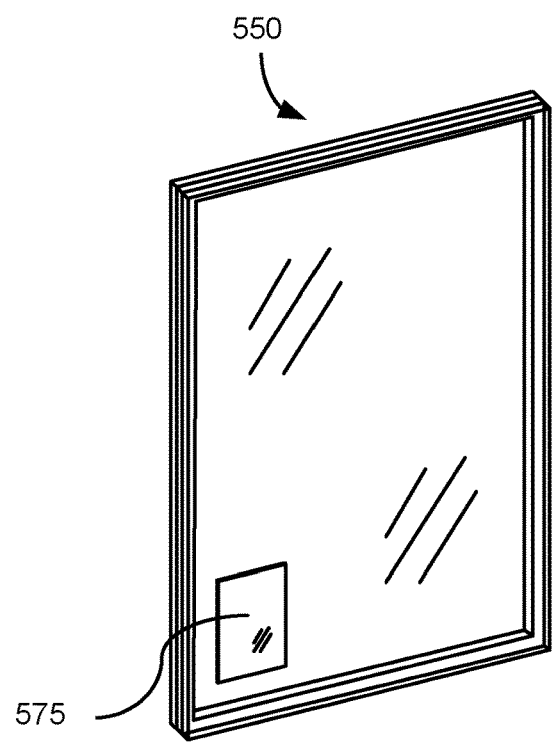
FIG. 5 depicts an electrochromic insulated glass unit with an on-glass transparent display.

FIG. 5 depicts an electrochromic insulated glass unit, 550, with an on-glass transparent display, 575, used as a control interface for IGU 550. Display 575 may be wired to an onboard controller which is, e.g., housed in the secondary sealing volume of the IGU. The wiring for the transparent display 575 may pass through the glass, around the edge of the glass, or may be wirelessly connected to the onboard (or offboard) controller (not shown). When the transparent display 575 is not in use, it is essentially transparent and colorless, so as not to detract from the aesthetics of the IGU's viewable area. Transparent display 575 may be adhesively attached to the glass of the IGU. Wiring to the control unit of the window may pass around or through the glass upon which the display is attached. The display may communicate with a window controller or control system wirelessly via one or more antenna, which may also be transparent.

A transparent display may be located within the viewable area of an optically switchable window. The transparent display may be configured to provide various types of information about windows or the building via, e.g., a graphical user interface. The display may also be used to convey information to the user, e.g., teleconferencing, weather data, financial reports, live streaming data, asset tracking and the like as described herein. In certain embodiments, the transparent display (and associated controller) is configured to show specific information about the window being used (the one displaying the information), information about a zone in which the window resides, and/or information about other particular windows in the building. Depending on user permissions, such information could include information in all windows of a building or even multiple buildings. The transparent displays (and associated controller) may be configured to allow monitoring and/or controlling optically switchable windows on a window network.

In certain embodiments, the graphical user interface may represent windows and/or other controllable systems and devices using smart objects. A "smart object," as described herein, is a representation of one or more material items that can be manipulated by a user (e.g., by contact with a touch-sensitive display) to gather and/or present information about the one or more physical devices the smart object represents. In some cases, a graphical user interface may display a three-dimensional building model with one or more smart objects thereon. By displaying smart objects on the building model according to their physical location, a user in may easily identify a smart object that represents a window of interest. Smart objects allow a user to receive information from, or control an aspect of, the window network and/or a system or electronic device in communication with the window network. For example, if a user has selected a smart object representing a window, information may be displayed such as a window ID, window type, window size, manufacturing date, current tint state, leakage current, usage history, inside temperature, outside temperature, and the like. Additionally, smart objects may present a user with options for controlling a window tint state, configuring a tint schedule, or tinting rules. In some cases, a window may have inboard lite with touch and gesture sensors that allow a user to interact with smart objects in the graphical user interface. In some cases, a user may interact with the smart objects displayed on the graphical user interface using a remote device that is configured to receive user input (e.g., a cell phone, a controller, a keyboard, and the like).

In one example, during the initial installation of a plurality of electrochromic windows, at least one window is installed with transparent display technology. This window may also be configured with power, internet connectivity, and at least one processor (e.g., a window controller, network controller, and/or master controller for the window installation). The at least one window, by virtue of its transparent display functionality, can serve as a GUI for further installation of the plurality of windows in the system to be installed. As the windows of the system are installed, this use may be translated to other windows of the system, and, additionally be used to commission windows of the system. This obviates the need for an installer to have a portable or other separate computing device for commissioning the windows; the window itself and its corresponding processing power can be used during installation to aid further installation and commissioning of the window system. Using, e.g., this at least one window with display technology tradespeople, engineers, and/or construction crews tasked with installing electrical wiring, plumbing, HVAC and other infrastructure may have the ability to pull up building drawings on large format displays, rather than carrying large paper drawings. Moreover, web-based video conferencing e.g., allows workers in disparate areas of the building to communicate with each other and discuss building plans displayed on their screens, manipulate the plans interactively via the touchscreen function of transparent displays described herein.

Figure 6:
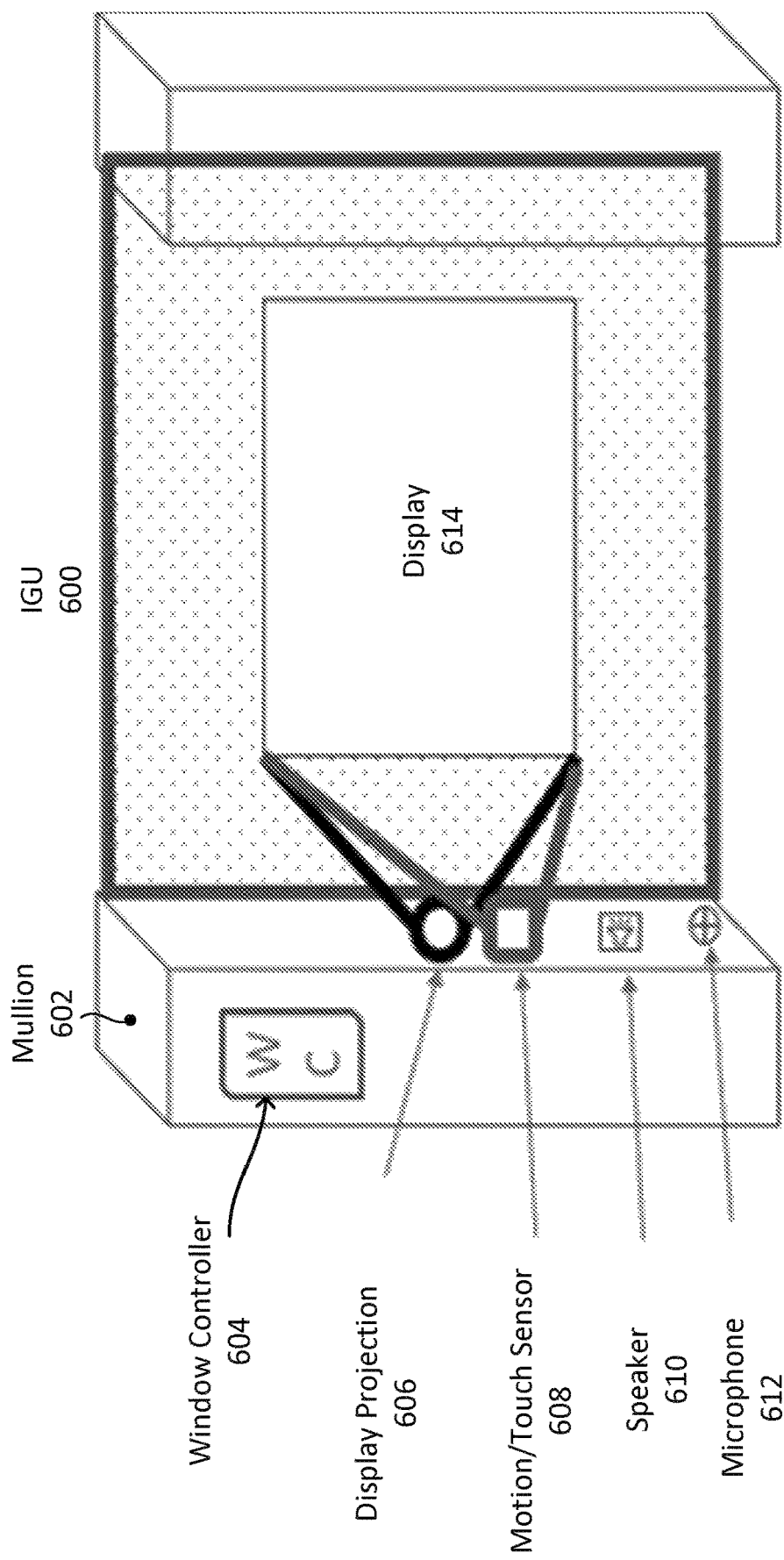
FIG. 6 depicts an optically switchable window configured with a projector for displaying an image on the surface of the optically switchable window.

In certain embodiments, rather than a transparent display registered with an EC device, e.g., in an IGU form factor, an interactive projector is used to both display information onto an EC window and also allow the user to access and input information using the interactive display technology portion of the assembly. FIG. 6 depicts an example of an optically switchable window 600 configured with a projector 606 that displays an image 614 on the surface of the optically switchable window. To improve the visibility of a projected image 614, a window may be configured with a pixelated or monolithic passive coating that is substantially transparent to an observer, but aids in the reflection of the image provided by the projector. In some cases, the level of tinting may be adjusted to improve the visibility of a projected image. In this regard, to ensure that the window tint state is appropriate for projecting, the window controller 604 and projector/display controller 606 may be coupled or in communication. The projector may be located in a mullion 602 (as depicted), a transom, or at a remote location such as a nearby ceiling or a wall. The projector 606 may receive information to display from a window controller 604, which may also be located in a mullion or a transom. In some cases, a projector in a mullion, transom, or similar location is used to project an image through free space and onto a glass surface or a passive coating of the IGU. In some cases, a projector is located within the mullion and projects light onto the display via a light guide that is embedded in, formed by, or attached to a glass substrate of a display lite. The projector may in some embodiments be configured so that the end user does not see the projector mechanism, i.e. it is hidden from view. Light may be projected from the edge of the glass into the light guide, e.g., by using a mirror or by orienting the projector. In this configuration, the projector can be concealed from view so as not to create a visual distraction. In some cases, a light guide plate is used which runs parallel to a lite which has a monolithic passive coating for displaying an image. Examples of light guide plates used for a user wearable display device which can be adapted for use for transparent displays on optically switchable windows are found in U.S. Pat. No. 9,791,701B2 titled "Display device," and filed on Oct. 17, 2017, which is incorporated in its entirety.

To receive user input corresponding to user motion, the window depicted FIG. 6 may be equipped with motion sensors 608 located on or within mullions and/or transoms. The motion sensors may include one or more cameras to detect user motion (e.g., the motion of a user's hand) and image analysis logic may determine a user's interaction with a displayed smart object based on the detected motion. For example, image analysis logic may determine whether a user's motion corresponds to a gesture used to provide a specific input. In some cases, one or more cameras may be inferred cameras. In some cases, the motion sensors may include ultrasonic transducers and ultrasonic sensors to determine user motion. In some cases, a window may be equipped with a capacitive touch sensor (e.g., on S1 or S4) that at least partially covers the visible portion of the window and receives user input when a user touches the surface of the window. For example, a capacitive touch sensor may be similar to that found in touchscreens such as the Apple iPad. In addition to motion sensors, an optically switchable window may also be equipped with a microphone 612 located in a mullion or transom for receiving audible user input. In some cases, a microphone 612 may be located on a remote device and voice recognition logic may be used to determine user input from received audio. In some cases, audio is recorded on a remote device and transmitted wirelessly to a window controller. Examples of systems that provide a voice-controlled interface for controlling optically switchable windows are provided in PCT Patent Application PCT/US17/29476, filed on Apr. 25, 2017, which is herein incorporated by reference in its entirety. When a window may be configured to receive audible user input, a window may also be configured with one or more speakers 610 for providing information to a user. For example, a speaker 610 may be used respond to a user inquiry or to provide various features that may be controlled by the user. In some cases, a projector such as an Xperia Touch™, manufactured by Sony Corporation, is attached to or near the IGU, e.g., in a mullion or on a wall or ceiling nearby, in order to project onto an IGU to display information to the user and provide an on-glass control function.

In one embodiment, the window assembly includes a motion sensor, a camera, a transparent capacitive touchscreen, and/or a microphone for voice activation. When a user interacts with the window, the projector (or transparent display) activates to show a control GUI for controlling the window, other windows in the building, and/or other building systems. The user interaction may be, e.g., movement detected near the window, video or image identification of the user, an appropriate touch command, and/or an appropriate voice command. The user can then carry out desired work, programming, data retrieval and the like. After a period, or by the appropriate command input provided by the user, the control GUI on the glass (projected or transparent display) disappears or ceases, leaving the (entire) unobstructed view of the window.

In certain embodiments, a window may use an electrowetting transparent display technology. An electrowetting display is a pixelated display where each pixel has one or more cells. Each cell can oscillate between substantially transparent and substantially opaque optical states. Cells make use of surface tensions and electrostatic forces to control the movement of a hydrophobic solution and a hydrophilic solution within the cell. Cells can be, e.g., white, black, cyan, magenta, yellow, red, green, blue, or some other color in their opaque state (determined by either the hydrophobic solution or the hydrophilic solution within the cell). A colored pixel may have, e.g., a cyan, magenta, yellow cells in a stacked arrangement. Perceived colors can are generated by oscillating the cells of a pixel (each cell having a different color) at specific frequencies. Such displays may have many thousands or millions of individually addressable cells which can produce high-resolution images.

The display may be permanently or reversibly attached to the electrochromic window. The electrochromic window may include an electrochromic lite, an electrochromic IGU, and/or a laminate including an electrochromic lite, for instance. In some cases, it may be advantageous to include a reversible and/or accessible connection between the display and the window such that the display can be upgraded or replaced, as needed. A display lite can be either inboard or outboard of the electrochromic device. It is noted that any of the embodiments herein can be modified to switch the relative positions of the display lite and the electrochromic EC device. Moreover, while certain figures show an electrochromic window that includes a particular number of lites, any of these embodiments can be modified such that the electrochromic window includes any number of lites (e.g., an EC IGU may be replaced with an EC lite or EC laminate, and vice versa).

Example solid-state electrochromic devices, methods, and apparatus for making them and methods of making electrochromic windows with such devices are described in U.S. patent application Ser. No. 12/645,111, entitled "Fabrication of Low Defectivity Electrochromic Devices," by Kozlowski et al., and U.S. patent application Ser. No. 12/645,159, entitled "Electrochromic Devices," by Wang et al., both of which are incorporated by reference herein in their entireties. In various embodiments, a solid-state electrochromic device is used in conjunction with a transparent display, which may be pixelated and which may include one or more organic or non-solid components. Examples of such displays include OLEDs, electrophoretic displays, LCDs, and electrowetting displays. As described, the display may be fully or partially coextensive with an electrochromic device on a lite. Further, the display may be provided in direct on contact with an electrochromic device, on the same lite as the electrochromic device but on a different surface, or on a different lite of an IGU. In some embodiments, the display lite may reversibly and accessibly attach to a dock that secures the display lite. The dock may be configured to safely receive the display lite and support it at one or more edges. Examples of docks and other framing are described in U.S. patent application Ser. No. 14/951,410, titled "SELF-CONTAINED EC IGU" and filed on Nov. 24, 2015, which is herein incorporated in its entirety.

In various examples, a framing system that secures a display lite includes a structure for securing the display lite proximate an EC window, and wiring for providing power to the display lite. The framing system may further include wiring for providing communication to the display lite, wiring for providing power to an EC window and/or window controller, and wiring for providing communication to the EC window and/or window controller. In these or other embodiments, the framing system may include wireless transmitters and/or receivers for transmitting and/or receiving wireless control information that may be communicated to the display lite and/or the electrochromic window/window controller. The framing system may also include a number of other components useful for an electrochromic window such as various sensors, cameras, etc.

In some embodiments, a framing system supporting a display lite is configured to be installed proximate existing framing that already secures an electrochromic window. The electrochromic window is essentially being retrofitted to include the display lite in this example. In some such cases, the framing may include control hardware to interface with the existing EC window. Such control hardware may use wireless communication to control the EC window in some cases.

Generally speaking, the framing system/dock/similar hardware may be referred to as an apparatus for mounting an electronic device onto an optically switchable window. The electronic device is a display in many cases (e.g., a display lite or other display), and may or may not be transparent. The electronic device may also be any number of other devices, including but not limited to a window controller, user input device, etc. In some cases, the apparatus may mount more than one electronic device onto the optically switchable window.

In some cases, the display and the EC window may be controlled in tandem to enhance user experience. For instance, the display may be controlled in a way that takes into account the optical state of the EC window. Similarly, the optical state of the EC window may be controlled in a way that takes into account the state of the display. In one example, the EC window and display may be controlled together in order to optimize the appearance of the display (e.g., such that the display is easy to see, bright, readable, etc.). In some cases, the display is easiest to see when the EC window is in a darkened tint state. As such, in some cases, the EC window and display may be controlled together such that the EC window goes to a relatively dark tint state when the display is used, or when the display is used and certain conditions are met (e.g., with respect to timing, weather, light conditions, etc.).

In some embodiments, a first controller may be used to control the optical state of the EC window, and a second controller may be used to control the display. In another embodiment, a single controller may be used to control both the optical state of the EC window and the display. The logic/hardware for such control may be provided in a single controller or multiple controllers, as desired for a particular application.

Figure 7:
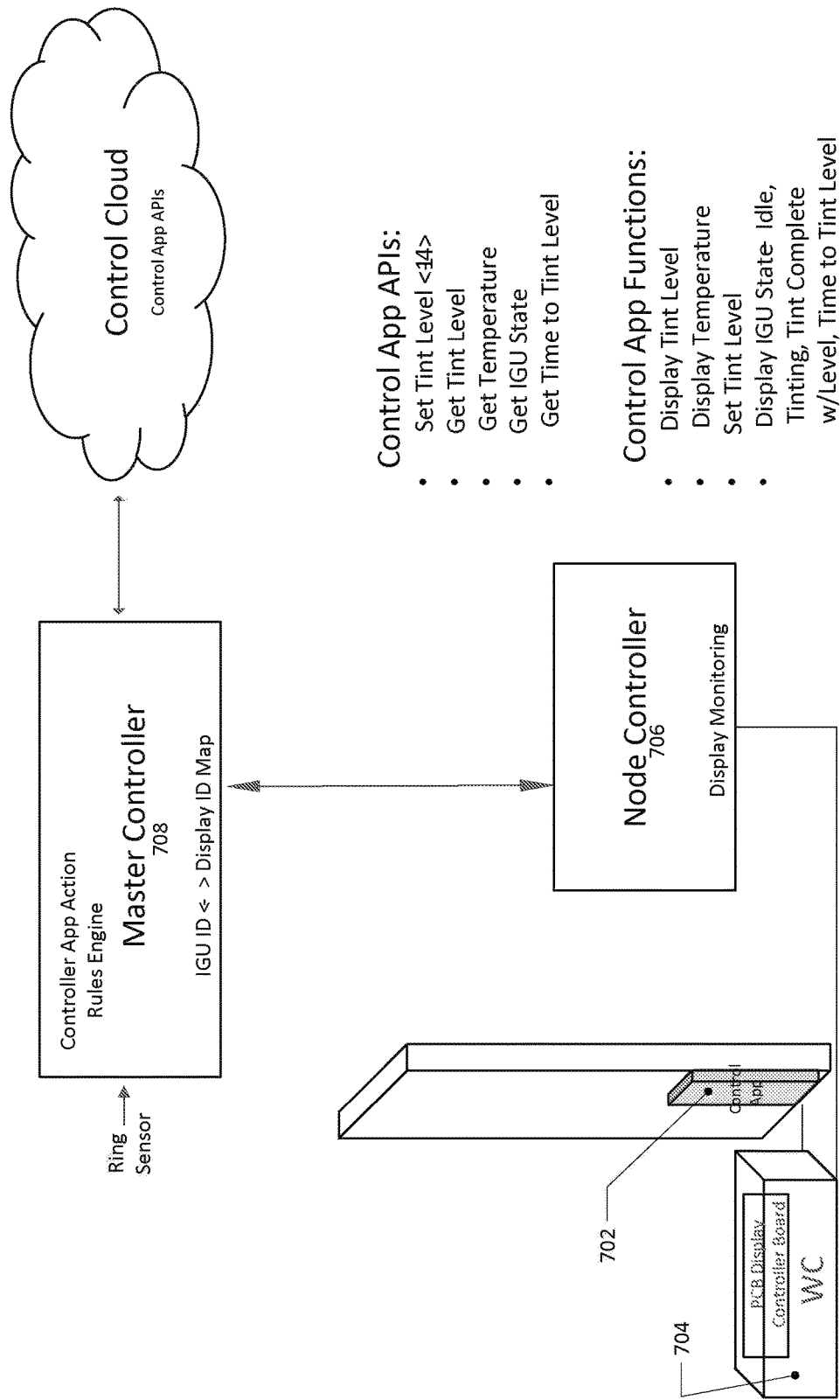
FIG. 7 illustrates one configuration of how the architecture of how an on-glass transparent controller can be implemented.

FIG. 7 illustrates one configuration of how the architecture of how an on-glass transparent controller can be implemented. The on-glass controller transparent display 702 is used to display control applications in a graphical user interface (GUI) format. The transparent display is in communication with the window controller 704, either onboard or offboard as depicted below. A node controller 706 is used for display monitoring and function. The node controller communicates with a master controller 708 for controlling the EC functions, etc., which in turn communicates via the cloud with APIs. The window controller may include RF radio, temperature sensors and control and Bluetooth capability. Transparent on-glass controller displays can be, e.g., as commercially available Lumineq® transparent displays from Beneq Oy, of Finland, as described on their commercial website (http://beneq.com/en/displays/products/custom). When a window controller is connected to a local area network (e.g., a local network provided via windows) or connected to the internet, the transparent display and other glass functions can be controlled in some cases, through a web-based application or another application configured to communicate with the window control network. Such applications can be run on, e.g., phones, tablets, or desktop computers.

Applicant's previously described window control technology architecture can, in some cases, include a daughter card containing I/O for driving a transparent display (whether on-glass controller and/or if a full window size display/controller). Embodiments may also include an onboard antenna. The antenna may be an on-glass antenna, e.g., fractal and/or antenna suites scribed into a transparent conductive oxide layer on a lite of an IGU. Antennas are used for various functions, including RF transmission/reception. Various EMI blocking coatings may also be included in embodiments.

Figure 8A:
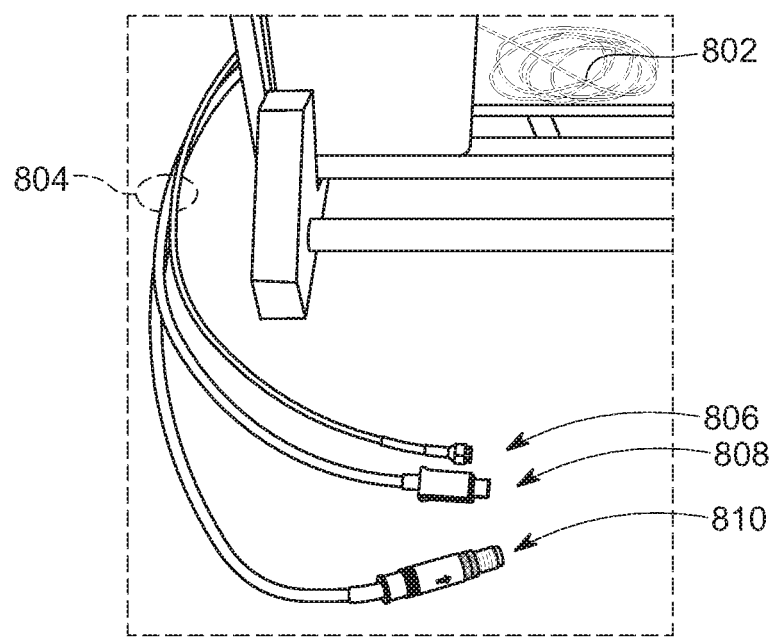
FIGS. 8a and 8b depict an EC IGU 802 with an IGU connector for EC, antenna, and video applications.
Figure 8B:
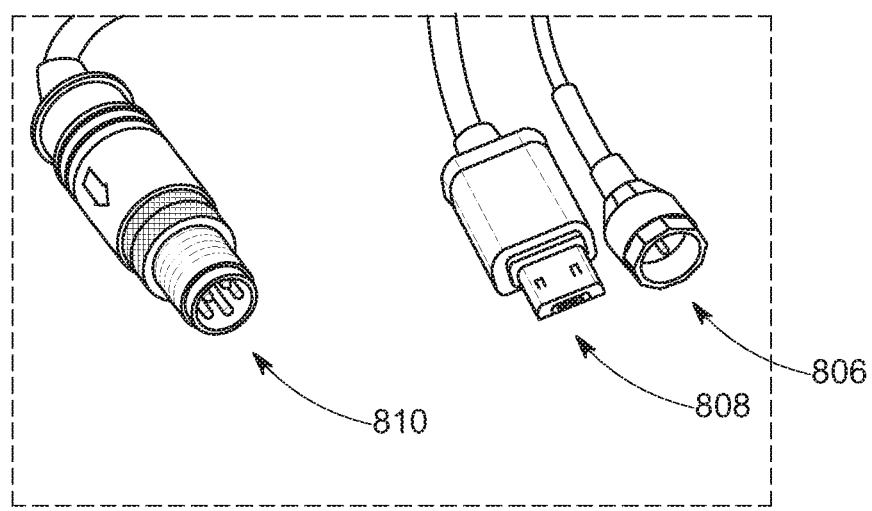

FIGS. 8*a* and 8*b* depict an EC IGU 802 with an IGU connector 804 for EC, antenna, and video applications. An IGU connector may include a single cable that supports each of these applications, or in some cases (such as depicted in FIGS. 8*a* and 8*b*) an IGU connector may include more than one connector, each connector being used to support a different application of the EC IGU. For example, a 5-pin connector 810 may be used to support EC functionality while a coax cable 808 may support wireless communications (e.g., via window antennas) and an MHL connector 808 (or I2C) may provide a video signal for the transparent display. Some embodiments include wireless power and control, which may, in some cases, obviate the need for one or more wired connectors.

Certain embodiments described herein combine the strength of an existing building operating system (BOS) infrastructure with antennas and display technology for additional functionality. One example of such functionality is providing power for window system components such as window controllers, radio, and display drivers. In some cases available power is provided at about 2-3 W per IGU. In some implementations, EC control communication can be delivered over, e.g., standard 5 wire cable with CANbus and power. For example, a CANBus may be operated at 100 kbps or higher, e.g., up to about 1 Mbps if needed. In some embodiments, an ARCnet network is employed, operating at up to about, e.g., 2.5 Mbps. It may do this in various network topologies including a linear control network. Delivering content for wireless and video requires relatively high bandwidth communication interfaces, which can be made available with window systems that employ wireless transmission, UWB, or the like, each of which can be provide 500 Mbps or higher data rates. Often window system installations have many windows, thereby allowing high data rates, particularly compared to sparse systems with an occasional transceiver as with current Wi-Fi technology.

The aspect of adding a display device to an EC window drives a need for greater communication bandwidth, at least if the display content changes frequently. Bandwidth requirements may be branched into two different products, one for real-time display (e.g., a projector screen replacement) with higher bandwidth, and one for lower bandwidth applications (e.g., signage applications).

Frequently changing content like h.264 video conferencing requires 10 Mbps (Ethernet) data rates for High-Definition (HD) quality at 30 frames a second. More static data, like a static advertisement can use the existing data path (CANbus) and available bandwidth (around what's required for glass control) to load the content. The content can be cached, so data could trickle in over an hour, and then the display updates when the frame is complete. Other more slowly changing data like weather feeds, or sales metrics also don't require high-speed data. Table 1 illustrates data communication bandwidths and associated applications.

having a real-time display can provide real-time health statistics for a patient as one looks through the outside window. In this example, the patient retains the health benefits of natural lighting while a doctor reviews patient's chart. In yet another example, a real-time display can be used outside of a conference room wall to, e.g., display scenery to people passing by as a privacy enhancement mechanism. Privacy provided by the display can augment the privacy provided EC glass may darken over a period. In yet another example, transparent displays can provide augmented heads-up displays in cars or other forms of transportation.

OLED displays or similar (TFT, etc.) components of the EC IGU may have other applications besides providing dynamic graphical content. For example, OLED displays can provide general illumination. A dark window on a winter night simply looks black or reflects the interior light, but by using an OLED display, the surface can match the color of your wall. In some cases, the transparent display can display a scene that is pleasant to a building occupant and provides privacy. For example, a window can display a screenshot of a sunny day from that exact window from a camera integrated into the on glass or onboard window controller. In another scenario, a transparent display can be used to modify the perceived color of light transmitted through the EC lite portion of the IGU. For example, a transparent display may add a tinge of blue to a clear EC IGU, or a little color to a tinted IGU to make it more gray or neutral in tint. In another scenario, a transparent display can also be used to change the reflected color of light on the walls of the occupant's interior

TABLE 1

Data communication Bandwidths.

| Quality | Resolution | Video Bitrate | Audio Bitrate | Frames Per second | Video codec | h.263 Profile |
|---|---|---|---|---|---|---|
| Low | 480 × 270 | 400 kbps | 64 kbps | 15/30 | h.264 | Baseline |
| Med | 640 × 360 | 800-1200 kbps | 96 kbps | 30 | h.264 | Main |
| High | 960 × 540 | 800-1500 kbps | 96 kbps | 30 | h.264 | Main |
| HD 720 | 1280 × 720 | 1,200-4,000 kbps | 128 kbps | 30 | h.264 | Main |
| HD 1080 | 1920 × 1080 | 4,000-8,000 kbps | 192 kbps | 30* | h.264 | Main or High |

For signage applications, a transparent display integrated with an EC IGU offers a number of benefits. In some cases, windows may display a "follow me" guidance system to get you to your connecting flight in the most efficient way. This guidance system may be combined with a high accuracy location awareness system that provides personalized services on a display based on the location of a traveler's mobile phone and the traveler's boarding pass for the next flight. For example, the transparent display may indicate: "this way to your next flight, Chuck" on panes of glass as you move along the corridor in the terminal. In another example, personalized displays on glass doors in a grocery store may display what is on special within a buyers preference category. In an emergency, the display windows may indicate safe exit routes, where fire extinguishing equipment resides, provide emergency lighting, and the like.

For real-time displays utilizing higher bandwidth data communication, the following examples are provided. In some cases, a video projector can be replaced with an OLED display and an EC IGU. The EC IGU can then darken the room and/or provide the dark background necessary for good contrast on the display. In another example, windows with transparent displays can replace TVs in commercial and residential applications. In another example, a window space. For example, instead of looking at various hues of blue on a white wall, the display can be tuned to make that color more uniform using feedback from an inward facing camera of an onboard window controller.

In certain embodiments, the transparent display component of the IGU is used to augment or replace conventional lighting in interior spaces (or exterior spaces if the display is bi-directional). For example, OLED displays can be quite bright, and therefore can be used to light up a room (at least to some degree) as an occupant walks into the space at night (with occupancy sensing). In another embodiment, the transparent display component is used to provide a color controlled light for an art gallery at a museum, e.g., a length of EC glass on one side of a wall used to illuminate artwork on the opposite wall.

Figure 9:
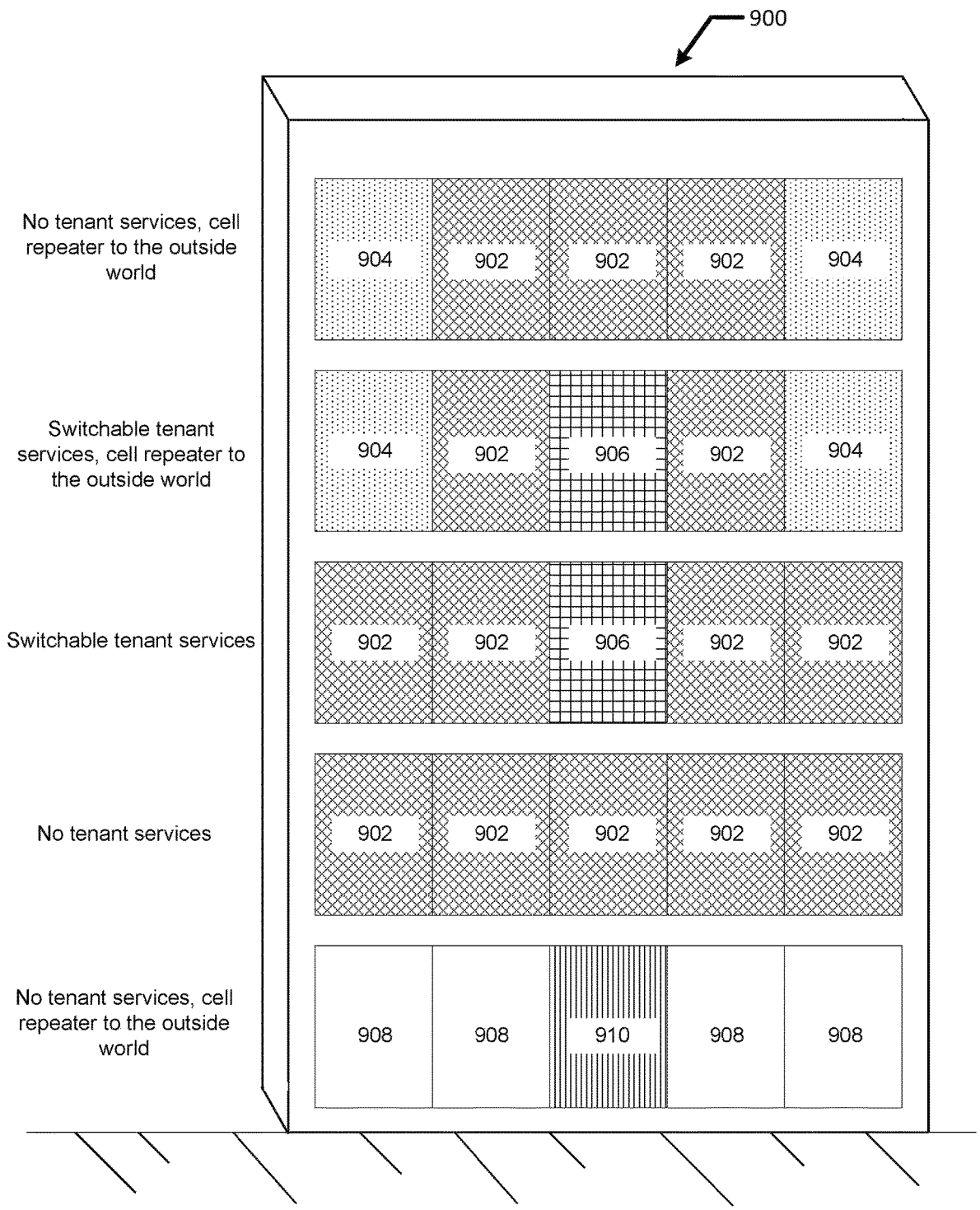
FIG. 9 depicts a façade of a building 900 having IGUs with various capabilities

A curtain wall of IGUs may all have transparent display technology or may be a mixture of IGUs, some with and some without transparent display technology. FIG. 9 depicts a façade of a building 900 having IGUs with various capabilities. IGUs labeled 902, 904 and 906 are for EMI blocking. IGUs labeled 904 and 910 are configured to provide cellular communications to the outside world, and IGUs labeled 906 and 910 are configured to offer WiFi and/or cellular services to occupants within the building.

IGUs labeled 908 only are configured for EC tinting and do not block wireless communications.

In the example depicted in FIG. 9, the top floor tenant either wants to be isolated from the outside world or will provide their own communications (a cable modem for example). The building owner may, e.g., lease the outward facing antennas (904) to the local cellular company as repeater towers. The fourth-floor tenant may want cellular services in the building and control when they are available. The inward facing antenna (906) emanate signals into the building on demand, but blocks exterior signals. The source of the signals may be the two outward facing cellular antennas (904). The third-floor tenant wants to block all outside signals, but offer WiFi and cellular services to occupants (906). The second-floor tenant wants complete isolation, they may have their own hardline (e.g., cable modem) connections, but otherwise are isolated. The ground floor is a lobby, EC glass (908) allows exterior signals to pass through the glass, as well as offering a cellular repeater (910) to boost the available signals in the common area of the building.

Environmental Sensors

In some embodiments, an IGU may be equipped with environmental sensors for air quality monitoring. For example, an IGU may have one or more electrochemical gas sensors that transduce a gas concentration into a current flow through oxidation and reduction reactions between the sensor and the sensed gas. In some embodiments, metal oxide gas sensors may be used. Metal oxide sensors monitor a sensed gas concentration as function of electronic conductivity at the sensor. In some cases, an IGU may be able to sense one or more of the six criteria pollutants (carbon monoxide, lead, ground-level ozone, particulate matter, nitrogen dioxide, and sulfur dioxide) that are monitored by the US national ambient air quality standards (NAAQS). In some cases, IGUs may be equipped with sensors for detecting less common pollutants if there is a specific safety concern at an installation site. For example, in a facility for semiconductor processing, sensors may be used to monitor for fluorocarbons or to detect chlorine gas. In some cases, a sensor may detect carbon dioxide levels as a form of occupancy sensor, e.g., to aid window control logic to determine heating and cooling needs of the interior environment.

Figure 10:
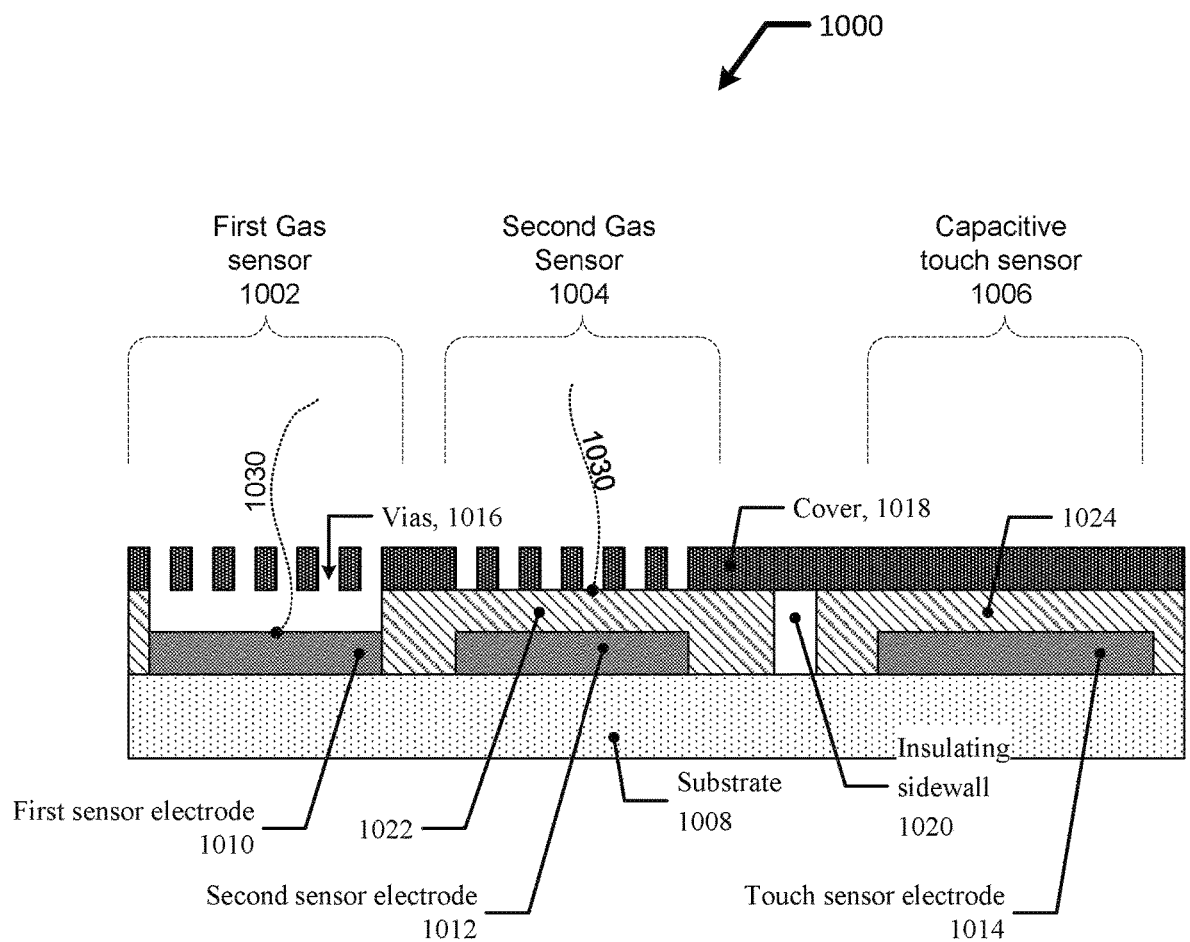
FIG. 10 depicts an atmospheric gas sensor that may be located on or associated with an IGU.

FIG. 10 depicts a cross-sectional view of an example atmospheric gas sensor that may be located on an IGU. The environmental sensor 1000 includes one or more first sensing units 1002 and one or more second sensing 1004 units disposed on a substrate 1008. A cover 1018 may be disposed over the first and second sensing units to protect sensing units from large particles. Vias 1016 in the cover allow chemical particles 1030 to pass and be detected by the sensing units. The first sensing unit 1002 senses chemical particles when particles pass through the vias 1016 and adhere to the first sensor electrode 1010, changing the electrode's resistance. The second sensing unit 1012 has an insulating layer 1022 between the second sensor electrode 1012 and the cover 1018 and senses a capacitance change when chemical particles pass through the vias and adhere to the insulating layer 1022. In some embodiments, the environmental sensor is also integrated with a capacitive touch sensor 1006, where the insulating layer 1024 between the touch sensor electrode 1014 may be the same material as the insulating material used for the second electrode 1022. In some cases, insulating layers used for a capacitive touch sensor and a second sensor unit 1022 and 1024 are deposited during the same operation. In embodiments where a touch sensor is integrated with an environmental sensor, an insulating sidewall 1020 is used to prevent the chemical particles from diffusing into the region near the touch sensor electrode 1014. Electrodes for the first and second sensing units may be made from materials such as Graphene, Carbon Nano Tube (CNT), Silver Nano Wire (AgNW), Indium Tin Oxide (ITO), etc. In some cases, the same material used for a transparent conductive layer in an electrochromic device can be used as for an electrode of the sensing unit or the touch sensor.

In some embodiments, an environmental sensor may be located on an interior surface or an exterior surface of an IGU. The sensor units may be very small such that even if they are made with opaque materials they can still be inconspicuous. For example, the area of the first sensor electrodes and/or the second sensor electrodes may be between about 1 µm and about 10 µm, or in some cases between about 10 µm and about 100 µm. In some cases, the substrate of an environmental sensor may be located on or embedded in a lite of an IGU. In some embodiments, the sensor is fabricated directly on top of an electrochromic device, and in some cases, an environmental sensor may be integrated into a transparent display (e.g., an OLED display) as described herein where capacitive touch sensors provide a means accepting for user input of a GUI provided by the transparent display. In some embodiments, an environmental sensor may be fabricated separately from an IGU and then may be bonded or attached to the interior surface, the exterior surface, or the frame of an IGU. The sensor may be part of the window controller architecture; e.g., a window controller may be part of the window assembly. In some cases, sensors are located on or associated with on glass controllers which are described in U.S. patent application Ser. No. 14/951,410, titled "SELF-CONTAINED EC IGU" and filed on Nov. 24, 2015, which was previously incorporated in its entirety. In some cases, a sensor is located on a frame, mullion, or adjacent wall surface. In certain embodiments, sensors in mobile smart devices may be used to aid in window control, e.g., as inputs to window control algorithms when sensors are available in smart devices also having window control software installed.

When installed, an environmental sensor is electrically connected to a window controller or another controller having logic for collecting and processing data from the first sensing unit(s), the second sensing unit(s), and/or capacitive sensor(s). When located on an IGU, an environmental sensor may be electrically coupled to a controller via conductive lines on the surface of a lite that connect to a pigtail connector. As described elsewhere, pigtail connectors provide a plug interface for electrically connecting a window controller to an electrochromic device, window antennas, and/or other sensors and electrical components of an IGU.

An environmental sensor may have a high sensing performance and be able to discriminate between various gas pollutants. For example, the first sensing unit may be reactive to first and second particles, while the second sensing unit may be reactive to second and third particles but not the first particles. In this example, the presence of each of the first, second and third types of chemical particles in the air can be determined by evaluating a sensed response from the first sensing unit(s) in combination with the second sensing unit(s). In another example, if a gas sensor has cross-sensitivity to a plurality of gasses, it may be difficult to determine what gas is being detected from a single type of sensing unit. For example, if the first sensing unit has a strong sensitivity to chemical A but is less sensitive to chemical B, the sensing logic may be unable to determine whether chemical A is present in a low concentration or chemical B is present in a high concentration. When a second sensing unit is also used and has a different sensitivity to chemicals A and B (e.g., being more sensitive to chemical B than to chemical A), then gas sensing logic may be able to discriminate between the gasses. If the second sensing unit is located adjacent to the first sensing unit, it may be assumed that the concentration of a sensed gas is similar at both units, and then the sensitivity difference of the two units may be used to discriminate between the two or more chemicals. In some cases, there may be three or more types of sensing units on an IGU which may be used by sensing logic to discriminate between air pollutants. In some cases, an IGU may have multiple gas sensors to compensate for sensor drift or instabilities.

Advanced Network Architectures

FIG. 11a depicts a network architecture of current and commercially available window control systems. Each EC window has a window controller (WC), which in turn communicates with a network controller (NC), which in turn communicates with a master controller (MC). Communication and control can be done wirelessly, via a mobile app and/or via the cloud. Power is provided to windows through a trunk line cabling system, which is modular and has a plug-n-play interface. In some cases, EC windows are controlled based on sensor readings, e.g., based on the measured light intensities or based on measured temperatures. In some cases, windows are controlled via user input provided using the control application. In other cases, windows can be controlled based on the logic that considers the context, intensity, and angle of incident light. Once the desired tint level is determined, the drive commands tint the EC glass accordingly. In addition to automatic control based on local sensors an manual control provided through the control application, Applicant's operating system can take into account information provided by weather services, an occupant's physical location, and/or an occupant's schedule when determining the appropriate tint level for the window. Tint level adjustment may be performed in conjunction with indoor LED light luminosity & color adjustments and temperature control.

FIG. 11b depicts an embodiment having a cloud-based software that supports a window control network. The cloud-based software can store, manage, and/or process basic functions such as sensing light, sensing air, sensing water, applying proximity context, executing tasks, controlling peripherals and providing an open interface for other applications. Transparent displays on the electrochromic windows enhance the user experience by allowing users to interact directly with the glass, rather than using a mobile device or wall unit. By including atmospheric sensors (not depicted) controllers may analyze air, water, light along with the occupant's context and/or personal data to create a personalized user experience. Glass controllers can create mesh networks with other digital systems in the building including LED lights, HVAC, and air filters. The glass controllers can work in conjunction with these systems to keep an optimal ambient environment within the building and act as 'data wall' between indoor and outdoor environments. Proximity detection and user recognition that is sensed or provided by user input can trigger glass personalization. The glass network specific internet-hosted software interacts via the cloud with, e.g., commercially available IoT digital systems, such as Nest, FB, Predix, IBM Watson++, etc. to augment and create integrated glass functions, including end-to-end data security and an IoT LTE network. Further embodiments include, partner eco-system powered glass functions within their application like building automation apps (e.g., Honeywell, J&J controls), workplace apps (e.g., iOffice), service and ticketing apps (e.g., Service Now, personalization apps (e.g., IFTTT), IoT ecosystem—asset tracking (e.g., Oracle IoT cloud), Smart Lighting (e.g., Bosch, Philips, GE), Digital Ceiling (e.g., Cisco) and the like.

Figure 11F:
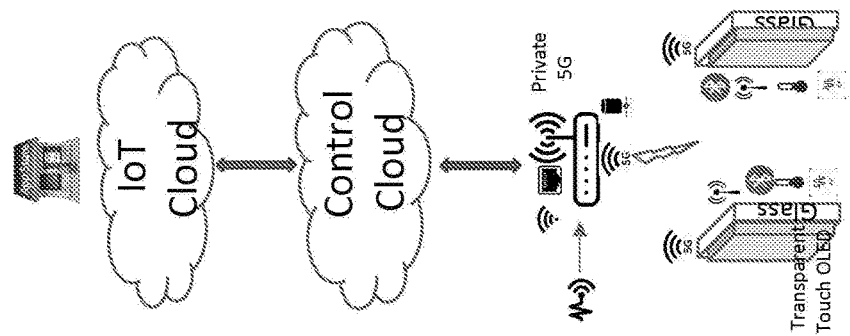
Figure 11E:
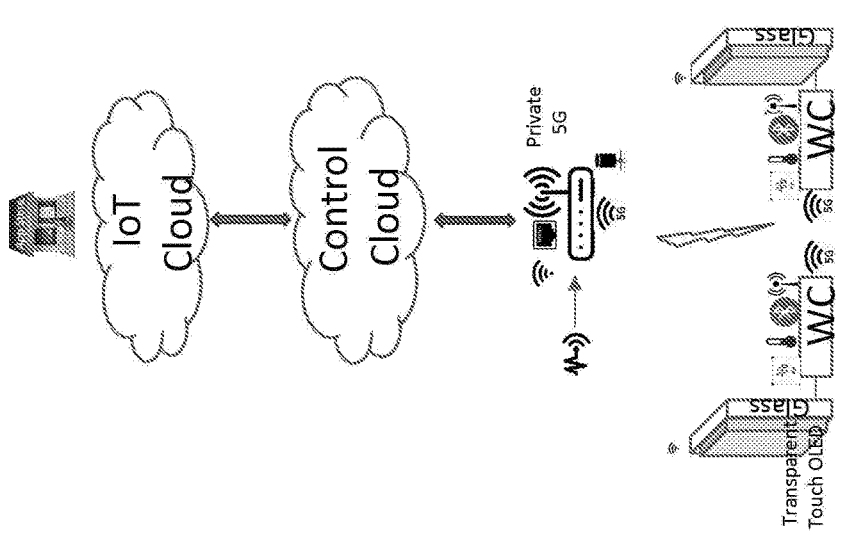
Figure 11D:
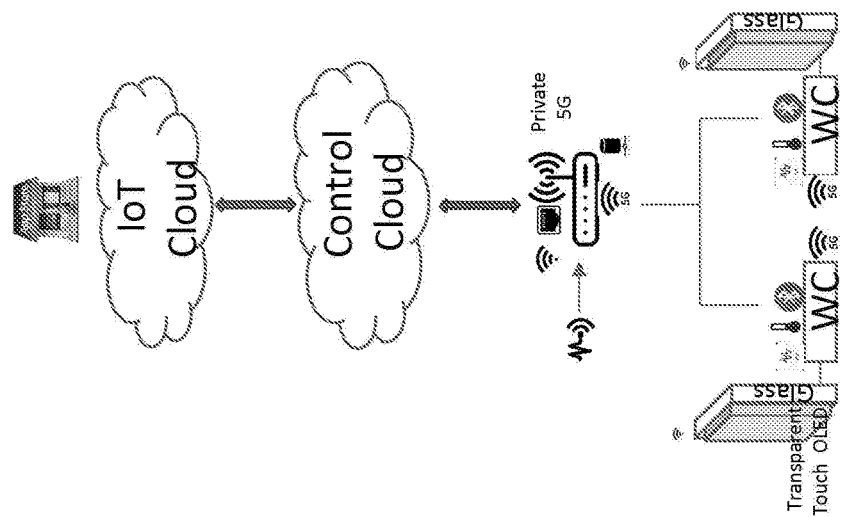

FIG. 11c depicts a network architecture where the electrochromic glass is 5G enabled. As in FIG. 11b, the EC glass includes on-glass control, e.g., transparent display controller on surface 4 (occupant side of the window) as depicted. FIG. 11d depicts the same architecture as in FIG. 11c, but in this case, the transparent display is large, substantially covering the viewable portion of the window on surface S4. This architecture may include, as in previous embodiments, auto personalization of glass upon proximity detection of the occupant, asset location tracking near the glass, etc. using, e.g., proximity and motion sensors. Having 5G network speed from glass to the cloud enables high bandwidth applications like full-HD display technology.

A full HD Display on (or as) the inner glass surface allows for various digital content to be displayed. Displayed digital content may include, e.g., signage, communication, a work collaboration space connected to a personal computer, or graphical user interfaces (GUIs) for controlling windows, sensors, or HVAC systems. In certain embodiments, e.g., in signage applications, there is a transparent LED Mesh on surface S1 (not depicted) displaying signage to those outside the building, while still allowing for occupants to simultaneously see out of the building. Adjusting the EC glass component of the system allows for contrast control for inward and/or outward projecting transparent display technology. In one embodiment, a two-way transparent display on, or as S4, is used both for inside occupant display as well as signage for those outside the building. In one example, office buildings windows are used for occupant needs (e.g., providing a display, providing control functions, and communication), during business hours, but used for external signage during non-business hours.

In one embodiment, an insulated glass unit includes a transparent HD display as its inboard lite, with or without a tintable lite as an additional lite, e.g. the outboard lite. In certain embodiments, computing and power façade platforms use such IGUs to display GUIs for control of the platform, e.g. to compute and/or deliver power as directed by the building occupant using the GUI. In certain embodiments this control function is combined with mobile control using mobile smart devices. In one embodiment, computing and power façade platforms are controlled using only mobile smart devices and/or control apparatus that do not include HD display IGUs.

Having such capabilities greatly expands the utility and value of building windows/façades. In another example, some of the windows or areas of individual windows are used for signage, and simultaneously other windows or areas of individual windows are used for occupant display, communication and control functions.

In some embodiments, a controller such as a master controller in the network may include a CDN proxy for signage content for local playback. Any controllers of the window control system (e.g., a master controller, network controllers, and/or leaf controllers) may contain a 5G LTE network controller.

In some embodiments, the IGU is configured with an RF modulator module for Wi-Fi, GSM blocking/allowing. As depicted in FIG. 11e, this enables drone-safe buildings. As in previous embodiments, this architecture can include embedded sensors (BLE, RF, proximity, light, temperature, moisture, 5G) on, in, or around the IGU, as depicted in FIG. 11f. The IGU's window controller (e.g., an onboard controller) may be wirelessly powered (as illustrated by the lightning bolt in the figure). This enables plug & play intelligent glass powered over a 5G network.

In some embodiments, the transparent display and/or another transparent layer, includes photon cells (a type of photonic memory cell), which are capable of storing not only power (photovoltaic function) but also information. A network of photon cells can enable onboard control where the window controller logic circuit is configured as a transparent grid, thus allowing for "sensor glass." The transparent grid window controller can be self-powered and mesh with other windows in the network as a true plug and play system. The transparent window controller may or may not be integrated or part of the transparent display component. One embodiment is an electrochromic IGU with a transparent on pane window controller which receives power through photovoltaic cells.

Figure 11G:
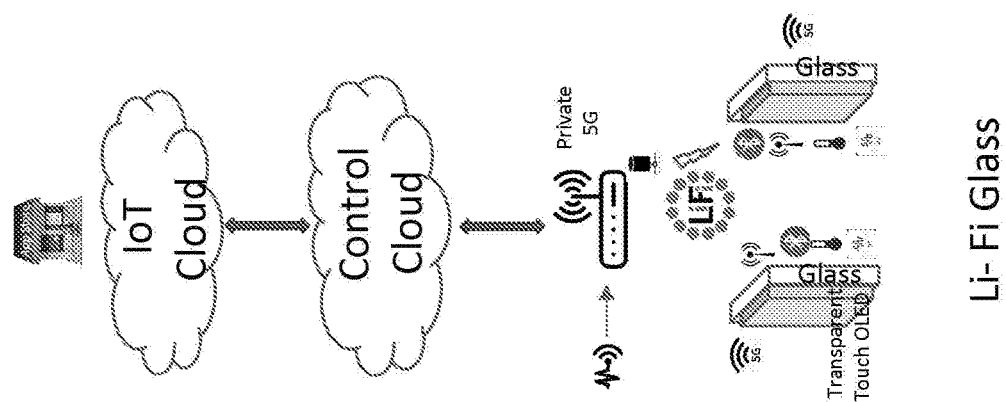

In some embodiments, the IGU is configured with Light-Fidelity (Li-Fi) wireless communication technology, as depicted in FIG. 11g. Light Fidelity is a bi-directional, high-speed and fully networked wireless communication technology similar to Wi-Fi. It is a form of visible light communication and a subset of optical wireless communications (OWC). In certain embodiments, Li-Fi is used as a complement to RF communication (Wi-Fi or cellular networks), while in some embodiments Li-Fi is used as the sole means of data broadcasting to and from the IGU. As Li-Fi carries much more information than Wi-Fi, it allows for virtually unlimited bandwidth for communication between the IGU(s) and the control system.

Using Li-Fi enables radio free buildings, e.g., to obviate occupant exposure to RF radiation. A Li-Fi powered glass network provides ultra HD to devices inside the building (including the transparent display component(s) of the IGUs described herein) paired with high-speed external radio networks.

Use Cases

The following description illustrates use cases associated with embodiments described herein. The description below may also include further embodiments. The architectures, configurations, hardware, software, etc. described herein allow for greatly expanded capabilities of building glass which therefore makes the building façade far more useful and valuable, e.g., not only to save energy, but also to increase productivity, promote commercial markets, and enhance occupant comfort and well-being. In the description below the term "the glass" may be used to mean the control network, the system architecture, the window controller, interchangeably, to simplify the description. One of ordinary skill in the art would recognize that, along with the hardware, software, network and associated embodiments described herein, that "the glass" means the appropriate systems needed to perform whatever function is described in the particular use case.

Proximity & Personalization

The IGUs and glass control architectures described herein detect the proximity of the occupant near the glass (e.g., via a proximity sensor on the window controller) and control the ambient environment (e.g., window tint, lighting, HVAC of the area where the user currently is) to the occupant's preferences. For example, occupant preferences provided by the occupant or learned from previous encounters with the occupant can be stored by the window control system. The glass network can integrate with the BMS as well as the occupant sensor networks (e.g., Nest, Hue, SmartThings, as well as activity networks, e.g., IFTTT) and has a cloud-based intelligent rule engine (e.g., a glass IFTTT rule engine) for determining the right ambience parameters as well as actions and timing based on the occupant's activity.

Figure 12A:
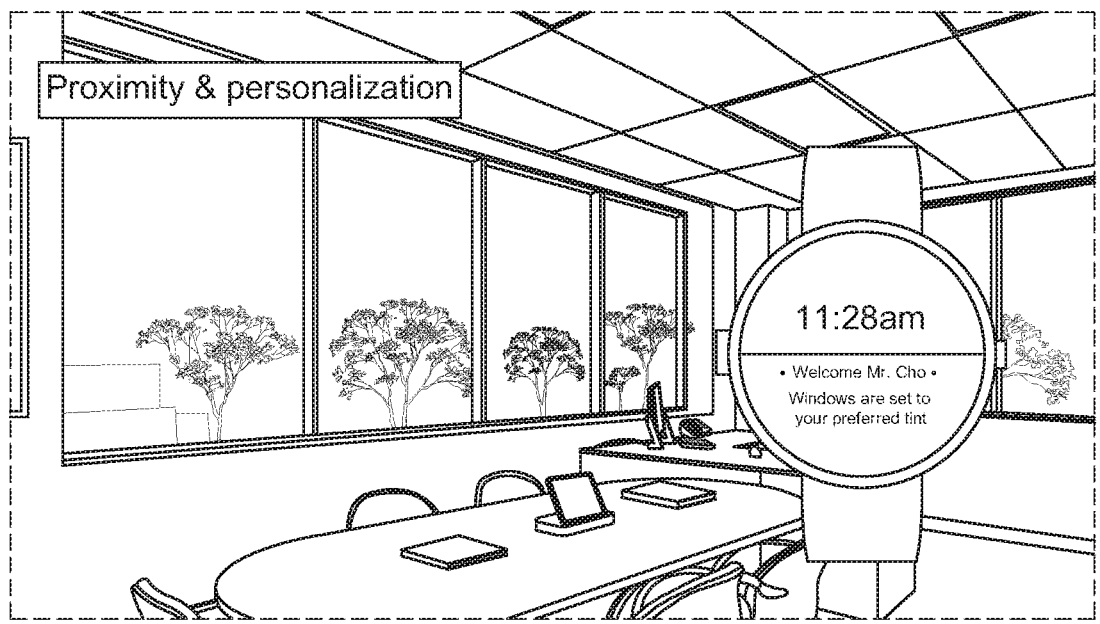
FIGS. 12a-12c illustrate example graphical user interfaces used in conjunction with proximity and personalization services implements on optically switchable windows.
Figure 12B:
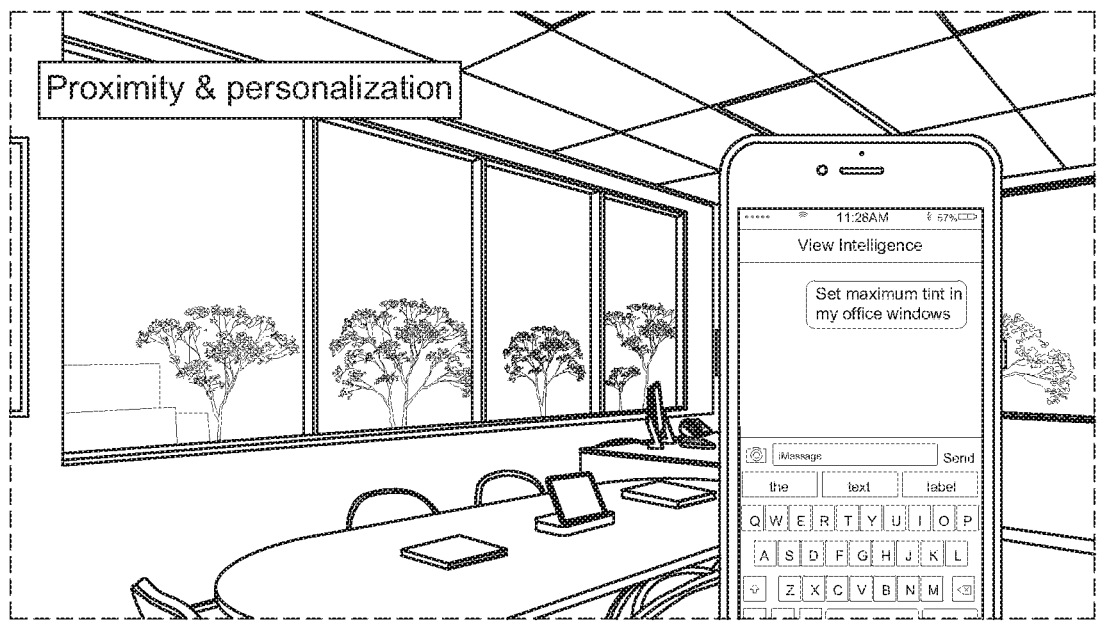
Figure 12C:
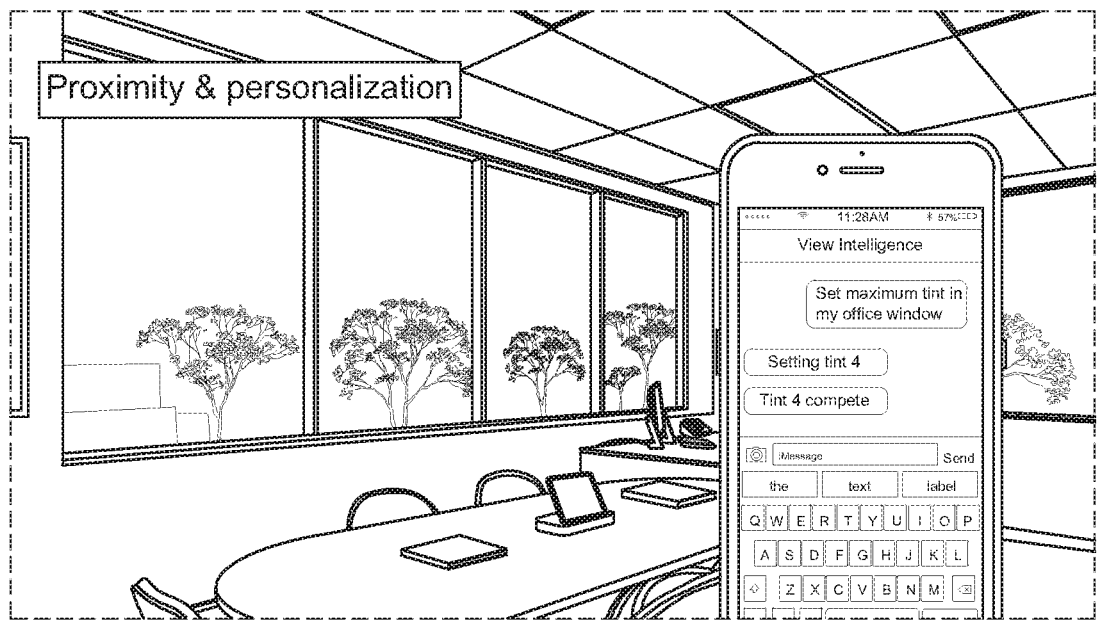

The glass provides a personalized communication channel across natural language voice commands and messaging bots (e.g., text messages, instant messaging, chat, email and the like) to get information about the ambient environment as well as set the ambient environment to the occupant's preferred settings. Full HD displays integrated into the IGUs enable these personalization channels to drive specific content on glass panel for enabling collaboration as well as communication. The glass is mapped to a building network, personal area network and IT-app context network cloud to drive seamless proximity and personalization to users. Some examples of proximity-based communication channels are illustrated in FIGS. 12a-12b.

Figure 13:
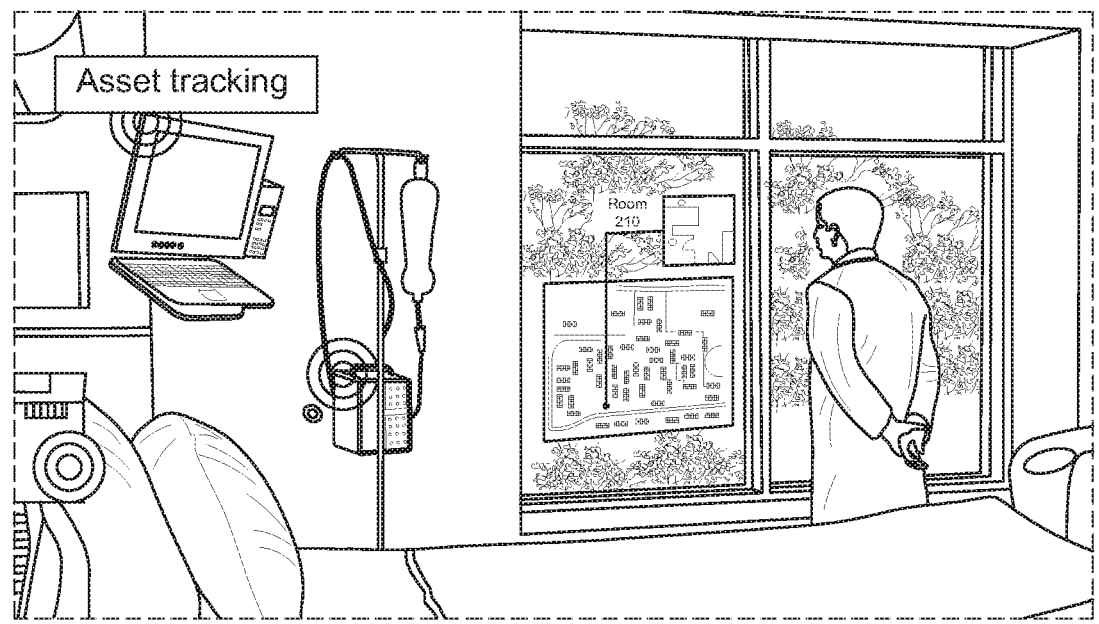
FIG. 13 illustrates a window with a transparent display configured for asset tracking.
Figure 14A:
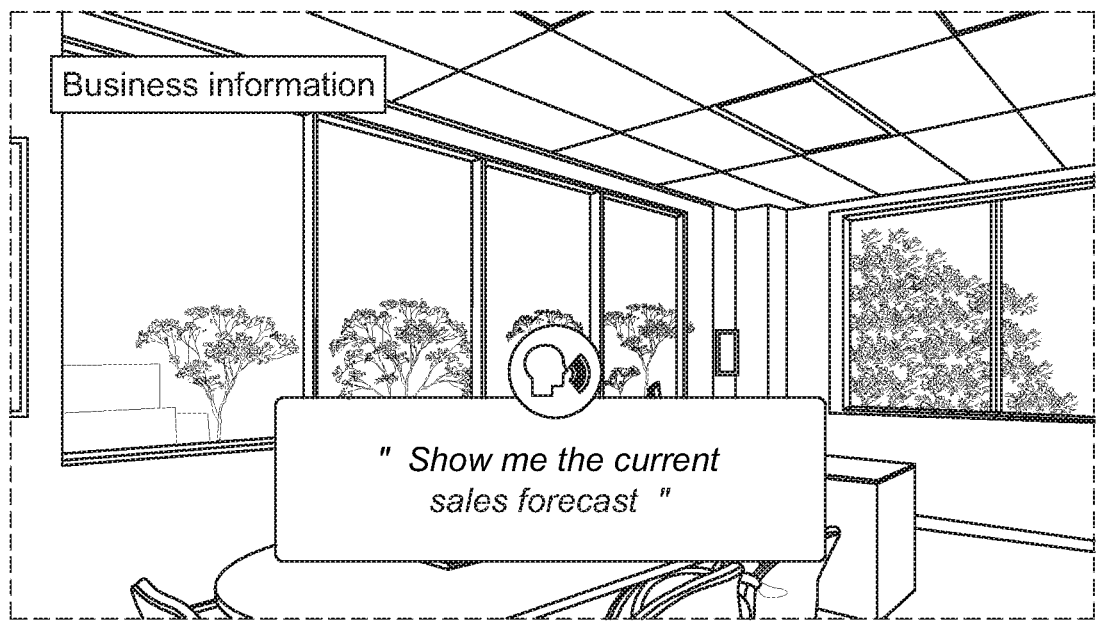
FIGS. 14a-14e depict windows with transparent displays used for business, collaboration, video conferencing, and entertainment purposes.
Figure 14B:
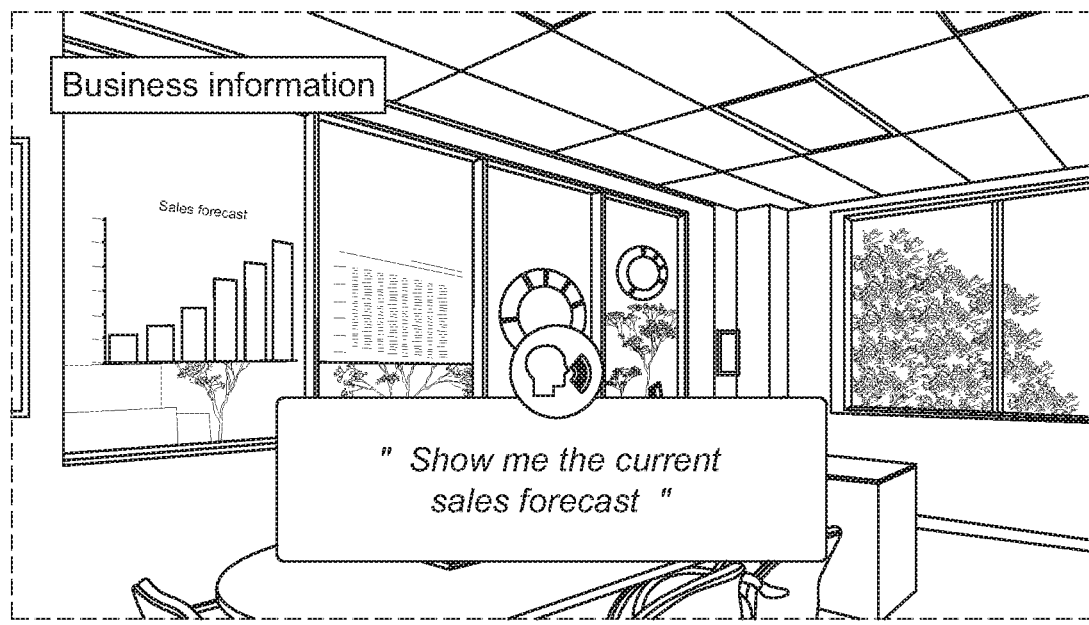
Figure 14C:
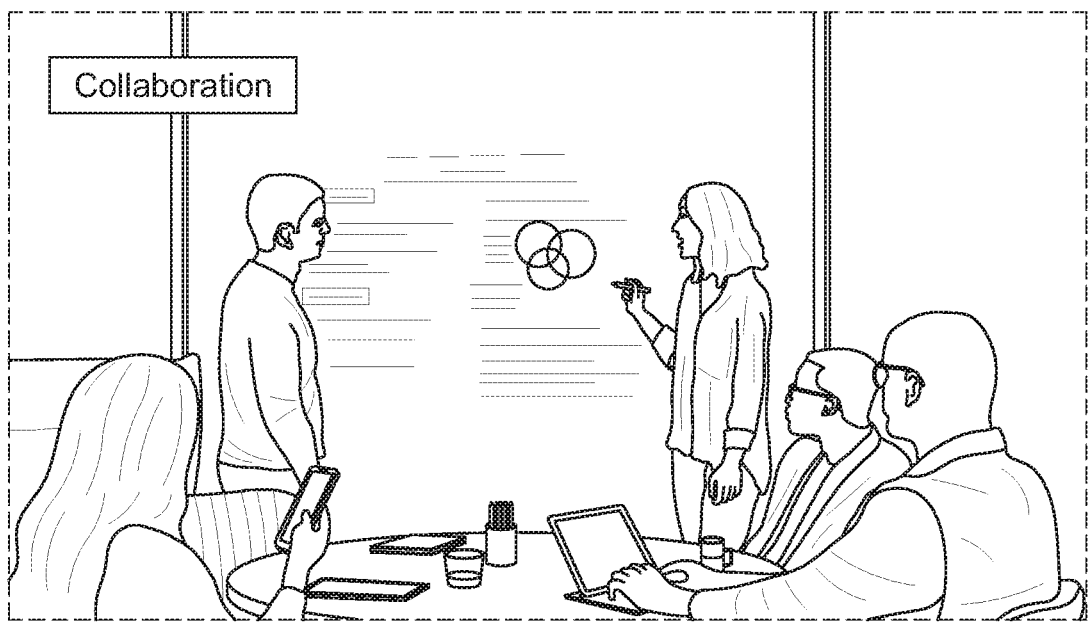
Figure 14D:
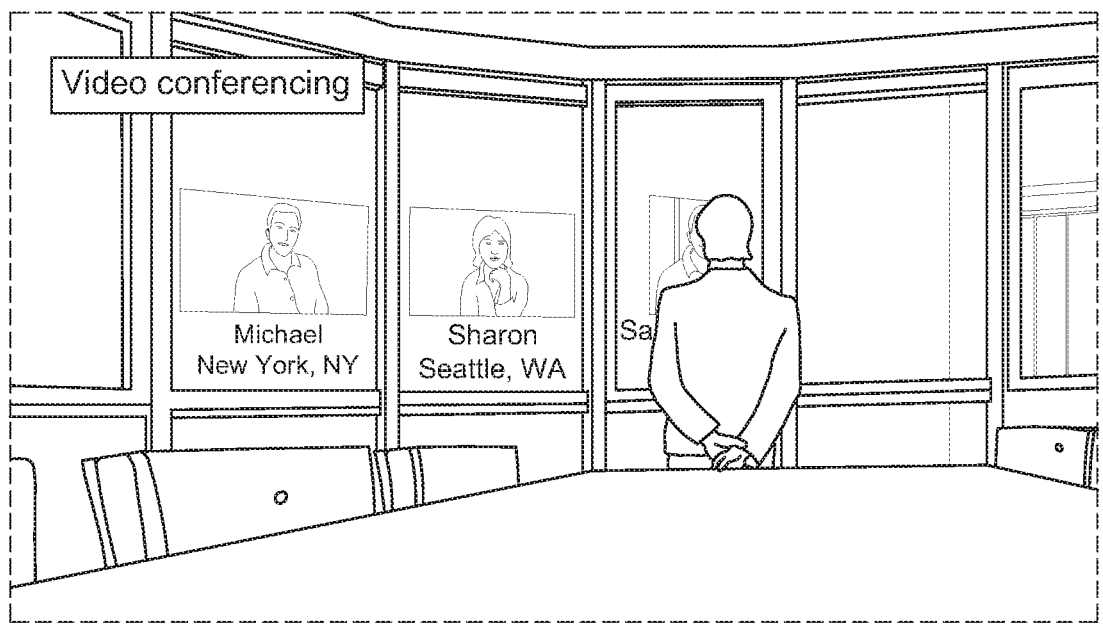
Figure 14E:
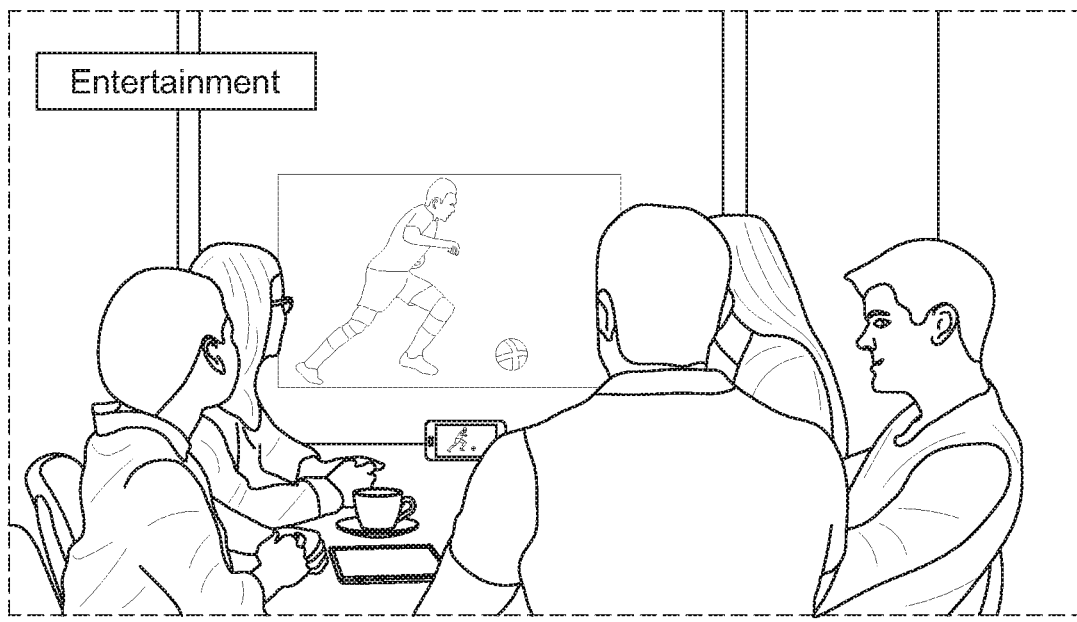

In another case, in a hospital setting, the glass can be programmed with a patient's care plan data. This is illustrated in FIG. 13. That along with sunlight information allows the glass to set the appropriate tint level of the glass, with or without augmentation by the transparent display component and/or interior lighting and HVAC, to create an ambient environment that is best suited for the patient's recovery. Moreover, the glass can change the ambient environment based on the visiting doctor's preferences, or a balance between what the doctor prefers and the patient needs. The doctor's visit may be scheduled, and thus the glass can make changes in anticipation of the doctor's visit or nurse's visit. The transparent display can be used by the medical practitioner to bring up the patient's medical records, order a prescription medication, confer with a colleague via video conference, display x-rays, play a pre-recorded presentation or tutorial for the patient, etc. The doctor may also use the glass to find and/or track assets, such as a crash cart or other medical supplies needed for the patient. The doctor may also use the glass to find a colleague, set up a meeting with the colleague or call the colleague to the patient's room for a consultation. In another example, the doctor may arrive at the patient's intended room before the patent and use the glass to identify where the patient is. For example, it may be the case that the patient has not left surgery, has been taken to the x-ray facility or for physical therapy, is in the lobby with family, or is in the nursery visiting their newborn baby. The doctor may use the glass to call the patient back to the room, or simply wish them well.

In another example, in an office setting, a meeting schedule may allow the glass to control the ambient in a meeting room, including appropriate light and heat levels, considering occupant's personal preferences as well as taking into account how many occupants will attend the meeting, if there will be a presentation, etc. The glass may automatically order lunch for the attendees based on their preferences (e.g., based on other apps that the glass interacts within the cloud) such as favorite foods, local restaurants, known food allergies, etc. Moreover, the glass may also automatically block telecommunications into and from the meeting room if the meeting is about highly sensitive matters. The glass can obviate the need for projectors and screens in the meeting room. The glass itself can be used as the presentation medium for displaying slide presentations, video conferencing, whiteboard functions having read/write capabilities and the like. In this latter function, using HD displays and high-speed communication protocols, the notes written on the glass can be simultaneously transferred to attendees personal computing devices, whether in the meeting room or remotely situated. The transparent display may, e.g., be enabled for a wide spectrum of colors for such note-taking. As seen from these examples, the glass becomes part of a "digital skin" of a building, serving as an environmental shield, a telecommunications hub, a productivity enhancement, etc. Some examples of transparent displays being used for business, collaboration, video conferencing, and entertainment are shown in FIGS. 14a-14e

In another example, the glass can interact with other systems such as IBM Watson. In some cases, the window control system can use sensors for monitoring real-time building temperature or moisture data to create localized weather pattern data that can be pushed to the cloud. In some cases, this data can also aide in weather prediction, e.g., in collaboration with other buildings equipped with the glass. As illustrated in, e.g., FIGS. 14a and 14b, the glass may include a natural language translation system. Also, the glass has a cloud-to-cloud integration. This allows the transparent display to interact with an occupant's other apps, enabling collaboration and communication using a programmable rules engine. In this example, ambient light and temperature control are coordinated with the building's BMS, and buildings can interact with each other. For example, if a building on the west side of town encounters a rainstorm or cold front, this information can be communicated to a building on the east side of town, which can then adjust the HVAC and/or glass in anticipation of the storm or cold front.

Service Optimization

Glass with transparent displays are listed as a digital asset in service management systems providing full-service lifecycle management during deployment and operations phase for seamless integration of the glass' operational management. This is achieved by integrating the glass' location and identification hierarchy into existing service lifecycle management clouds like ServiceNow.

Industrial Automation

Glass equipped with a transparent display can be integrated into an industrial workflow automation cloud as an ambient control digital asset. The glass provides an interface for control and feedback into business operation workflow systems providing best ambient conditions for that workflow. For example, a tint level for an eye specialist's windows may be different than the tint level for a patient room and tint setting for an unoccupied patient room. In another example, an industrial process requires low lighting during a particular chemical processing phase due to the sensitivity of the reactants to light or heat. The tint level and/or UV blocking of the glass is adjusted to account for the sensitivity during that process flow or, e.g., in that part of the building where the flow is happening. During periods when the flow is not happening, the glass changes the ambient conditions for improved lighting or other desired conditions. In another example, the glass is typically in a dark tint in a computer server facility to reduce the heat load on the servers. If a server malfunctions, the occupant can be notified by the transparent display on the glass. The glass can display the location of the malfunctioning server to the service technician, and the system may clear the glass near the malfunctioning server to provide lighting for the technician during repairs or replacement of the server. Once the server is back online, the glass may adjust the proximate windows back to their tinted state to once again protect the servers from heat load.

Efficient Workplace

The glass in a building (e.g., in conference rooms, cafeterias, common areas, executive suites, etc.) provides a distributed network digital nodes integrated into workflow applications like email, calendaring, messaging (IM, email, text, providing policy driven ambient control for workforce as part of their workday. When an occupant moves from a first room to a second room, items displayed via a transparent display to a user on in the first room may then be displayed to the user via the glass in the second room after authenticating the user. This allows users to easily access their own digital content while moving around the building.

Glass Mesh Network

Figure 15A:
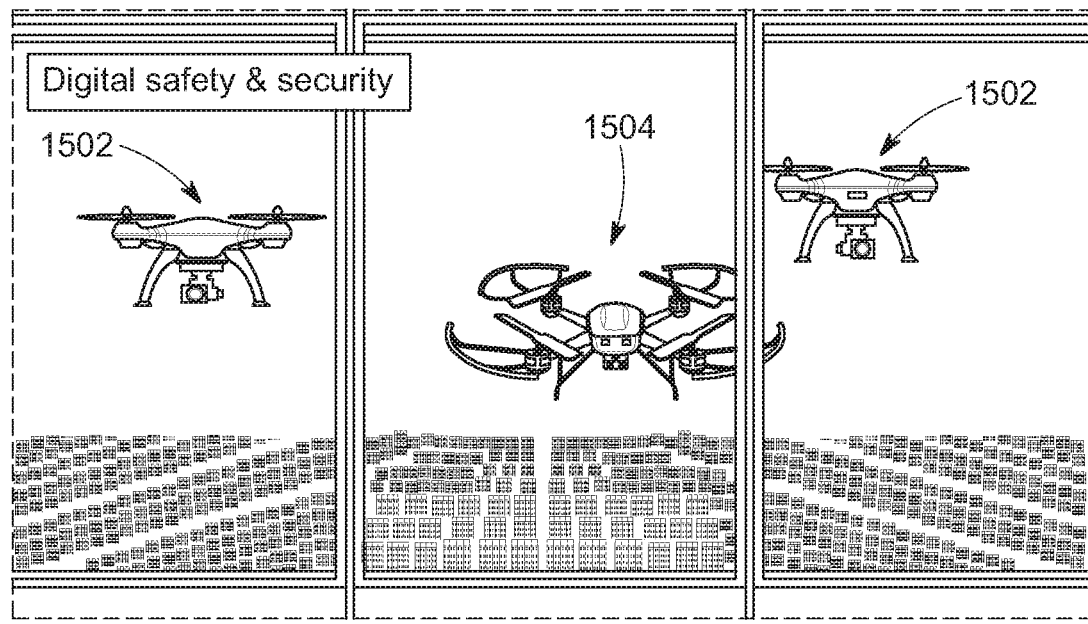
FIGS. 15a-15c illustrate a window network configured to selectively deter unauthorized drones from flying around a building via window tinting and wireless communication jamming.
Figure 15B:
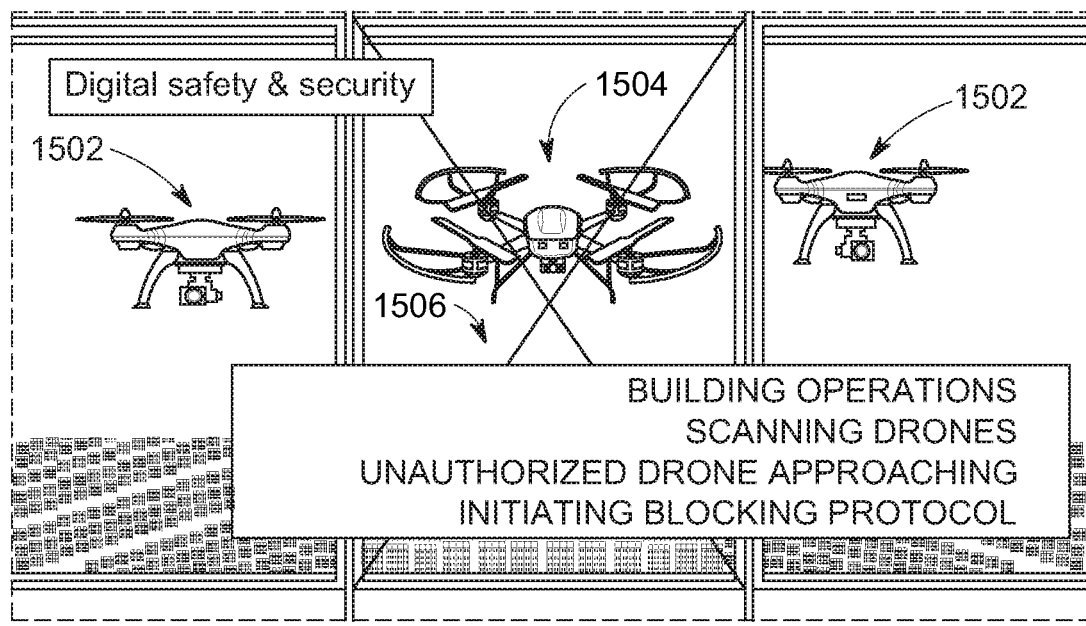
Figure 15C:
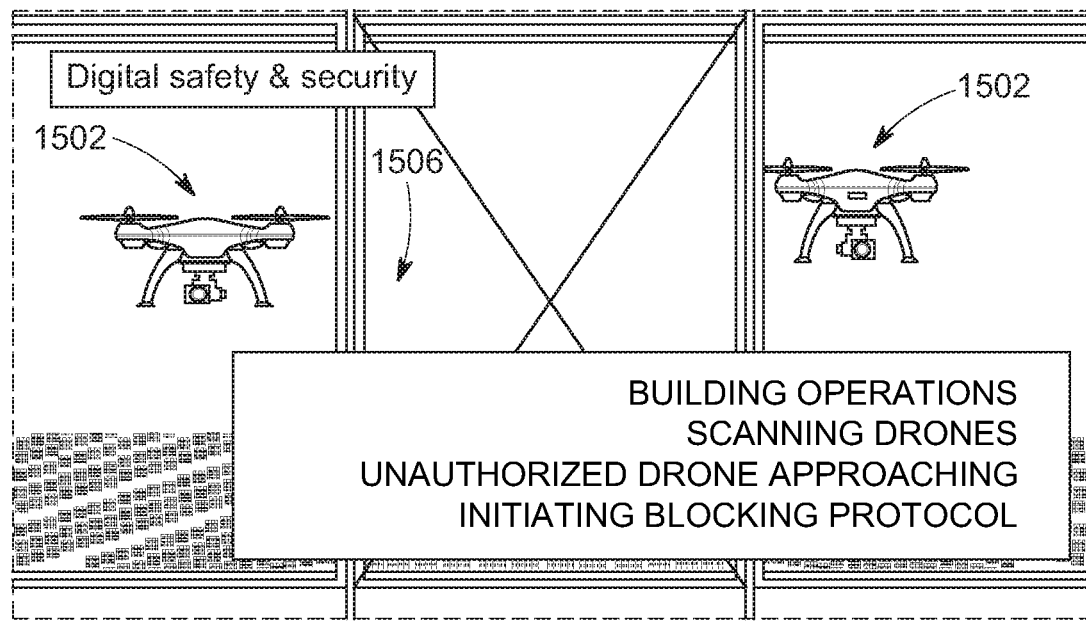

The glass surface will serve multiple functions. In one embodiment the glass acts as a power generating membrane, e.g., transparent solar cells and/or photovoltaic cells convert sunlight into electricity for powering the glass. In another example, the glass serves as an RF grid, capable of receiving and transmitting omnidirectional RF signals based on configured policies. If photon cells are used, they can store information and/or power enabling a number of embodiments (e.g., self-powered windows, and wireless communication and power distribution networks). In some cases, digital security can be enabled via transmission of high-frequency RF waves around the building skin to protect against unwanted RF signals leaving the building (and hence data leakage) to any receiver outside building as well as seizing RF communication for external RF communication driven by drones and other UAVs. The glass can also trigger the blocking action via an automated drone gun integrated into the glass or, e.g. in a rooftop sensor of the building. FIGS. 15a-15c depict an interaction between glass and friendly drones 1502 and a non-friendly drone 1504. In FIG. 15a drones 1502 and 1504 approach the glass and drone 1504 is identified as hostile. This could be, e.g., because the drone is trying to transmit signals into the building and/or take pictures of the interior of the building. As depicted in FIG. 15b, the glass 1506 can darken to block visual penetration into the building and/or it can transmit RF signals to jam the drone's operation and knock it out of the sky. This drone defeating mechanism can be done selectively, as each window may have this capability. The glass can thus remove the offending drone while leaving the friendly drones to go about their work as shown in FIG. 15c.

Figure 16A:
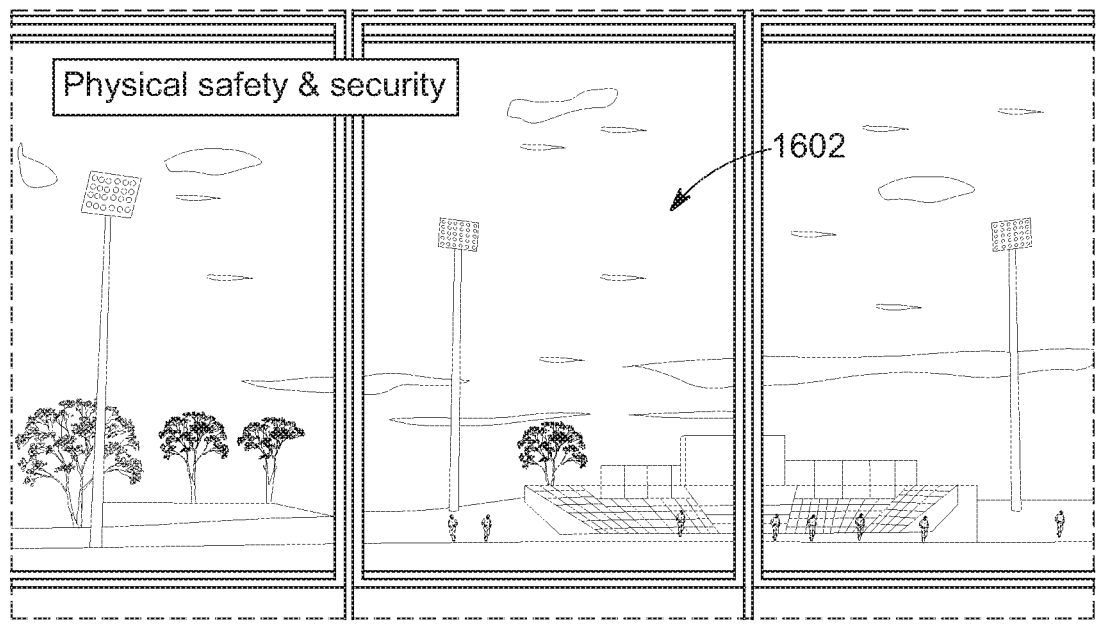
FIGS. 16a and 16b depict windows configured to detect security and/or safety threats.
Figure 16B:
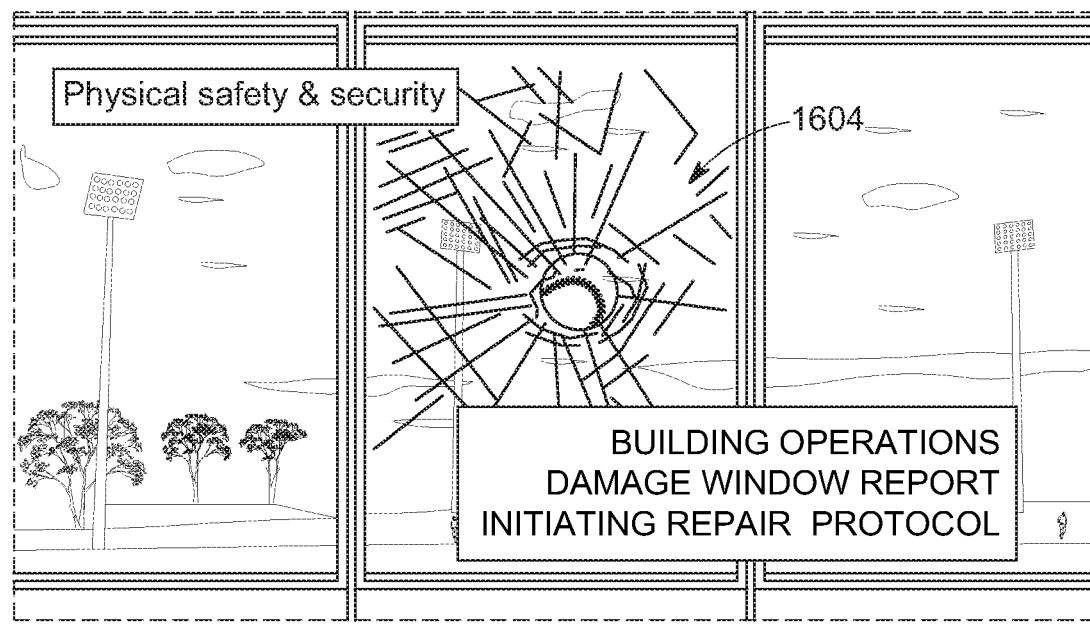

In some embodiments, the glass can also detect potential intruders outside the building. For example, at 3 am a sensor may detect one or more individuals outside a first-floor glass façade and alerts security personnel as to their presence, potentially averting an intrusion into the building. In another example, the glass automatically senses breakage and alerts a service technician that repairs are needed. This is illustrated in FIGS. 16a and 16b. In FIG. 16a an unbroken window 1602 monitors for a security or safety threat. In FIG. 16b, the now broken window 1604 is detected, and appropriate action is taken—in this case, a notification may be sent to a repair technician. Breakage may be detected by changes in current or voltage profiles of the electrochromic lite and/or the transparent display lite.

Figure 17:
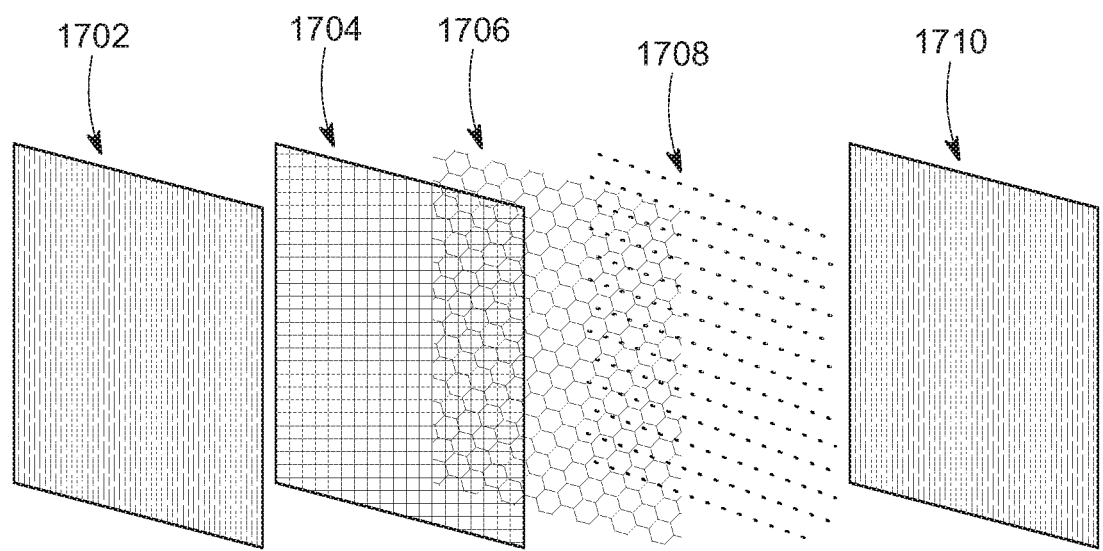
FIG. 17 depicts an exploded view of a window configured for RF communication and receiving solar power.

As described, the glass surface may serve multiple functions. In some embodiments, the glass acts as a mesh network that may be self-powered. In certain embodiments, a network of IGUs (windows) are powered by conventional wired power. In other embodiments, a network of IGUs is powered wirelessly, e.g., using RF powering. In yet other embodiments, a network of IGUs is self-powered, using PV and/or photon cells. FIG. 17 depicts an exploded view of an IGU having a first lite 1702 (e.g., having an EC device coating), a solar panel grid (PV) 1704, an RF antenna grid 1706, a grid or layer of photon cells 1708, and second lite 1710 (e.g., having a transparent display thereon). Some embodiments may not include transparent display technology. Layers 1704, 1706, and 1708 can be located on separate substrates within an IGU, or can be deposited on the interior or exterior surface of lite 1702 or lite 1710. A photon cell array or grid is used as a memory device. A network of photon cells can enable onboard control where the window controller logic circuit is configured as a transparent grid, thus allowing for "sensor glass." Thus with photon cells, a transparent grid window controller is realized. In this embodiment, the transparent grid window controller is self-powered and meshes with other windows in the network of IGUs. A transparent window controller may or may not be integrated or part of a transparent display component. In some embodiments, the photon cell grid supplies sufficient power for the control functions of the electrochromic glass, but in other embodiments, as depicted, a PV array augments the photon cell grid. The RF antenna grid, capable of receiving and transmitting omnidirectional RF signals based on configured policies, allows for communication between IGUs and meshing functions.

Radio Transmission & Receiver

Figure 18A:
FIGS. 18a and 18b illustrate how windows can be configured to provide or block RF communication.
Figure 18B:
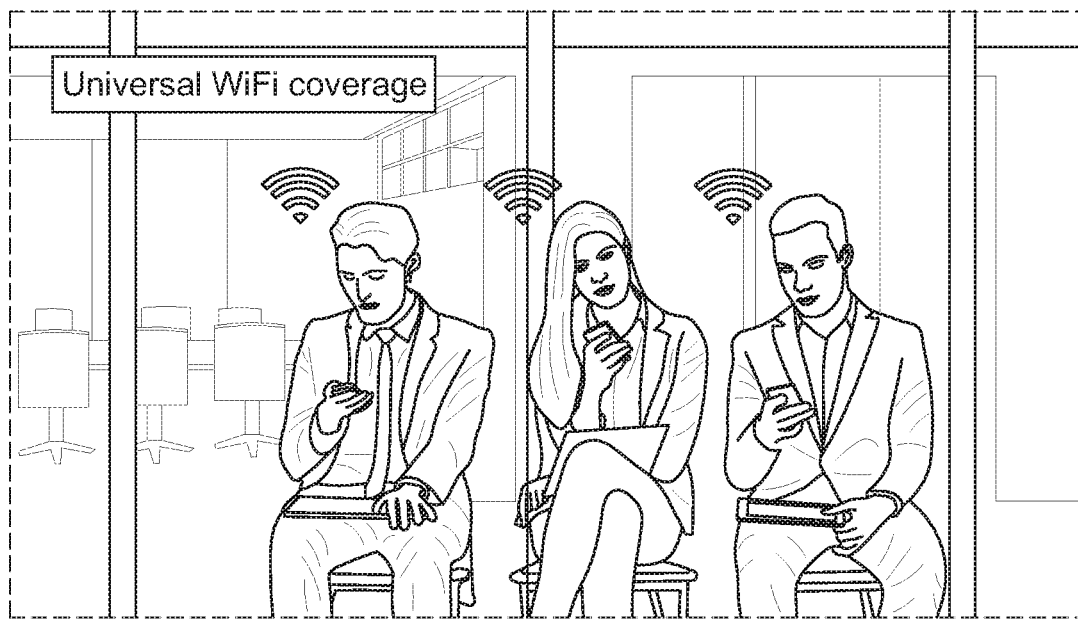

Policy and event-driven firewalling allowing and blocking of RF signals between exterior and internal building environments. For example, the glass can provide a full GSM, Wi-Fi spectrum coverage for building occupants. Blocking internal Wi-Fi network coverage outside the building. This is illustrated in FIGS. 18a and 18b. In FIG. 18a the windows of a building are used to block devices located outside the building from being able to connect to the buildings Wi-Fi network. In FIG. 18b, the glass of a building is used to provide a wireless network within a building.

The table provided in FIG. 19 shows a number of configurations where an electrochromic window, with or without transparent display technology, can serve as a signal blocking device and/or transmitter, e.g., a wireless communication repeater that optionally can also block signals from entering the interior of a building with IGUs so configured. The asterisk in the table indicates alternative positions for a ground plane.

Figure 20:
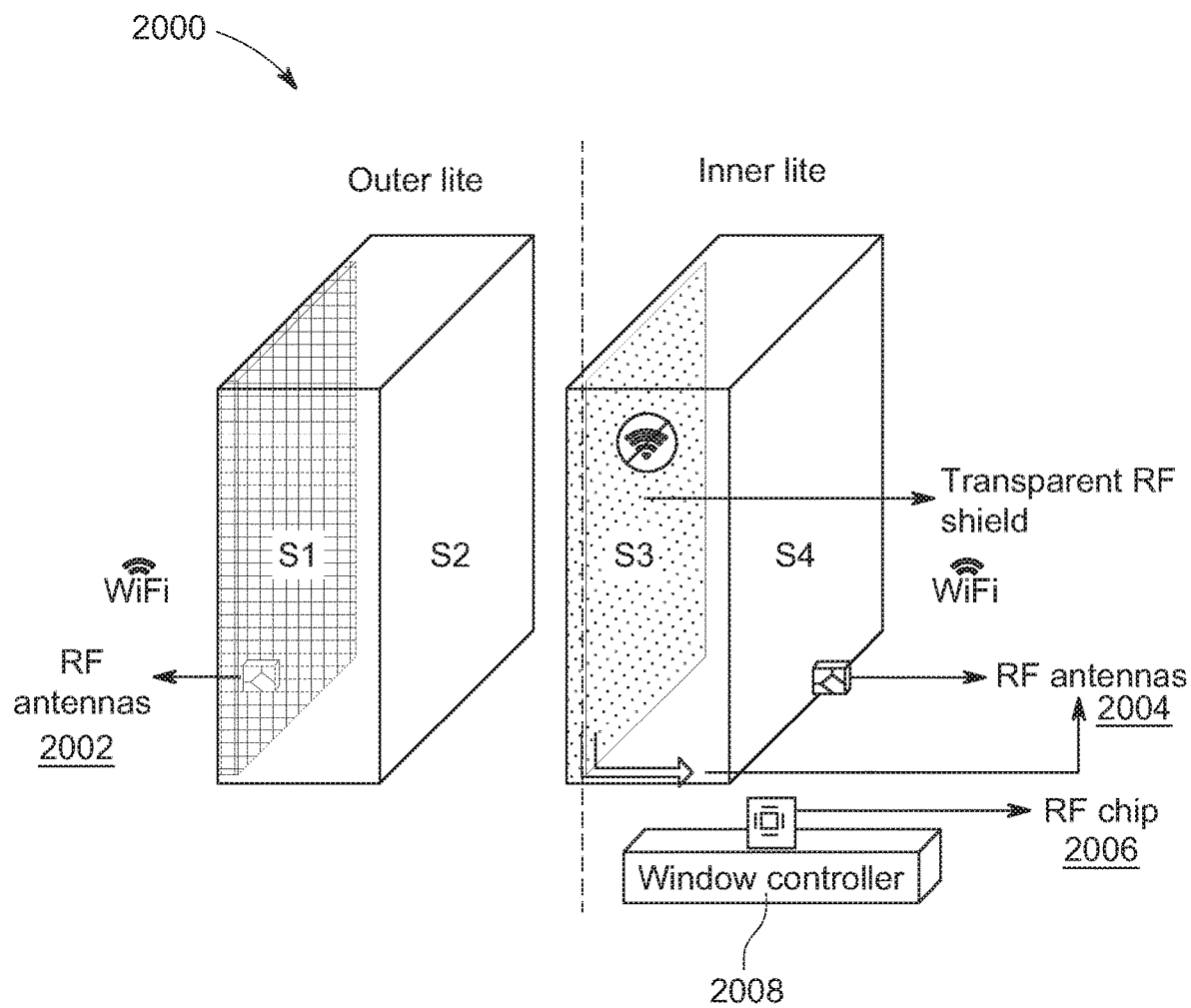
FIG. 20 illustrates a window that acts as Wi-Fi passive signal blocking apparatus as well as a Wi-Fi repeater.

FIG. 20 depicts an electrochromic IGU 2000 (or laminate) that may act as a Wi-Fi passive signal blocking apparatus as well as a repeater Surface 2 of the IGU 2000 has an EC device coating thereon (not shown). Selective exterior and interior radiating antennas (2002 and 2004) are patterned on S1 and S4, with a Wi-Fi signal processing RF chip 2006 as part of the window controller 2008. Surface 3 has a transparent RF shield (e.g., a ground plane that can be selectively grounded by the window controller). Therefore, this configuration can transmit and receive Wi-Fi communications and block incoming communications if desired.

In certain embodiments, the EC window controller also serves as an RF spectrum master configurator, i.e., controlling incoming and outgoing RF communications as well as meshing functions with other IGU controllers and/or network and master controllers. Antennas may be etched on transparent conductive coatings on one or more of the IGU's glass surfaces. For example, omnidirectional antenna(s) etched on S1 for exterior network coverage to transmit internally into a building, omnidirectional antenna(s) etched on S4 for internal network coverage transmitted to the external environment, and/or antenna(s) in and/or on mullions (window framing) providing full 360-degree coverage around glass of 'configured' spectrum & RF networks. Monopole or other RF antenna(s) can also be used in one or more of the aforementioned configurations. Such configurations provide blocking and repeater functions and optionally for selected spectrum channels. Window antennas are further described in PCT patent application PCT/US17/31106, filed May 4, 2017, and titled "WINDOW ANTENNAS," which is herein incorporated in its entirety.

Power Transmissions to Devices

The glass' RF transmitter transmits high power beacon frames to authorized receivers providing continuous power over RF radio spectrum.

Asset Tracking

The glass' sensors detect movement of radio powered devices within the vicinity of the skin of the building providing real-time location tracking mapped to access control or location policies ensuring un-authorized detection triggers an alert for remediation. As illustrated in FIG. 13, asset tracking can be useful in situations such as helping a doctor locate a patient or medical equipment. In some cases, on-demand asset location mapping clouds, such as the Oracle IoT asset tracking cloud, will now have enhanced visibility of asset movements with—in the perimeter of the building, because the skin of the building is now digitized with the glass. Additional method and examples of asset tracking are described in PCT patent application PCT/US17/31106, filed May 4, 2017, and titled "WINDOW ANTENNAS," which has previously been incorporated by reference.

Transparent Display on Glass

A transparent light emitting diode screen can be etched on the exterior and/or interior surface of the glass powered by a remote display bus illuminating diodes for content getting served from cloud stored locally at CDN controller for smooth rendering and also providing local grid control for glass mesh network. This enables a number of capabilities for windows described herein. In some cases, transparent displays can provide on-glass tint control for the window as well as nearby zone panels, as well as ambient environment sensor readings and status of glass panel tint or other functions.

Figure 21:
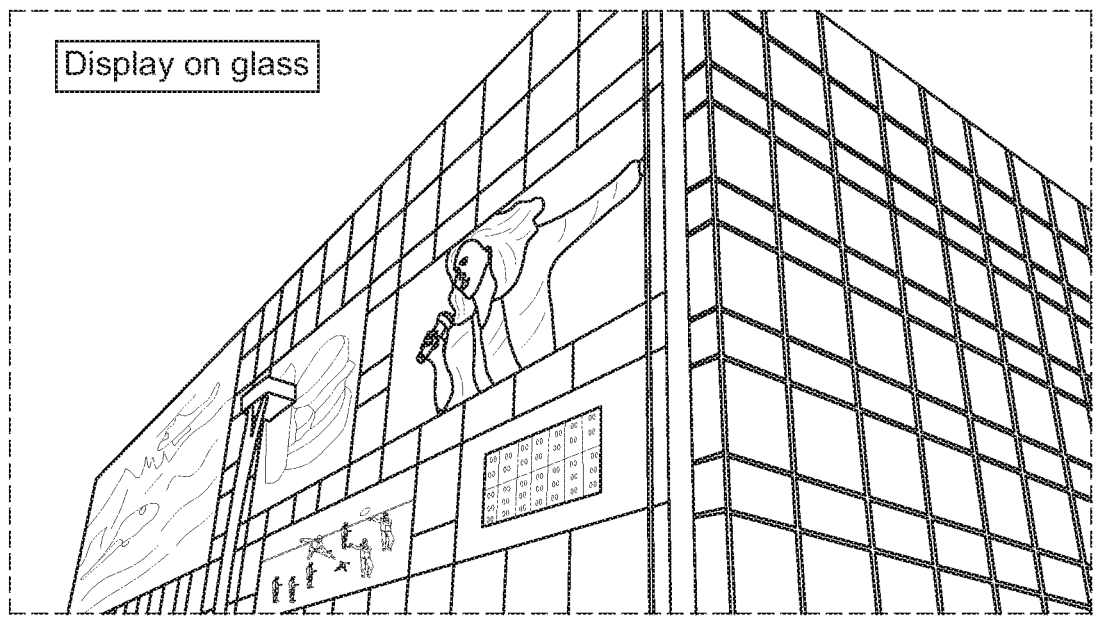
FIG. 21 depicts a building having windows with exterior facing transparent displays.

In some embodiments, external facing transparent displays, enable the exterior of the building to be converted into a building-size digital canvas. The exterior digital canvas can be used for displaying advertisements and other digital content as depicted in FIG. 21. In certain embodiments, the occupant's view of the outside is maintained even when the outside of the glass is used as a display. The occupant may also use the inside surface of the glass as a display. In some embodiments, an HD transparent display on or as the inboard lite is equipped with touch and gesture sensors or microphones for receiving user inputs—converting the surface of the glass into a digital whiteboard for impromptu ideation sessions, meetings, and other collaborative efforts. In some cases, a transparent display may be used a video conference pane, may display information from connected applications, or may provide entertainment (e.g., by pairing with and providing information from a user's personal device enabling over-the-air casting to the glass surface).

Glass Digital Twin

Programmatic representation of the glass for applications to utilize the glass as a programmable surface allows various automated workflows. In some cases, content may be auto-scaled for best rendering on the glass based on the window's tint level. For example, a dynamic content management system can determine the best pixel transparency, depth, and color contrast for the content based on the ambiance surroundings of the glass panel. If, e.g., a car is parked outside the panel and reflects sunlight on the panel, the panel will need darker tinting to provide sufficient contrast to the transparent display. In some cases, standard programming constructs can be used for modeling glass into digital systems. This may be, e.g., based on the availability of standard models within application transport protocol headers. For example, HTTP/S allows for auto-detection of glass as the edge of the digital network thereby mapping the edge to standard templated operations allowed on the glass. An example is listed below.

```
<viewglass>
    <type:standard-panel>
        <function: tint>
        <level: 1-4>
        <default-state: 1>
    <type:display-panel>
        <function: external-led>
        <content-src: URL>
        <display-resolution: UHD>
        <tint-level: 1-4>
        <brightness: 0-100>
        <transparency: 0-100>
        <default-state: display-logo>
        <surface: 1 or 4>
        <gesture: yes | no>
        <gesture-type: touch | motion>
    <sensors: yes | no>
        <type: temp | proximity | light | RF>
        <per-sensor-data-values>
</viewglass>
```

Cellular Communications

Figure 22A:
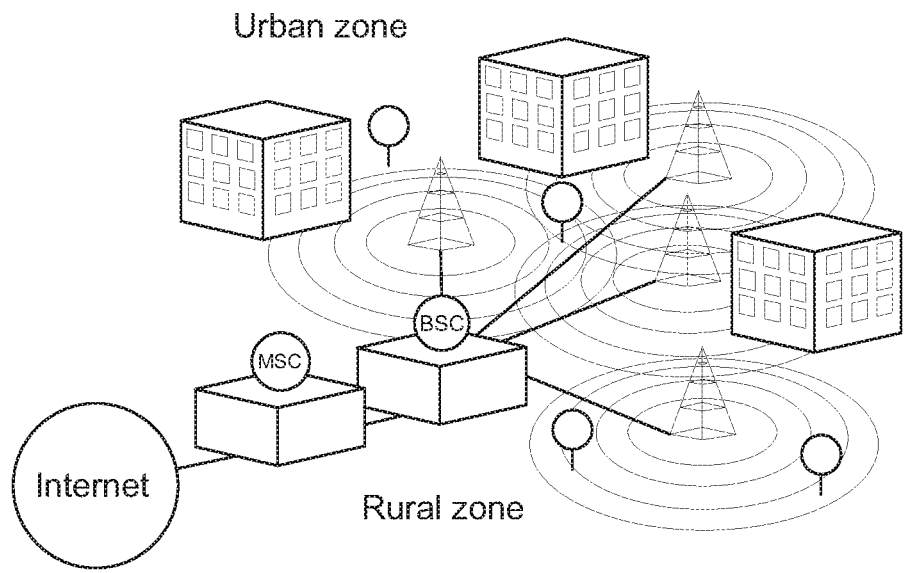
FIGS. 22a and 22b cellular infrastructures without and with the use of buildings equipped with windows for cellular communication.
Figure 22B:
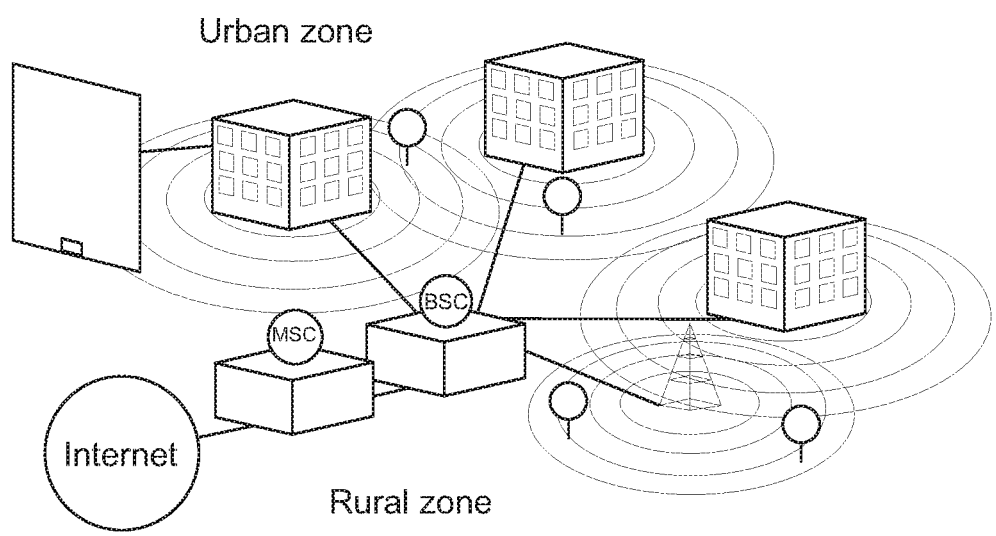

As discussed, antennas with windows allow the glass to be used as a cell repeater, making buildings into cell towers (as well as boosters for cell traffic internal to the building). This, along with 5G capabilities as described, obviates the need for obtrusive cell towers, especially in urban areas. FIG. 22a depicts current cellular infrastructure. FIG. 22b depicts an improved cellular infrastructure that makes use of buildings having windows with antennas that can replace or work in conjunction with existing cell towers. Buildings equipped with such windows have the potential to greatly expand the coverage of cellular network in dense urban areas.

Glass Cleaning and Maintenance

Sensors in or on the glass can, in some cases, detect dust level on glass and/or graffiti. In some cases, a window control system can inform a cleaning scheduling system to schedule cleaning once dust level has reached a threshold value, or when graffiti is detected. Windows described herein may have self-cleaning type coatings on the outboard lite to aid in maintaining clear views, such as titanium dioxide coatings that catalyze breakdown of organic contaminants and allow the rain to remove debris.

Glass Façade for Data Storage (Memory) and Networks

Figure 23:
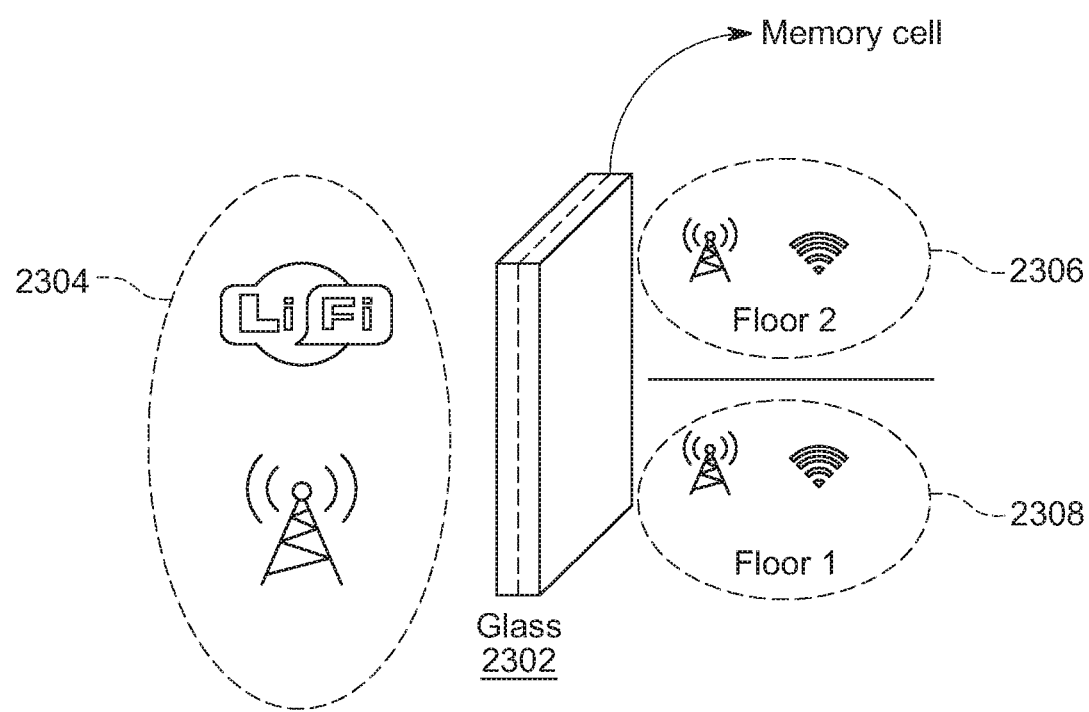
FIG. 23 depicts an optically switchable window configured as a bridge between one or more networks exterior to a building and one or more networks within a building.

Since photon cells (sometimes called photon sensors) can store energy and data, and onboard window controllers or associated network or master controllers may have significant storage and computing horsepower, the building skin, the glass itself in the former example, can be used as data storage cells. Since large buildings may have tens or hundreds of thousands of square feet of glass on the façade, this can account for significant storage and/or computational power that can be used for purposes other than tinting the windows and displaying information. For example, besides data storage for a building occupant, the glass can be used as an external network providing connectivity to the internet or forming in-building intranets (e.g., on the side of the building, floor of the building, rooms in the building, etc.). This is illustrated in FIG. 23. The glass, 2302 can act as a bridge between an ultra-high speed external network 2304 to many intra-building high-speed networks 2306 and 2308 for voice, video and data communication. Moreover, by virtue of piezoelectric elements and/or PV cells, the glass can generate energy from the wind and or solar energy and supply power to the memory and/or network transmission infrastructure. In some cases, a window controller may have a battery for storing generated energy.

Edge Platform for a Building—Building Skin as a Platform—Building Façade Platform Embodiments described herein combine the capabilities of the electrochromic windows with display glass described herein and their corresponding BOS infrastructure to deliver a single edge platform that can provide, e.g., 1) control over light and heat gain, 2) telecommunications and trafficking thereof, 3) a computing platform and network, and 4) wireless power for the building. In addition, these functions may be self-powered, e.g., using PV technology. In some embodiments, a building façade platform may also serve as a building management system platform. As seen from examples above, a network of glass can act as a "digital skin" of the building, serving as an environmental shield, a telecommunications hub, a source of wireless power, a productivity enhancement system, etc. Typically, the glass is networked together at initial installation which occurs during construction of the building. Since the edge platform is deployed with the glass, the network comes for free or at low additional cost to the building cost. Moreover, the glass of the building is typically installed early on in construction of the building as compared with other more traditional networks. Therefore a building can have the above-described functionality, e.g., a wireless internet network and telecommunications systems very early in the building construction process. This can aid in construction, e.g., by providing access to the internet and the cloud for those constructing the building, architects, developers, salespeople, marketers, and the like.

Power is delivered across the network of glass by a power distribution network of the BOS infrastructure, e.g., a trunk line power distribution system used for EC windows and sold by View, Inc. of Milpitas, Calif. For example, low voltage, such as 24V DC (however other voltages may be provided, such as 48V, or similar common power supply outputs) is provided throughout the skin of a building, since that is where smart windows are installed. In such systems, the power is provided to the glass via drop lines that connect to a trunk line in electrical communication with a control panel having one or more power supplies in communication with the building's power supply. Additionally or alternatively, the glass may have a local energy source such as a battery. The glass itself may also serve as a power generating membrane with, for example, transparent solar cells and/or photon cells to convert sunlight into electricity for powering the glass. In some cases, the power distribution network may also serve as a communication network and the trunk line can serve to deliver both power and communication information to the glass. For example, using power-line communications (PLC), both power and communications can be transmitted on a single conductor. See, e.g., IEEE 1901 and 1905. In other cases, the communication information is delivered to the network of glass via a separate communication network, e.g., a wireless communications network. An example of a communication network is described above with respect to a window controller (onboard or offboard) in communication with a node controller, which may be in communication with a master controller. The communication network can be wired, wireless, or combination thereof. The communications network may be wholly or partially co-located with the power distribution network. Window controller wireless capabilities, such as control and/or powering functions can be, for example, RF and/or IR can be used as well as Bluetooth, Wi-Fi, ZigBee, EnOcean, LiFi (Light Fidelity) and the like to send wireless power and/or wireless communications. The communications network delivers communication information to the network of glass including, for example, control signals for controlling functions of the glass such as tinting to control heat and light gain in the building. In some cases, the communications network may also receive wireless communications from a mobile device and/or a remote switch such as a wall switch or a remote control device. The building skin platform may include wireless power transmitters to deliver wireless power, e.g., to the interior of the building or surrounding areas to charge mobile devices for the occupants so that they do not need to plug in their devices to charge them.

Some of the glass in the network can include a window antenna in various configurations such as a monopole, stripline, patch, dipole, fractal, etc. Equipped with antenna, the "digital skin" of the building can act as a surrogate for a cell tower providing coverage and allowing for clearing the landscape of conventional cell towers around the building. Moreover, antenna-equipped glass can be used to boost the cell signals internal to the building and/or allow for cellular traffic unidirectional or bidirectional. The window antenna of the glass may also be in communication with the communication network to send communication information to and receive from the communication network.

The network of windows can also act as a wireless power transmission network providing access to wireless power in the building. For example, the glass may include a wireless power transmitter (e.g., RF transmitter) that broadcasts wireless power transmissions to a wireless receiver of another window or a mobile device nearby. In some cases, one or more wireless power transmitters provide wireless power to devices within a room or another area in the building. In addition to the wireless power transmitter of the glass, another remote power transmitter may also be available in the area. In one case, an RF transmitter initially receives an omnidirectional beacon signal broadcast from an RF receiver of the mobile device or window being wirelessly powered. By computing the phase of each of the incident waves of the beacon signal, the transmitter may determine the position of the receiver, thus informing the directionality of RF power transmissions. The transmitter may broadcast power along the reflection of each of the incident waves of the beacon signal or may broadcast power along optimal reflection paths, for example, of incident waves with the strongest signals received at the RF transmitter. In these cases, the transmitter may broadcast focused RF waves along a plurality of different beam paths, each of which may reflect off surfaces (e.g., walls and ceilings) before reaching a receiver, such that power may be transmitted around obstacles between the transmitter and receiver. By transmitting power along multiple pathways, the power transmitted along each pathway may further be significantly less than the total power transferred wirelessly to a receiver.

It should be understood that some embodiments of the building façade platform and/or digital skin do not include optically switchable windows. Network and/or power infrastructure installed on the building skin and/or early in the building construction process may provide many or all of the functions and/or components described above but without necessarily including optically switchable windows and their attendant window controllers. Such building façade platform or digital skin may still provide telecommunications, a computing platform and network, wired or wireless power for the building, and/or other attributes described herein. And such platform or skin may also optionally include display devices as described elsewhere herein. It may optionally include antennas on windows and/or other components of the network. And while such platform or skin need not include optically switchable windows during one phase, it may at a later phase be modified to include optically switchable windows. In some cases, the initially installed platform or skin is not configured to control optically switchable windows, but at a later phase it is configured to control such windows. As an example, one vendor provides some or all the communications and power distribution infrastructure on the building skin, and a second vendor provides optically switchable windows that attach to the infrastructure and are ultimately controlled by it. In certain embodiments, a building façade platform or digital skin may control other, non-window, building functions such as HVAC, security functions and the like.

In certain embodiments, the network infrastructure, with or without window-specific controllers is dense, having, for example, at least about 200 compute points, or at least about 500 compute points, or at least about 1,000 compute points (e.g., in a large building). This infrastructure may be employed for various functions without conventional components of building networks (e.g., no sensors hanging from ceilings). Further, the network infrastructure may be installed in a modular fashion. Modular network nodes can be upgraded over the lifespan of a building to keep the platform current, while the wiring and other central power and communications infrastructure of the system may be industrial grade and reliable for decades Examples of Windows Configured for Providing and Regulating Wireless Communication One aspect of the present disclosure relates to IGUs or other window structures that provide, facilitate, and/or regulate wireless communications within a building. These windows may include at least one window antenna used for receiving or transmitting wireless communications via any one or more of various wireless communication standards. In various embodiments, the window structures are provided in the form of an IGU, which may include one or more lites having an optically switchable device layer such as an electrochromic device layer disposed thereon.

Window antennas are controlled with a controller that may link a wireless network provided via the antennas, with a wired network such as a wired cellular service provider network or a private customer network. Examples of the structure, operation, and interconnections of window antennas are described in the PCT Patent Application PCT/US17/31106, filed May 4, 2017, and titled "Window Antennas," which is incorporated herein by reference in its entirety. While windows may be used to provide or facilitate wireless communication, windows may also be used to selectively block wireless communication when they have an electromagnetic shielding layer. Electromagnetic shielding layers may be a single layer of a transparent conducting material, e.g., indium oxide, or an electromagnetic shielding layer may have multiple sub-layers within the layer. Examples of electromagnetic shielding layers are described in PCT Patent Application PCT/US17/31106, previously incorporated by reference.

In some cases, a window may be used to both provide and block wireless communication. For example, a window may have both an electromagnetic shielding layer and a window antenna. For purposes of this discussion, when there is an electromagnetic shielding layer between an antenna in the exterior of the building, the antenna is called an "interior antenna." Conversely, when an electromagnetic shielding layer is between an antenna and the interior of the building, the antenna is called an "exterior antenna." An interior antenna may provide wireless communications within a building, and an exterior antenna may provide wireless communications on the exterior of the building. By having the ability to both block wireless transmissions through a window and send or receive wireless communications on one or both sides of the window, the window may be a communication checkpoint or gate through which wireless communications are routed.

Generally, window antennas are located on a one or more surfaces of windows of an IGU; in some cases, window antennas are placed outside the viewing area of a window, e.g., on a window frame. When there are interior and exterior window antennas, an electromagnetic shielding layer may be interposed between the two antenna layers. When a window contains an electrochromic device, the electrochromic device is generally, although not necessarily, placed on the exterior side of an interior antenna or the interior side of an exterior antenna as the electrochromic device may attenuate some forms of electromagnetic transmissions.

Figure 24:
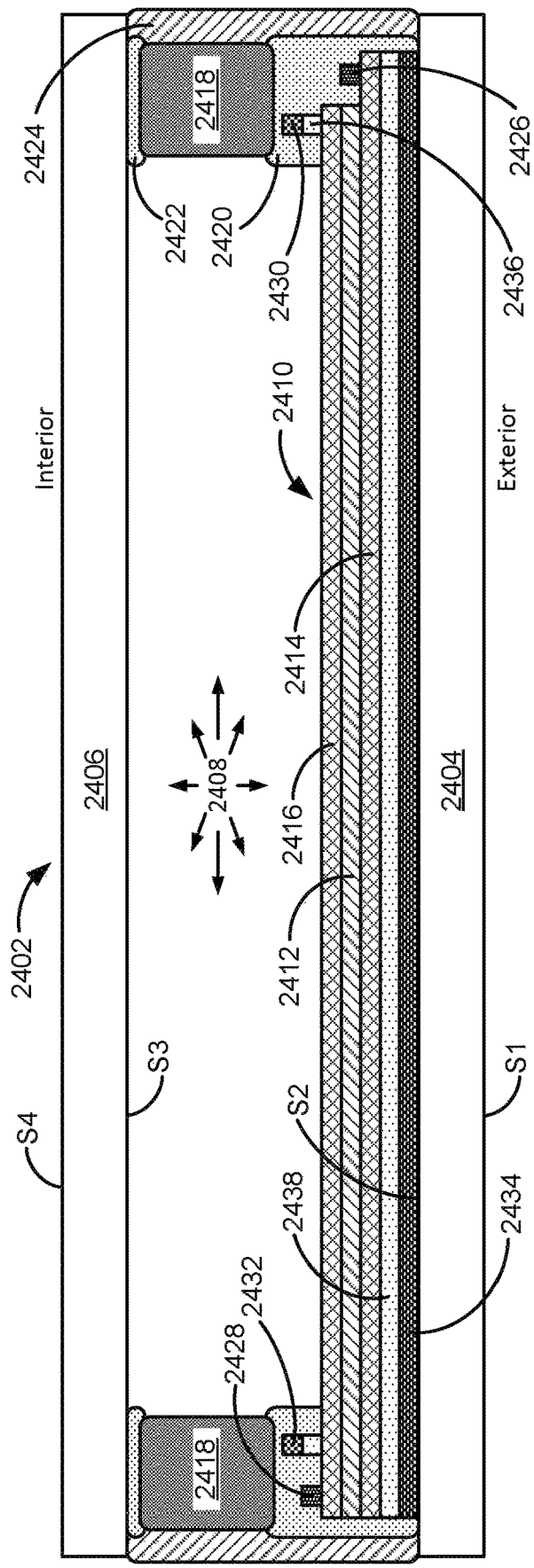
FIG. 24 depicts an IGU with an electrochromic device, an electrochromic shielding layer, and one or more antennas.

In certain embodiments, two or more of an electrochromic device, an electrochromic shielding layer, and one or more antennas are co-located on the same surface of a lite. FIG. 24 shows a cross-sectional view of IGU 2402 having this arrangement. IGU 2402 has integrated antennas capable of transmitting signals into, or receiving signals from, an interior environment according to some implementations. IGU 2402 is similar to the IGU 202 shown and described with reference to FIG. 2, except for at least the difference that IGU 2402 has first and the second antenna structures 2430 and 2432 and a ground plane 2434 (which may act as an electromagnetic shielding layer) which is separated from TCO layer 2414 of the electrochromic device stack by a dielectric or other insulating material layer 2438. To electrically insulate the first and the second antenna structures 2430 and 2432 from TCO layer 2416, a dielectric or other insulating material layer 2436 is used as an insulating layer. Additional arrangements of antennas, EMI shielding layers, and EC devices within IGUs are further described in PCT Patent Application PCT/US17/31106, which was previously incorporated by reference.

In certain embodiments, a service extender device is implemented on an optically switchable window. In certain embodiments, the components of such extender include: (1) outward and inward facing antennas on an IGU (or closely associated with an IGU—e.g., one of them could be an associated WC or mullion); (2) amplifiers and other components typically found in cellular extenders (sometimes called cellular boosters), but not including the antennas of the extenders; and (3) connections between the IGU antennas and the other components of the extender. There is need to use a window controller or window network infrastructure, although a window controller shell may be used to house one or more of the non-antenna components of the extender. The functions of these embodiments are generally the same as those of any cellular extender, but using IGU antenna and physical infrastructure. These embodiments may serve to extend any wireless communication service, not just cellular service.

Figure 25:
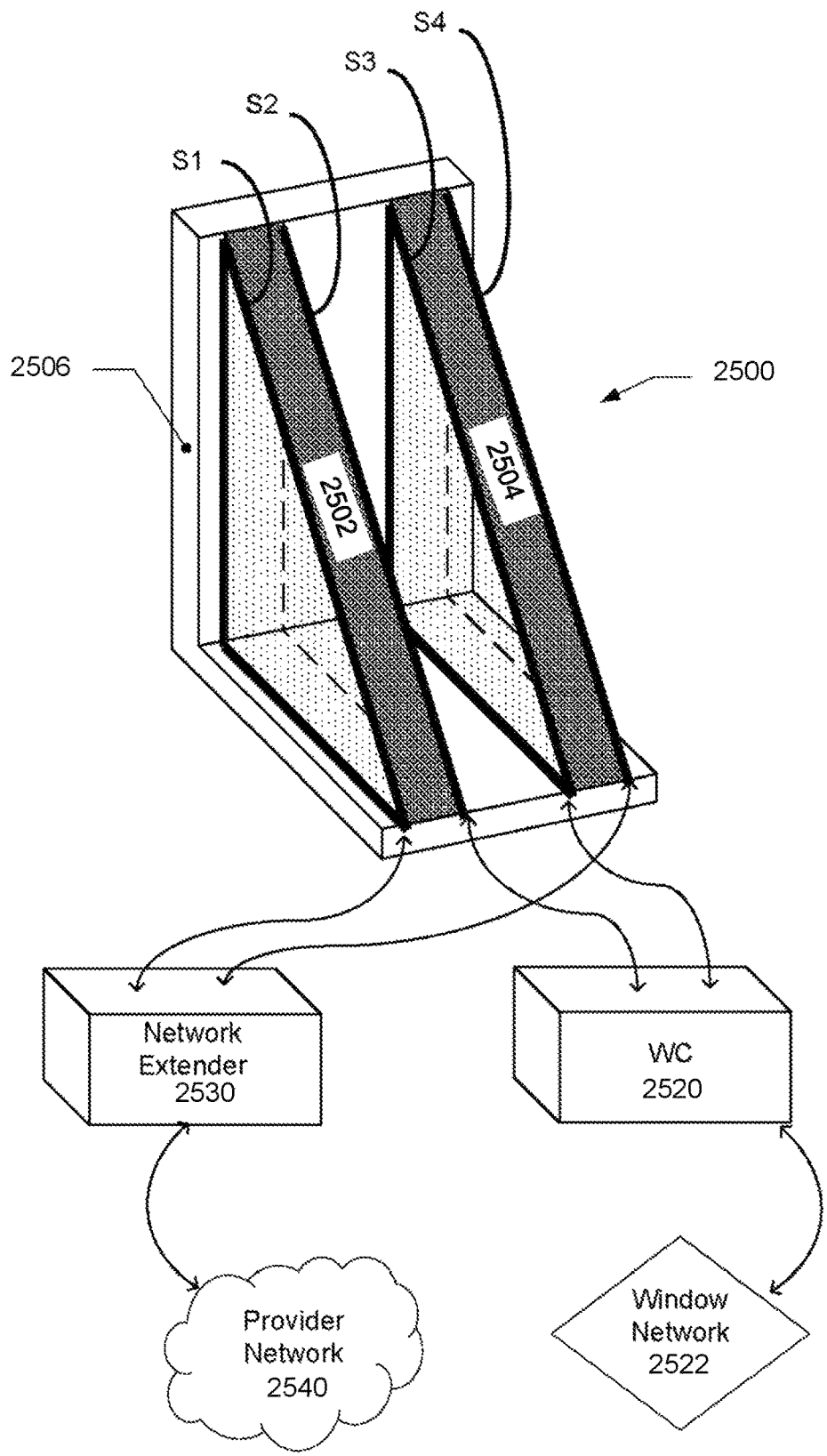
FIG. 25 depicts a section view of an IGU configured to provide, facilitate, and/or regulate wireless communication.

FIG. 25 depicts a section view of an IGU 2500 that may provide, facilitate, and/or regulate wireless communication. Generally, the structure of IGU 2500 can be any of the IGU structures described in PCT Patent Application PCT/US17/31106, previously incorporated by reference, unless stated otherwise. The IGU includes a first lite 2502 having a first surface S1 and a second surface S2, and a second lite 2504 having a first surface S3 and a second surface S4. Lites 2502 and 2504 may be held together and attached to the building via a framing structure 2506. IGU 2500 is typically installed such that S1 faces an exterior environment and S4 faces an interior environment. In IGU 2500, an electrochromic device is located on S2, and an electromagnetic shielding layer is located on S3. The electrochromic device and the shielding layer (if the shielding layer is an active layer that may be selectively turned on and off) are controlled by a window controller 2520 which may receive instructions for controlling the electrochromic device and/or the electromagnetic shielding layer from a window network 2522. S1 has an antenna and S4 may have an antenna, although in some embodiments a window may only be configured with an exterior antenna on S1 or interior antenna on S4. In alternate configurations, an interior or an exterior antenna may be located on an associated window controller or a mullion. In the depicted embodiments, interior and/or exterior antennas are attached to a network extender 2530 which may operate the interior and/or exterior antennas such that communication sent and received from the window antennas is transmitted through a larger network, e.g., a cellular network or a Wi-Fi network. When cellular communication is provided, network extender 2530 may have antennas and other components found in cellular extenders or cellular boosters that may be purchased from cellular providers such as Verizon and AT&T. In some cases, and IGU may be manufactured with a connection port (e.g. in the window frame), through which a network extender may be electrically connected to a window antenna. In some cases, a port for connecting a network extender to a window antenna may be located on a window controller or an enclosure for a window controller allowing for easy access for configuring a wireless network.

While the service extender embodiments need not require any infrastructure of a window network, other embodiments such as those exemplified in FIGS. 26a-26d may utilize at least some components of such infrastructure. For example, they may use portions of a window communications network such as described in PCT Patent Application PCT/US17/31106, previously incorporated by reference, and/or a window controller such as described in the PCT Patent Application PCT/US17/31106.

Certain embodiments employ an outward facing antenna used together with a window controller and window network. See for example FIG. 26a. Among the components that may be used with such embodiments are (1) outward facing antenna (with or without a corresponding inward facing antenna) associated with the IGU, (2) an RF shield in the IGU (optional in some embodiments); (3) a window controller associated with IGU and connected to the outward facing antenna; (4) a window network connected to the window controller; (5) a customer or third party communications service interface, which connects to the window network; and (6) logic for selectively allowing and blocking communications based on information about the communication and/or the user issuing such communications such as communications control logic described below. In some implementations, the system need not employ the window network, in which cases the window controller would need to be configured to interface directly with the customer or third party communications service interface. The window controller or an associated component with have a radio module or transceiver for receiving signals from and/or sending signals to the antenna. The radio module is configured to convert between antenna signals and data contained in such signals.

Such embodiments allow building occupants to send and/or receive communications (e.g., cellular communications) to and from locations outside the building, possibly in cases where cell service is limited in the occupant's area. Such embodiments may permit a building to serve as a cell tower such as described in PCT Patent Application PCT/US17/31106, previously incorporated by reference. Such embodiments may be designed or configured to decouple a location of occupant using the service and the outward facing antenna. For example, an antenna could be located on the thirtieth floor of an office building and the occupant and her cell phone or WiFi device could be on the second floor. The customer or third party service (or in some cases the window network) has a local communications interface or hub that can reach the user on the second floor. Such embodiments also permit the building administration (or other entity controlling the window network) to limit communications based on communication type, occupant, location, etc.

Certain related embodiments employ an inward facing antenna used together with a window controller and window network. See for example FIG. 26b. Among the components that may be used with such embodiments are (1) the inward facing antenna (with or without a corresponding outward facing antenna) associated with the IGU, (2) an RF shield in the IGU (optional in some embodiments); (3) a window controller associated with IGU and connected to the inward facing antenna; (4) a window network connected to the window controller; (5) a customer or third party communications service interface, which connects to the window network; and (6) logic for selectively allowing and blocking communications based on information about the communication and/or the user issuing such communications such as communications control logic described below. In some implementations, the system need not employ the window network, in which cases the window controller would need to be configured to interface directly with the customer or third party communications service interface. The window controller or an associated component with have a radio module or transceiver for receiving signals from and/or sending signals to the antenna. The radio module is configured to convert between antenna signals and data contained in such signals.

Such embodiments may permit controlled deployment of WiFi or other wireless service within the building, particularly in rooms or other regions near the window implementing the service. Such service can be selectively turned on or off by a building administrator or other entity given authority to control access to the service. With such control, the entity can give particular tenants or occupants access to the service. FIGS. 26a-26d depict additional embodiments of an IGU 2600 configured to provide, facilitate, and/or regulate wireless communication. IGU 2600 includes a first lite 2602 having a first surface S1 and a second surface S2, and a second lite 2604 having a first surface S3 and a second surface S4. Lites 2602 and 2604 may be held together and attached to the building via a framing structure 2606. IGU 2600 is typically installed such that S1 faces an exterior environment and S4 faces an interior environment. As with the embodiment depicted in FIG. 25, an electrochromic device and electromagnetic shielding layers are disposed on the interior surfaces, S2 and S3. At least the antennas, may be may be controlled by a window controller 2620 which may receive instructions for controlling the electrochromic device and/or the electromagnetic shielding layer from a window network 2622. In the embodiments depicted in FIGS. 26a-26d, window antennas are operated via radio control modules 2618 and/or 2619. Radio control modules link the window antennas to a window controller 2620 by converting digital signals to analog signals and vice versa. While depicted as separate modules from a window controller, in some cases, review modules may be integrated into a window controller. Window controller 2620 may be connected to a window network 2622 that interfaces with a provider network 2640 (e.g., a cellular network), a customer network 2642 (e.g., a local Wi-Fi network), or a third party network.

Figure 26A:
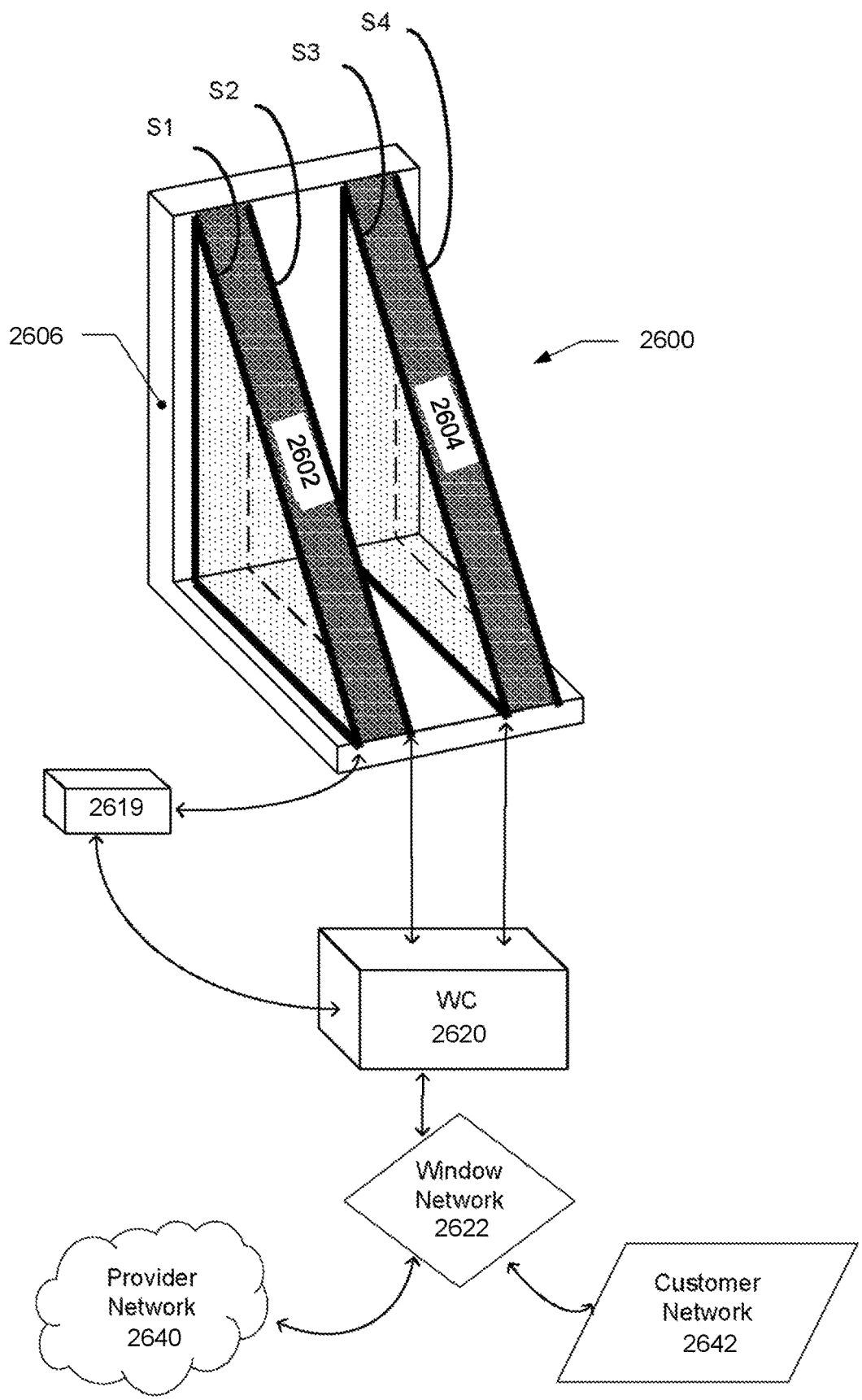
FIGS. 26a-26d depict IGUs with window antennas.
Figure 26B:
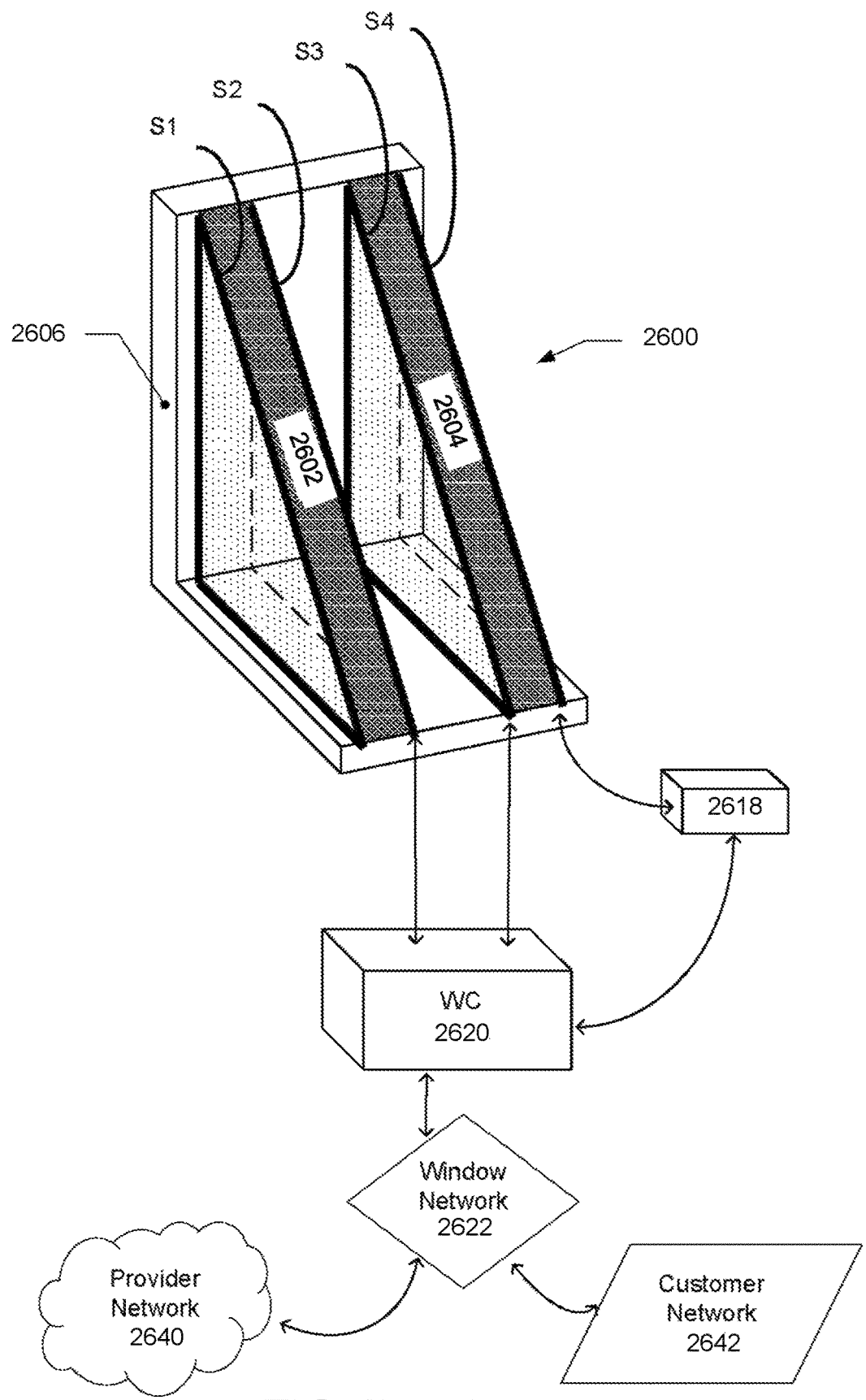

In the embodiment depicted in FIG. 26a, an exterior window antenna is located on S1 of lite 2602. This exterior antenna is operated via radio module 2619 and the communications received by the exterior antenna are passed through window controller 2620 and window network 2622 before being delivered to a provider network 2640, a customer network 2642, or a third party network. FIG. 26b depicts a similar embodiment, but instead of having an exterior antenna, IGU 2600 has an interior antenna located on S4 connected to window controller 2620 via radio module 2618.

Figure 26C:
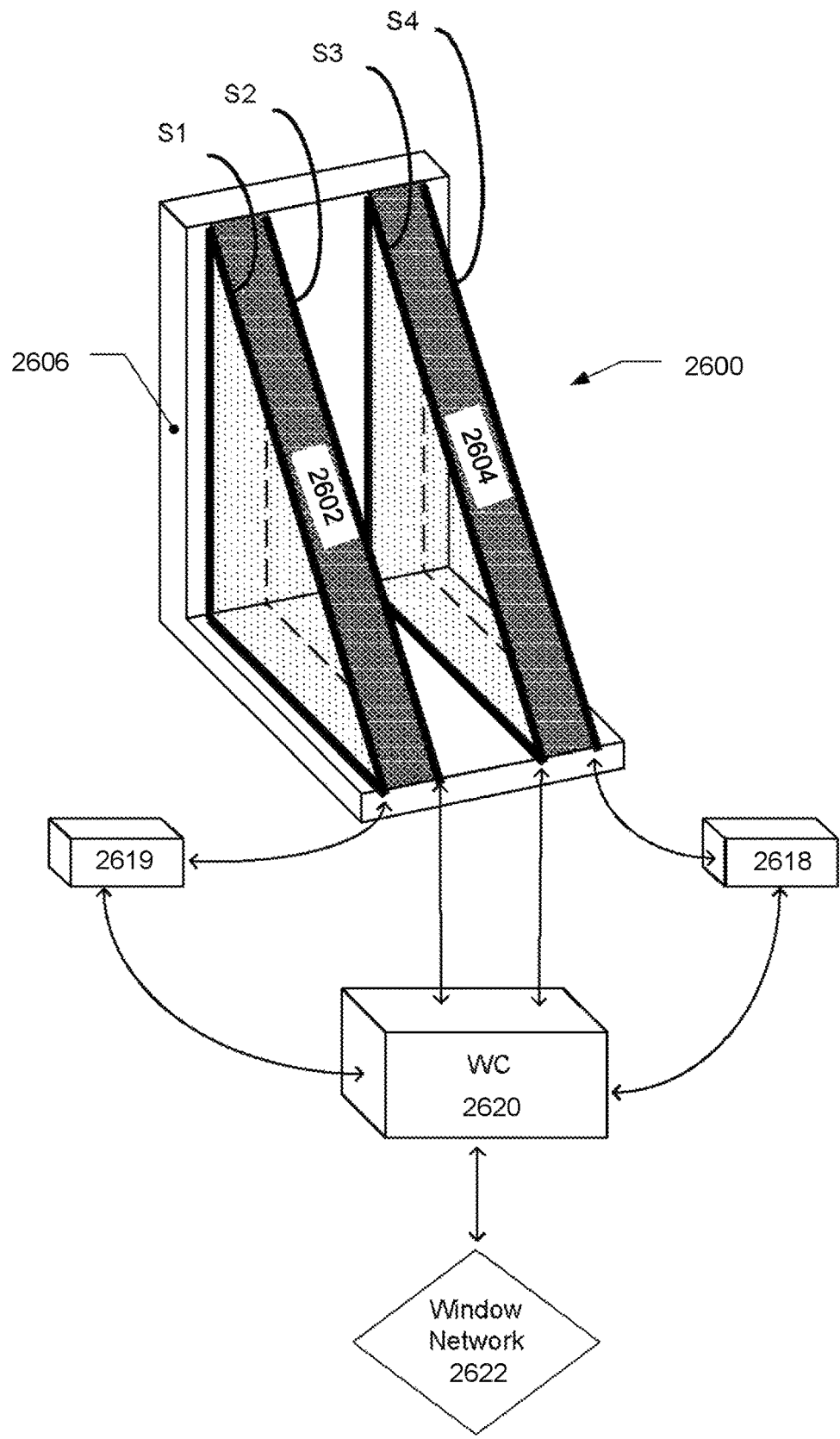

FIG. 26c depicts an IGU which has both an interior antenna located on S1 and interior antenna located on S4 of IGU 2600. A window in this configuration may act as a repeater—receiving wireless communication from an interior environment and rebroadcasting those signals to an exterior environment or vice versa. For example, the window controller itself may serve as a direct link or router between the interior and exterior-facing antennas. Of course, radio modules 2618 and 2619 are employed to convert between antenna signals and communications data, which is routed between antennas by the window controller. While a window controller is typically connected to a window network (although this is strictly required in this embodiment), the network need not be used in this case. Of course, the window controller may receive configuration parameters over the network (or via different source such as a plug-in module). Such parameters may specify communications control parameters that regulate what types of wireless communications may leave or enter a building.

Related to FIG. 26c, certain embodiments may be characterized by the following features: (1) inward and outward facing antennas associated with an IGU, (2) an RF shield in the IGU (optional in some embodiments); (3) a window controller associated with IGU and connected to both the inward and outward facing antennas (optionally with radio modules for converting between antenna signals and communications data); and (4) logic for selectively allowing and blocking communications based on information about the communication and/or the user issuing such communications such as communications control logic described below. Note that such embodiments do not necessarily require the use of customer and/or third party communications service components (e.g., an interface to a third party or customer cellular or WiFi services component).

Figure 26D:
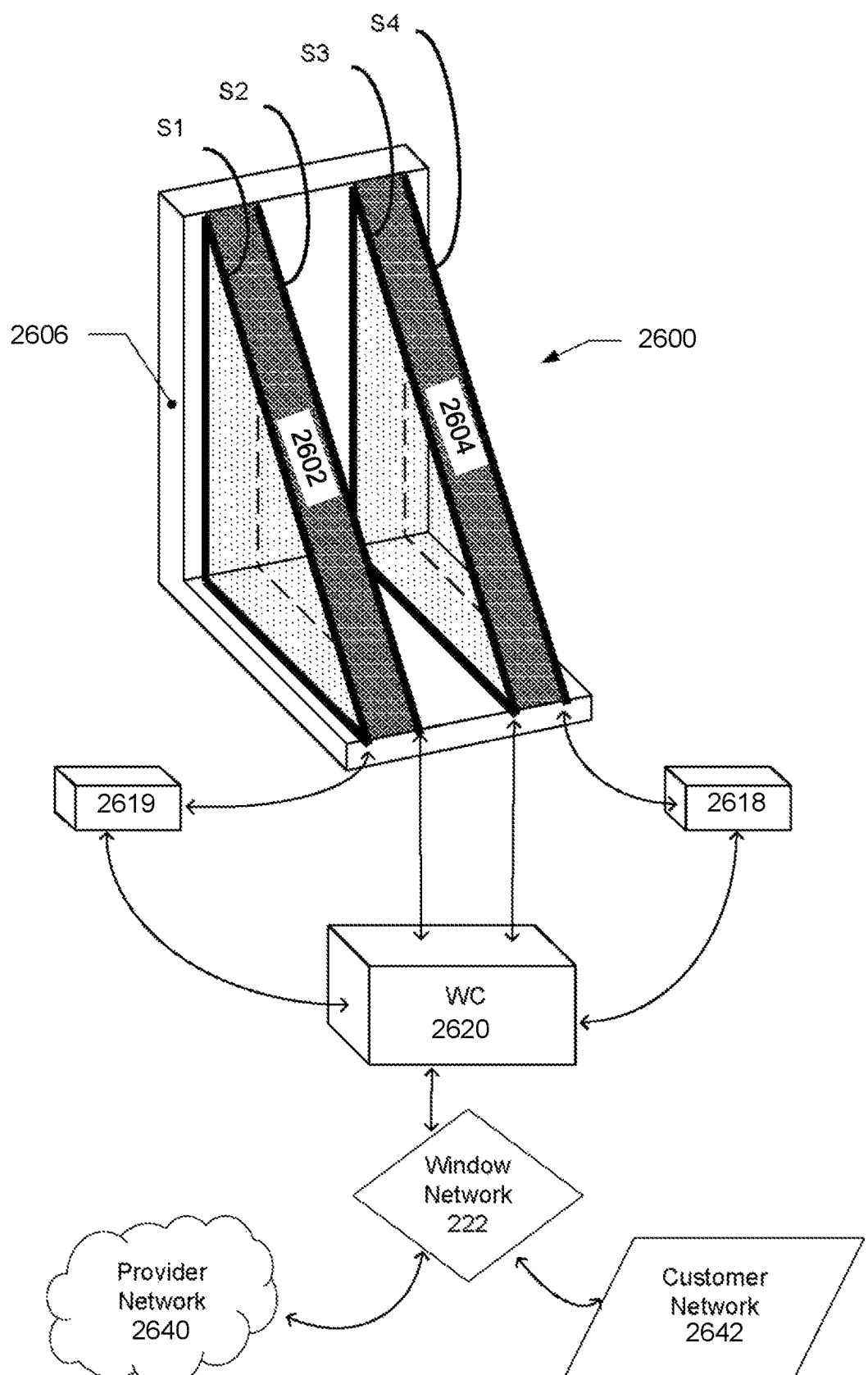

FIG. 26d depicts a similar embodiment shown in FIG. 26c, except that communications originating from or indended for a provider network 2640 (e.g., a cellular network), a customer network 2642 (e.g., a local Wi-Fi network), or a third party network may be regulated via communications control logic on IGU 2600.

In any of the embodiments described with relation to FIGS. 26a-d, communication control logic may exist on a window controller 2620 or a window network 2622 that screens and controls the incoming and/or outgoing network traffic based on predetermined security rules. For example, wireless communications may not be delivered to their intended destination if the wireless communication does not meet certain security rules. Similarly, network communications intended to be broadcast via a window antenna may be stopped if they do not meet certain rules. For example, cellular communication may be controlled by implementing rules that only allow communications corresponding to certain IMEI numbers associated with a select number of cellular devices. In some cases, security rules may regulated communication based on a source ID, destination ID, communication type (e.g., video, text, call, etc.), and other information typically contained in packet headers and other communications indicators. A user-classification may allow different degrees of communication. In some embodiments, the control is based on the location of the user in a building. For example, users in secure regions of a building may be blocked from all or some communications, while users in other locations of the building may be permitted to communicate fully. GPS, UWB, or other protocol may determine an occupant's location. Various methods of locating devices and users are described in PCT Patent Application PCT/US17/31106, previously incorporated by reference. In some cases, communications may be limited based on communication type, the permissions of an occupant, the permissions associated with a device, or the location of a device. In some cases, security rules may be established by the building administration (or another entity controlling the window network) at the time of installation. In some cases, security rules may be updated via a mobile device operated by a building administrator.

Controlling communications may be implemented such that some or all regions of a building block communications, by default, but permit communications when a known user or a known device is detected to have entered the building or a particular location in the building. Such detection may be based on GPS, UWB, or other suitable technology. Similarly, communications may be blocked until a building tenant has paid to activate the service.

Communications protocols that could be controlled/enabled using the above embodiments include but are not limited to: existing and future generations of cellular communications, Bluetooth, BLE, Wi-Fi, RF, and ultra-wide-band (UWB).

In some embodiments, a window or a window façade that is configured to provide and communication may also be configured to receive wireless power transmissions. Methods of wireless power transmission which may provide power for operation of electrochromic windows described in PCT Patent Application PCT/US17/31106, previously incorporated by reference. In some cases, a window may be configured to receive power from a photovoltaic cell associated with the window or façade.

In some embodiments, a window configured for providing and/or regulating wireless communications within a building may also have a transparent display thereon. For example, a transparent display may be placed on S1, S2, S3, or S4 of the IGU unit. A transparent display may be operated by the window controller associated with the IGU. In some cases, wireless communications received via an interior or exterior antenna may be displayed on the transparent display. For example, a user may send images or video which is received via a window antenna and then shown on the display. In some cases, communications control logic may be used to regulate which users and devices or what forms of content may displayed A building or structure outfitted with windows for regulating wireless communication allows building occupants to send and receive communications (e.g., cellular communications) to and from locations outside the building, possibly where cell service is limited in the occupant's area. In some embodiments, a wireless communication received by one window may be transmitted through window network before the wireless communication is we broadcast via another window antenna. For example, an exterior antenna could be located on the thirtieth floor of an office building, and the occupant and her cell phone or Wi-Fi device could be on the second floor. The customer or third party service (or possibly the window network) would have a local communications interface or hub that can reach the user on the second floor. This configuration may allow wireless communications to be sent and/or received from locations where the structure of the building would otherwise block wireless communication. This configuration also allows the building administration (or other entity controlling the window network) to limit communications based on communication type, occupant, location, etc.

In some embodiments, a building may be outfitted with a combination of windows having various configurations as depicted in FIGS. 26a-d. For example, the 20th floor of a building may have exterior antennas while a first floor may only be configured with an interior antenna. In some embodiments, the building may be outfitted with many windows without any antennas, but only provide electromagnetic shielding such that wireless communications may only pass through windows configured for sending and receiving wireless communications. In some embodiments, a building may have windows for providing wireless communication and the services of the window may be controlled by a building administrator. For example, a building administrator may offer cellular or Wi-Fi services to a building tenant for an additional fee.

The network of windows can also be a productivity enhancement system by providing the various capabilities described in the sections above.

Using the Window Control System for Non-Window Functions

In addition to providing window functions (e.g., EC tinting, controlling wireless communication, monitoring environmental conditions, monitoring for user input, displaying images on a display, etc.), window control systems can be leveraged for various non-window functions. For example, the window control system may be used for controlling, providing environmental data to, or power other systems in a building such as HVAC systems, security and safety systems, IT systems, lighting systems, and the like.

In certain embodiments, window control systems are used as computational platforms, alone or in conjunction with other computational resources or platforms. In this context, a window control system may be used for specific computational tasks associated with a particular application (e.g., building services) and/or it may be used for more general computing services such as being made available for purchase or lease to individuals or enterprises. Window control systems may be used as part of general-purpose computing service platform that makes use of other computational resources such server farms or other buildings with computational resources. When used together with other computational resources, a window control system may be part of a cloud computing environment. Depending on the location of computational resources in a window control system, the window control system (or computational resources contained therein) may serve as part of an edge computing platform.

As mentioned, in some embodiments, a control system may have various attributes of the described window control systems but without necessarily having optically switchable windows or mechanisms for controlling such windows. Such attributes may include early installation of the communications and power distribution infrastructure during the building construction process (e.g., before constructing interior rooms, or before installing exterior windows, or before installing IT infrastructure, etc.). In some cases, the communications and power distribution infrastructure is disposed in the building outer walls or façade, such as in mullions and/or transoms. This is sometimes referred to as the building's "envelope" or skin. Any discussion of the window control system and its associated infrastructure should be understood to include parallel embodiments in which the described infrastructure does not contain optically switchable windows and associated controllers. Of course, such smart window-free infrastructure can be later modified or built out to include optically switchable windows and mechanisms for controlling their optical states. For example, a building owner, architect or other may design or decide that a building does not need smart windows or cannot currently decide on which smart windows are best for the building's design, but does favor having a building façade computing and power platform. In such an example, the computing and power platform are installed in the building's envelope. At a later time, it is decided that smart windows are desired or a particular vendor is chosen for smart windows that were a design choice originally. The smart windows are then integrated with the computing and power platform during installation in the building façade. Building façade platforms described herein are flexible, compatible with more than one smart window system.

In various embodiments, the concept of edge computing is extended to make use of storage and/or computational resources on a building's data communication network. Such network is described elsewhere herein and includes processing and storage resources installed or otherwise deployed in the building. These resources communicate data among themselves and optionally with other entities via multiple network links operating under one or more shared network communications protocols (e.g., TCP/IP, Ethernet, power-line communications protocols, etc.). Typically, the resources include multiple processors and multiple memory devices. In various embodiments, the processing and storage resources are connected via communications lines that extend throughout the building using a window framing structure, optionally including, as described elsewhere herein, mullions. The communication lines may be coaxial cables, twisted pair conductors, and the like. In some embodiments, in addition to the communications lines, the building infrastructure includes power delivery lines that also extent, at least in part, through mullions and/or other aspects of the building's window framing structure and in exterior walls, sometimes referred to herein as part of the "skin" of a building. Conventionally, building network designs avoided wiring in window framing systems and exterior walls, but the inventors have realized powerful synergies by such configurations, e.g., early deployment of a multipurpose computational and network infrastructure during building construction.

The communications lines of the network may have a topology that includes horizontal data planes (communications network nodes are spread across a floor of the building) and/or one or more vertical data planes (communications network nodes connect network nodes on different floors of the building). In certain embodiments, the vertical data plane is implemented using high speed network links and switches that can support at least gigabit/second communications speeds, e.g., Gigabit Ethernet. In certain embodiments, some or all of a vertical data plane is provided the outer wall of façade of the building. For example, data-carrying lines are disposed in the wall or façade, e.g., at least partially within a window framing structure such as one including mullions. Wiring for network communications within a building may be supplemented or replaced by antennas and associated transceivers within the building and configured for wireless data communications.

Application of edge computing via building communications network resources may facilitate access to data and/or computer processing by building occupants or other users in the vicinity of the building. More specifically, the memory and/or processing resources on a building's communications network are made available to building occupants in a way that provides locally stored content and/or locally executing software, to thereby improve the computing performance experienced by users, at least in comparison to accessing the same or comparable resources from a remote site (e.g., a data center hosting cloud applications), which would rely on communications over the internet or other public network. Often in edge computing as applied to building communications networks, the content stored locally (e.g., data and/or software) is also stored remotely, possibly as a master or central instance. All or a portion of the content that is useful to building occupants is temporarily copied to data storage resources located within the building.

Deploying memory and processing resources of a building network in this manner may provide various benefits similar to those achieved using conventional edge computing. For example, in comparison to accessing content or software via the internet or other public network, using a building's network resources as described herein may provide improved security and performance, particularly in terms reduced latency, TCP retransmits, percentage of packets out of order, etc. Security in particular is enhanced, e.g., through the capability of communications and data processing (e.g. filtering, massaging or data analytics) locally, where sensitive information, including occupant personal information, might otherwise be transmitted via a public network such as the internet and made available outside the building, e.g., on cloud resources. For some applications in support of building services or an enterprise's business, the required speed, data volume, and/or data processing capabilities make cloud computing unrealistic. Some devices require data processing in milliseconds. Public network latency is too great. When implemented in a building's communications network, an edge computing architecture, allows complex event processing to happen locally, in devices or systems close to the user of data or a service. This may eliminates performance hits resulting from round-trips over the internet.

Conventional server facilities for buildings are e.g. housed in a "server room" which requires stringent environmental control, e.g., special HVAC capabilties to keep them cool. Further, the centralized design of a server room presents particular wiring issues due to physical constraints. The distributed computing systems described herein may alleviate these issues. In addition, local edge computing relieves bandwidth issues on public or other outside computing systems, e.g. in a large building having thousands of occupants, the demand on outside computing services is drastically reduced with a single building's edge computing platform as described herein.

There are many software applications and other services that may benefit from using a building's computing infrastructure for edge computing. In one example, video conferencing software is installed on edge computing resources in a building's network, thus affording occupants local, rather than remote, access to video conferencing software. For example, two participants in a video conference may be located in the same building (possibly on different floors or regions of the building). By executing video conferencing software on the building's computation resources, as deployed on the building's communications network, video conferencing software may deliver significantly improved performance to the occupants within the building. This may be manifest in terms of fewer unexpected disconnects, higher video and audio quality, etc.

In other cases, a particular business or other enterprise may have two or more offices at distant locations, e.g., one in California and the other in Mississippi. These two locations may be connected by a private network connection (e.g., a dedicated copper or optical fiber line) having a guaranteed level of service, and in some cases supporting the enterprise's data intranet. While such connection can potentially facilitate high performance data communications, that benefit may go unrealized when accessing cloud based resources hosted on remote sites. For example, if employees at the two sites wish to participate in a video conference but they must use remotely hosted video conferencing software, they may experience a poor quality conference. However, if one or both of these offices has a communication network that can execute a locally deployed version of a video conferencing application, the video conference quality can be greatly enhanced. The local execution coupled with the fact that the two offices are connected by a private connection having guaranteed service, typically ensures that the videoconference performance is superior to what it would be if the videoconferencing application was accessed over a public network at a site outside the two offices.

Another class of edge computing applications for networked building computational resources involves local caching or storing of copies of content or other data from a remote source. A building's data processing and storage infrastructure is used to locally cache or store frequently used portions of data from a large data store maintained at a location distant from the building where the data is used.

For example, a large institution may store a large quantity of data, e.g. terabytes of data, in a central location, but must make that data available to multiple branch offices at remote locations throughout the country or internationally. Those branch locations may not need to regularly access all of the data in the large central data repository. However, they may need frequent access to only a small subset of the data. For example, the financial institution may be headquartered in New York City, where it stores all of its data in the large data repository, while it has a branch office in Salt Lake City, where the employees of the branch office work in a single building or campus having computational resources that can serve as a basis for edge computing. The employees Salt Lake City branch may be able to access information relevant to their responsibilities via edge computing if information related to the Salt Lake City metropolitan area is locally stored or cached at the building or campus where the Salt Lake City employees work. For example, only those data records stored at the central office in New York City that pertain to employees or clients in the greater Salt Lake City metropolitan area are locally stored in the building network infrastructure at Salt Lake City. With the data subset stored locally, and directly accessible via the building's computational network, the Salt Lake City employees can routinely and repeatedly access it with relatively little performance hit.

After a copy of the local data subset is stored in the local building network infrastructure, certain records may change incrementally in the central repository. Such changes may be propagated periodically to the data subset at a local office, in some cases automatically without action by workers instigating such an update. Database management software may be employed for this purpose.

Yet another application of edge computing via building network resources addresses challenges encountered by periodically deploying software patches or updates from central locations over public networks. To improve the ease with which such patches or updates are installed on multiple users' computers (e.g., computers of occupants of a building deploying edge computing) or other computational devices in a building, a single copy of a patch or upgrade may be temporarily stored on the building's network infrastructure. Subsequently, the patch or upgrade is applied to a number of computers in the building over a short network distance without being subject to the latency or other challenges sometimes encountered when transmitting such patch or upgrade over the internet.

In one example, the vendor of a suite of office software applications routinely propagates patches and updates to its software to end user computers over the internet. In a case where a building's network infrastructure is configured for edge computing, the vendor may instead transmit a single copy of a particular update or patch to the edge computing resources of a building. From there, the building network infrastructure can ensure that the patch is quickly and seamlessly deployed to the computers of the occupants in the building who need to receive it.

In certain embodiments, a building's computing resources employs software configured to monitor building occupants' data access patterns and determine which types of content or software the occupants access most frequently. From this access behavior, the software may make decisions about which content or software to go out and proactively deploy on the building network infrastructure, i.e., in the building's edge computing resources.

Window Control System Infrastructure

As described herein, buildings can be equipped with a plurality of tintable windows that are controlled by a plurality of window controllers, both of which are together are part of a window control system. In some embodiments, a network of tintable windows in a building may be controlled by a master controller, intermediate network controllers, and leaf or end window controllers as depicted in FIG. 3. Each one of these controllers may have associated processing capability and memory. As well, as described above, photon cells may allow the transparent window itself to be a memory device. A controller may have, e.g., the processing power of a mobile phone or a performance desktop computer. Controllers may have associated memory and data storage devices (e.g., a solid state disk ("SSD")) that may be greater than about 10 GB, greater than 100 GB, greater than 1 TB, or even larger. In the future, it is expected the processing capabilities of each controller may be higher as processors become faster and cheaper following the trajectory provided by Moore's law. In addition to U.S. patent application Ser. Nos. 13/449,248, 13/449,251, 15/334,835, and 15/334,832 which have previously been incorporated by reference, window controllers are also described in U.S. Pat. No. 9,454,055, filed Mar. 16, 2011, and titled "MULTIPURPOSE CONTROLLER FOR MULTISTATE WINDOWS," and U.S. Pat. No. 8,213,074, filed Mar. 16, 2011, and titled "ONBOARD CONTROLLER FOR MULTISTATE WINDOWS," which are both herein incropreated in their entireties. As such, window control systems may have substantial computing horsepower than can be used for other purposes, besides window tint control.

Window controllers (e.g., a master controller, intermediate network controllers, and leaf or end window controllers) may be configured for wired or wireless communication with one another. In some embodiments, controllers may communicate hierarchically as depicted in FIG. 3, however, is need not be the case. In some embodiments, an end window controller may communicate to another end window controller or a master controller via a direct wired or wireless connection, or through a communication path that goes between one or more intermediate window controllers. Wired connections may be established using, e.g., a Controller Area Network (CAN bus) standard that is implemented using conventional data cables (e.g., Ethernet and USB). As discussed elsewhere herein, controllers may be equipped with wireless communication modules (e.g., Bluetooth, WiFi, and/or LiFi modules). Window controllers may, in some cases, communicate simultaneously via both wired and wireless connections.

Window control systems are installed with a power distribution system to power tint transitions, power controllers, and provide power to other devices such as sensors, wall control switches, etc. In some cases, a power distribution systems may have a three-tier organizational structure. In the first or top tier, a building's main power supply provides power to one or more control panels. In the second or middle tier, each control panel provides one or more trunk lines capable of providing power to about 256 windows. In the third or bottom tier, drop lines are used to power from a trunk line to a specific window or another device. Power distribution systems are further described in U.S. patent application Ser. No. 15/268,204, filed Sep. 16, 2016, and U.S. patent application Ser. No. 15/365,685, filed Nov. 30, 2016, both of which are titled "POWER DISTRIBUTION NETWORKS FOR ELECTROCHROMIC DEVICES,' and are herein incorporated by reference in their entireties. In some cases, a power distribution systems may provide electric power generated from solar energy as described in International Patent Application No. PCT/US18/18241, filed Feb. 14, 2018, and titled "SOLAR POWER DYNAMIC GLASS FOR HEATING AND COOLING BUILDINGS," which is also incorporated herein in its entirety. Power distributions may provide AC power, or in some cases, provide DC power (e.g., via a low voltage DC power grid). In some embodiments, power distribution systems may distribute power wirelessly to windows controller, sensors, or other electronic devices in the building. Windows and systems for wireless power distribution are further described in International Patent Application No. PCT/US17/52798, Filed Sep. 21, 2017, and titled "WIRELESSLY POWERED AND POWERING ELECTROCHROMIC WINDOWS," which is herein incorporated in its entirety.

The window control system may also include various sensors such as photo sensors or light sensors, occupancy sensors, temperature sensors, humidity sensors, cameras, and the like. Feedback provided by sensors on the window network can be used to automatically control window tinting (and other window functions) or be used to provide automatic control to other building systems (e.g., HVAC systems). In some embodiments, window controllers may include sensors such as current and voltage sensors to monitor the power applied to electrochromic devices via the window controllers. Sensor-based intelligence for controlling windows is further described in U.S. Pat. No. 8,705,162, filed Apr. 17, 2012, and titled "CONTROLLING TRANSITIONS IN OPTICALLY SWITCHABLE DEVICES," which is herein incorporated in its entirety. Ring sensors which may also provide information to a window control networks are described in U.S. patent application Ser. No. 14/998,019, filed Oct. 6, 2015, and titled "MULTI-SENSOR HAVING A RING OF PHOTOSENSORS," which is herein incorporated in its entirety.

The window control system may also be extended, in some cases, via communication to external devices that provide services such as sensing capabilities. For example, smartphones may provide user instructions for controlling windows via a user's interaction with a corresponding application. Smartphones may also be used to collect environmental data when the phone has, e.g., light sensors, pressure sensors, temperature sensors, a microphone, a GPS or other positioning sensor, etc. The window control system, may, in some cases, be equipped to receive and aggregate data from multiple phones to assist in making real-time assessments of environmental microclimate conditions. In some cases, the window control system may be extended through a cloud computing service such as Mobile Physics to determine or forecast ambient microclimate conditions. In some embodiments, the window control system can also receive information from sensors that may be dedicated to a purpose other than providing data used for controlling tintable windows. For example. window control systems may receive information from sensors dedicated to HVAC systems, security systems, (e.g., cameras), lighting systems, and the like.

The window control infrastructure may be configured to interact with various devices and/or services not directly within or under the control of the infrastructure. For example, infrastructure may be configured to provide information to and/or take information from various computing devices that connect to the infrastructure. Examples of such computing devices include smartphones, smartwatches, tables, personal computers, laptops, servers, clusters of servers, etc. Other external devices that are not dedicated to computing, but may nonetheless communicate with the window control infrastructure include drones, augmented or virtual reality devices, cars (including driverless cars), robots, and the like. The window control infrastructure may be configured to communicate with various types of external services such as cloud computing services (e.g., Microsoft Azure™), personal assistants (e.g., Microsoft Cortana™), and the like.

Location of the Window System Infrastructure on the Building "Skin."

Tintable windows, and the associated framing (mullions, transoms, etc.) are primarily located on the outside or "skin" of a building structure. While conventional communication and power distribution systems expand outward from the center of a building, a window control system covers the shell or skin of a building and extends inwards towards the building's center. Generally, the infrastructure of a window control system (e.g., controllers, cabling, etc.) is located in proximity to all tintable windows, including those in the building interior. Since the window control system is located on the skin of a building and windows are generally plentiful, a device within the building's interior will typically have a straightforward means of connecting to the window control system via a wired or wireless connection to receive power and/or communication. In many cases, connecting to the window control system on a building's shell is a simpler task than connecting to a conventional power or communications artery that might be tucked away in an inconspicuous place in the building. Another advantage of the window control system's location is that by being located on the shell or skin of the building, power and communication services can easily be provided to devices and systems outside of the building.

When new buildings are constructed, there are a number of advantages that can be seen when the window control system is leveraged for and by other systems. During building construction, the window control system may be the first power and communications infrastructure in the building. For example, in a multistory building that is erected, the window control system may be installed on the lower floors, even while the framing of higher floors has not yet been completed. By being integrated into the skin of a building as it is constructed, other later installed systems may benefit from piggybacking on the power and communications infrastructure provided by the window control system.

Commercial buildings (e.g., multi-tenant commercial buildings), residential buildings (e.g., single-family and multifamily dwellings), and any other building structures (e.g., stadiums, hospitals, airports, etc.) can benefit from the power and communications infrastructure provided by a window control system. In all cases, the window control system infrastructure is located primarily on the building skin. A single family residential building may have, e.g., about 20,000 square feet of tintable window surface area, while large multi-story commercial may have, e.g., many hundreds of thousands of square feet of tintable window surface area.

Using the Window Control System Infrastructure

In some cases, a building management system (BMS) can receive power, monitor, and/or control various building systems via a window control system infrastructure. In some embodiments, the window control system itself acts as a BMS, monitoring and controlling various building systems besides or external to the window control system.

In some cases, the window control system can be used for or may be joined to, a lighting system. For example, photosensors connected to the window control network may determine ambient light levels, occupancy sensors may determine if someone is in a room, and asset tracking provided by windows can determine, in some cases, what user(s) are in a room via locating devices associated with those users or. Such information can be used to determine how artificial lighting should be adjusted. For example, a preferred lighting level might be inferred or determined for a particular user based on the user's preferences entered via a mobile device or based on the user's history of manually controlling tint states and artificial lighting settings. In some cases, a low voltage DC power distribution grid, e.g., provided by an interruptible power source that provides power the window control system may also be used to provide power to a lighting system. In some cases, as discussed herein, transparent displays can be used to provide interior lighting in a room.

As another example, a security system may use the infrastructure of the window control system. For example, cameras and door-locks can be powered and/or commutate to a security system via the window control system. Tintable windows, in some cases, may act as sensors for a security system when, e.g., it is detected that a window (and/or transparent display) has been broken. In some cases, tintable windows can also be involved as part of a response to a security or safety threat. For example, directions and egress lighting can be provided on transparent displays. In some cases, windows can be tinted or cleared depending on the type of threat and the window's proximity to the detected threat.

In some cases, the window control system can be used for home automation applications akin to services provided by Google's NEST, Amazon's Alexa, or Apple's Homekit systems. For example, building occupants can easily provide input (e.g., via voice, touch, and/or gesture commands) or receive information (e.g., visually or via an IGU speaker) via windows that have transparent displays. Windows can act as an interface allowing a user to control various home systems. Using sensor feedback and logic operating on the window control systems, the window control system can, in some cases, provide automated control of devices and appliances.

In one example, window control systems can be used for home entertainment applications. For instance, the window control system can enable a resident to listen to their music, or view content displayed on windows, in an uninterrupted manner as the resident moves between rooms. This provides a hands-free experience that does not bother occupants in other portions of the building. In some cases, a resident's location may be tracked via their mobile device (or via other sensors on the window network such as motion or occupancy sensors, $CO_2$ sensors and the like) and the volume of speakers can be adjusted and/or a window can be selected for displaying content accordingly.

A window control system may, in some cases, replace or obviate the need for information technology (IT) systems in a building. Buildings often have dedicated rooms or closets that are dedicated to equipment providing shared computing resources. These rooms, sometimes referred to as server rooms, are often filled with server racks, cabling, hard drives, CPUs, energy management systems, and cooling systems, etc. With the network provided via the window control systems, the collective computing resources of controllers in the window network system can be used to accomplish the same functions of a dedicated server room. Since a power and communication infrastructure is already in place for the window control system, there may be no need for a separate conventional server or IT room that provides computing resources to the building via a local area network. An end user working on a personal computing device may be unaware of this distinction.

Other Functions of the Window Control System

As discussed herein, IGUs can be configured with antennas for providing wireless communication to environments on either side of an IGU and can be configured block wireless communication from passing through an IGU. In such cases, the window network may be used as a firewall system that regulates what RF communications (e.g., Bluetooth and WiFi) are permitted to pass into or leave a building. Firewall logic operating on the window control system may determine whether received WiFi signals meet the predetermined rules of the firewall logic. Predetermined rules of the firewall logic may be similar to those used for WiFi routers and network security systems for regulating network traffic. The rules may be configured by a building administer or IT team; for brevity, various rules commonplace in firewall system are not discussed in further here.

In some cases, window control networks can be configured to control RF communications entering or exiting a building. For example, if windows are equipped with EMI shields, signals received on one side of a window may need to be approved by the firewall logic before being retransmitted on the other side of the window. In some cases, firewall logic may be used to determine whether EMI shielding is set to an "on" or "off" mode. In some embodiments, a window may be configured to listen to WiFi communications between devices on either side of a window. If the communication between the two devices is determined to break the rules imposed by the firewall logic, the shielding functionality may be turned on to block further communication. In other situations, an EMI may first be in an "on" or blocking state and later be turned off after determining that communication from a device on either side of the window meets the rules of the firewall logic.

Window control systems can also provide various proximity and personalization services as discussed herein. These services can be provided based on, e.g., a users' schedule, a user authenticating themselves to the window control system (e.g., via a passphrase, a thumbprint, or image recognition), or a user carrying a mobile device that is tied to an account of the user that can be tracked or can communicate with the window control system. Personalized services can be provided directly through windows themselves, e.g., via tinting windows and digital content display, or may be provided, e.g., via the window control system's automatic control of other building systems.

As discussed in greater detail in International Application No. PCT/US17/31106, previously incorporated by reference, the analysis of wireless signals transmitted or received by the window control system can be used to determine the location of a corresponding wireless device. The wireless device can be, e.g., a phone, tablet, or a tag that can be attached to any asset that a user wished to track. In some cases, the wireless device includes an ultra wideband chip and windows configured to send and/or receive ultra-wideband ("UWB") signals can determine the location of the device. In some cases, the precision of a device can be located to a precision of 10 cm or less within the building. In some cases, the window control system can enforce geofencing rules that define where assets are permitted or events that occur when an asset moves beyond a defined boundary. In some embodiments, the window control system can monitor the location and movement and assets within a building and upon a user request display the location of a requested asset on a floorplan of the building.

In some cases, tintable windows may have camera-based sensors, e.g., facing an interior environment or an exterior environment. Cameras can provide images or video that can be used, e.g., to authenticate a user, or for security event detection. In some cases, camera-based sensors in the IR range can be used to monitor temperature distribution in a room. In some cases, camera-based sensors can be used to monitor light flux passing through a window. In some cases, cameras can be used to monitor light penetration or glare caused by light reflecting off an adjacent building. Camera-based sensors may, in some cases, be tuned to a particular frequency of light to, e.g., monitor the tinting effect of a window or monitor for LiFi communication.

Example Embodiments and Implementation Details for Using Spare Computing Resources from Window Network As discussed, window controllers (e.g., a master controller, network controllers, and/or end window controllers) may have computing resources that are made available to other devices and systems via the window communication network. In some cases, other devices on a window network, such as sensors (e.g., a ring sensor) and control panels may be configured to provide computing resources. Controllers and other devices may provide processing power and digital storage to the window control network via wired and wireless connections. Controllers may offer long-term data storage provided by, e.g., conventional hard drives or solid-state drives. High-speed RAM may also be included in controllers for accomplishing certain computational tasks. In some embodiments, window controllers may use, e.g., Oracle's M8 SPARC processor, or a modern equivalent.

Because a window controller has a defined amount of processing power and storage, the available spare computing resources available via a window control may be specified in terms of the number of window controllers in the building. Further, the number of window controllers may scale with the surface area of tintable windows in a building. For example, a building having 20,000 square feet of tintable window surface area may have about 100 window controllers. In some implementations, this many controllers may house computing power equivalent to about three racks in a typical server room for, e.g., IT purposes. Of course, the processing per window controller depends on the type of processor used in the window controller. While window controllers sometimes have microcontrollers, which have relatively limited processing power, window controllers may alternatively, or additionally, include microprocessors, which have additional processing power. In one example, a window controller employs a microprocessor with the ARM architecture or other reduced instruction set computing architecture.

Controllers may have computing power in excess of what is actually needed for operation of the window control system. Conventionally, the role of window controllers is to simply receive instructions and interpret those instructions as requiring a particular type of transition and then execute a pre-programmed profile necessary to cause the window to make the requested tint transition. This process takes place only infrequently, particularly under certain weather conditions and at night. As a result, window controllers sit idle most of the time. As described in this disclosure, window controllers may also be used one or more other functions including, e.g., analyzing sensor data, displaying images or video on a transparent display, running firewall logic, etc. Even with these added tasks, a window controller may be idle much of the time and leaving processing power available for non-window tasks.

Network Communications Protocols—Conventional window network systems operate using a polling method of communication where a first controller, e.g., a master controller periodically polls a second controller, e.g., a network controller which provides a current data reading of particular values, e.g., the current tint states of particular IGUs. In some embodiments, controllers on a window control network operate using a Processing Data Object ("PDO") protocol. Using a PDO protocol, peripheral controllers and devices (e.g., sensors) communicate information only when they determine that they should. For example, if the status of a particular parameter monitored by the window controller is not change over time, the window controller need not communicate this status on the network; this contrasts from the conventional polling method where a status would be provided at regular intervals whether or not a change in the monitored parameter has been detected. By configuring window controllers and other peripheral devices on the window network to make some decisions themselves, such as when a status change merits communicating, the amount of network traffic is reduced. Even within a PDO type paradigm, it may be appropriate in some cases for the window controller to still provide status information at some periodic interval, just much less frequently than the intervals that would be used during normal pulling approach.

Both polling and PDO communications protocols can be implemented in a conventional CAN architecture implemented with a two-wire bus. Higher layers in the CAN protocol stack permit implementation of PDO versus polling-based data transfer. In some embodiments, alternatives to the CAN architecture can be used. For example, in some cases, point-to-point protocols such as TCP/IP may be used. In general, any such protocol supports a physical layer, one or more communications layers, and a security and/or applications layer may be suitable.

One advantage of the edge computing infrastructure is that it often allows for computing to be conducted closer to where data is created and used within a building. For example, in a building have a window control system which provides distributed edge computing, a computational task may be sent to the closest edge device (e.g., an end or leaf window controller) in the building rather than to a conventional server room or a cloud-based service. Each of the window controllers and/or other computing devices in a tintable window system serves as an edge device, i.e., a small data center to process and/or store data locally, e.g., within a building where the data originated. Examples of companies providing edge computing resources include Microsoft (Azure IOT Edge), Amazon (AWS Greengrass), Alphabet, GE (GE Predix), and Ethereum (a blockchain powered architecture).

Software/Logic enabling Window Processor Computing—In some embodiments, window controllers may run real-time operating systems ("RTOS"). Real-time operating systems allow a window controller controllers to perform many tasks that might conventionally be performed by a managing controller such as a master controller. In a RTOS, a window controller can acquire data and locally store and access data in RAM or other solid state memory. For example, a window controller can, in some cases, keep a running log of current, voltage, temperature, and/or light data associated with a tintable window. In some cases, window controllers can run tasks such as periodic or event-based reporting of local conditions (e.g., reporting that the local light flux has exceeded a threshold value).

Shared/Distributed processing—As mentioned the excess computing power of controllers on the window network can be leveraged for other uses. In some cases, controllers on the window network may be organized in a peer-to-peer or a master-slave configuration. In some cases, a load balancing product, such as IBM's Cloud Orchestrator™ can be sued to perform load balancing of tasks across multiple controllers. In some cases, window controllers can use a blockchain technology such that used for Bitcoin and the open source program Gridcoin which uses the Berkeley Open Infrastructure for Network Computing. To implement distributed processing, the window controllers or other computing resources on a tintable window system may have a container architecture. The container architecture may be implemented via a container management layer in a network protocol. One example of a resource for implementing distributed processing via a container architecture is Docker for the Linux Containers (LXC) format. Docker provides namespaces to isolate an application's view of the operating system, including process trees, network resources, user IDs, and file systems.

As with computational processing which can be shared and/or distributed amongst window controllers. Storage can also be shared amongst a multiple devices. Generally this is implemented using a standard storage architecture such as Network Attached Storage (NAS), Network File System (NFS), or Storage Area Network (SAN). For example, a window control system may offer 100 terabytes of local storage within the building it has 100 window controllers each having 1 terabyte of data. In some cases, storage devices are configured used a Redundant Array of Independent Disk ("RAID") configuration to protect from data loss that may be caused by, e.g., a failure of one of the data storage devices.

By having the distributed processing and storage architecture, the system may also be easily upgradable if desired by a building owner. For example, if a building owner wishes to increase the local memory or increase the processing capabilities of a window control system, storage devices or processors at window controllers can be upgraded individually, such that end users and systems making use of the window control system do not experience an interruption to the services provided. In some cases, controllers are modular in design so that the storage, RAM, and/or processing capabilities of the window controller can be easily upgraded. In other embodiments, entire window controllers may be replaced incrementally window controllers having improved benchmarks.

In some embodiments, window controllers may be configured to communicate using wireless protocols other than simply Bluetooth and/or WiFi. For example, a window controller may communicate over wireless ad hoc networks using, e.g., a Zigbee or EnOcean which may have lower power requirements and in some cases have a greater range than WiFi communications. Such wireless communication may be ideal for low power sensors that run on batteries or receive power wirelessly.

When the window control system is used for multiple functions, possibly controlled by different entities, virtualization, security, and/or quality of service may be implemented on the infrastructure.

In many cases, the edge computing platform provided by the disclosed window control system can provide advantages to the window system itself. For example, sensor data near a window can be received, processed, and acted upon without requiring large amounts of sensor data to be provided to an upstream controller to perform analysis. Some examples of processing capabilities of the edge computing platform are now provided.

(1) In one example, a window controller detects or determines a condition or event that is useful to other components of the window network system. For example, when a window controller determines that the light intensity increases beyond a particular threshold level, the window controller may notify other processing components on the window network, such as a master controller, which can, in turn, determine when the window should tint and by how much.

(2) In another example, a window controller or a plurality of window controllers can commission other devices in the vicinity of a window controller. Window controllers can determine the locations of components in the vicinity using triangulation or another appropriate approach (e.g., using a received signal strength indicator (RSSI)). In some cases, individual window controllers, or a group of window controllers collectively, can be responsible for determining and reporting the locations of window-relevant components near them.

(3) In some embodiments, window controllers can provide security to the window control network by only allowing communications with devices known to the window controller. For example, sensors and/or controllers from systems other than the tintable window system may provide information to a window controller and/or request information from the window controller. In some cases, data provided may be inaccurate resulting undesired automatic control of tintable windows, or data may be requested for deviant purposes (e.g., a potential thief might attempt to find out when a room will be unoccupied based on a history of occupancy sensor data). Thus, window controllers can be configured to only communicate with trusted devices. For example, the window controller may communicate with only a few devices, which are located in sufficiently close proximity to permit wireless communication. The tintable window system may have previously authenticated such devices, and the window controller may have performed some or all of the procedures required for authentication, during, e.g., an installation by an administrator.

(4) In other example, a window controller uses its own measurements of current, voltage, including open circuit voltage, temperature, etc. to determine whether to adjust tint transition parameters; e.g., to speed up or terminate early a tint transition. Methods for adjusting tint parameters based on these measured window parameters are further described in U.S. Pat. No. 9,412,290, filed Jun. 28, 2013, and titled "CONTROLLING TRANSITIONS IN OPTICALLY SWITCHABLE DEVICES."

(5) In other example, a window controller can be notified of a utility alert (e.g., a high demand or brownout condition), and the window controller takes appropriate tinting action. For example, upon being notified that the power supply has been cut the window controller may transition a tintable window to a safe (clear) state in a controlled manner before the supply of locally stored power (e.g., in a battery at the window controller or located in the power distribution grid) is exhausted. Transitioning electrochromic windows to a safe state can prevent damage to the electrochromic window if the local power reserve is exhausted before the normal power supply is back online. In cases where there is not sufficient power to transition all of the tintable windows to a safe state, window controllers may prioritize tinting more expensive windows to a safe state before less expensive windows. In some cases, window controllers may transition into a sleep mode that consumes less energy. Additional examples of how controllers can respond to accommodate issues associated with high energy demands and/or low energy availability are described in U.S. patent application Ser. No. 15/739,562, filed Dec. 22, 2017, and titled "POWER MANAGEMENT FOR ELECTROCHROMIC WINDOW NETWORKS" which is herein incorporated in its entirety.

(6) In some embodiments, the window control system may directly or indirectly provide installation and/or repair instructions to construction personnel. For example, a transparent display on a window may display an error report detailing a detected failure of a device. A display may, e.g., indicate where the failed component is located and provide repair instructions as needed. Alternatively, or in addition, the window control system may provide instructions via wireless communication to personal computers, tablets, smartphones, etc.

By implementing a PDO communications protocol and performing computational processes on individual controllers, traffic caused by transferring large amounts of raw data and/or routine polling of devices is reduced. Freed bandwidth can then be used by other devices which make use of the computational resources provided by the window control system.

Window controllers can in some embodiments only be configured to communicate with authenticated devices. Only those sensors or other data collecting or controlling devices (external to the window network) that have been authenticated that have been, e.g., authenticated by an administrator or are known to the window controller are then permitted to pass data on to the window network (through the window controller). This approach reduces or eliminates communication of authentication certificates and other data associated with authenticating communications in real time which can help free up additional network bandwidth.

Relatedly, most or all of the computing needs of the window tinting network (and other building systems) can be conducted locally, on devices such as window controllers within local edge computing platform provided by the window control system. There is little or no need for sending sensitive information outside the tintable window system. To the extent that some processing or storage is needed outside the tintable window system, only information that is relatively non-sensitive need be communicated out of the system. Concepts associated with a "personal cloud" may be enabled using the computing power of the tintable window system.

Another advantage of the distributed computing platform is that sensors and other peripheral devices will need less processing resources if they can rely on local window controller(s) to perform the data processing for them. For example, a sensor that communicates with a window network need not include a communication stack or an ability to make its own decisions related to applications assigned to the sensor. For example, an infrared camera occupancy sensor can provide the raw camera data to the window controller which can perform required image analysis to determine if and how many occupants are present. This approach can also be used for sensors and devices such as, thermometers, gas detectors, and light detectors, and the like.

In some cases, the power and communications infrastructure provided by a window control system can replace other building systems such as the BMS, security systems, IT systems, lighting systems, etc. The storage and processing infrastructure of the tintable window system provides most or all infrastructure needed for these and other functions. To the extent that security is required between functions sharing the infrastructure, virtual networks (e.g., VLANs) can be used.

Example Embodiments—Power Distribution

In some embodiments, a power distribution system may be a single wired system which delivers power to tintable windows and one or more other systems (for example a HVAC system, a lighting system, a security system, etc.). The power distribution infrastructure is entirely wired (as opposed to wireless). The decisions that result in power being delivered to a non-window system component (e.g., a light) can be made by the non-window system or by the window system.

In some embodiments, a lighting system element or other non-window system component may have power delivered via a tap off of a window trunk line. As such, the non-window system may share an AC or DC control panel from the window power distribution system. Generally speaking, power may be provided to any non-window system using any power distribution system described in U.S. patent application Ser. No. 15/268,204, U.S. patent application Ser. No. 15/365,685, or International Patent Application No. PCT/US18/18241 which have previously been incorporated by reference.

In some embodiments, a window control system may have parallel wired power distribution systems. One distribution system may be dedicated to the window tinting function, and another may be dedicated for use by other building functions such as heating and cooling systems. In this configuration, some decision-making for the other building functions is provided in the window control system infrastructure. In other words, the window control system controls some non-window systems in the building. Decisions made by the window control system infrastructure are communicated to these other building systems, which implement the decisions by receiving power over the distribution system dedicated for use by non-window functions. For example, the window control network may determine that LED lights for normal use or emergency lighting should be powered on at particular times, and the window network provides such decisions to some building system (e.g., a lighting system or security system) that then causes the appropriate lights to receive power, or a causes the power distribution system to deliver power to the appropriate lights, even though those lights are powered by a system that is not part of the window power distribution system.

In some embodiments the window control system may include a means for providing wireless power delivery. This wireless power carrying capability may be provided as part of the power distribution system that provides power to window controllers and/or a separate and/or non-window power distribution system. Other than the fact that some of the power carrying capability is in the form of a wireless medium, this approach can be otherwise identical to the first or second approach as described above.

CONCLUSION

It should be understood that the certain embodiments described herein can be implemented in the form of control logic using computer software in a modular or integrated manner. Based on the disclosure and teachings provided herein, a person of ordinary skill in the art will know and appreciate other ways and/or methods to implement the present invention using hardware and a combination of hardware and software.

Any of the software components or functions described in this application, may be implemented as software code to be executed by a processor using any suitable computer language such as, for example, Java, C++ or Python using, for example, conventional or object-oriented techniques. The software code may be stored as a series of instructions, or commands on a computer-readable medium, such as a random-access memory (RAM), a read-only memory (ROM), a magnetic medium such as a hard-drive or a floppy disk, or an optical medium such as a CD-ROM. Any such computer readable medium may reside on or within a single computational apparatus, and may be present on or within different computational apparatuses within a system or network.

Although the foregoing disclosed embodiments have been described in some detail to facilitate understanding, the described embodiments are to be considered illustrative and not limiting. One or more features from any embodiment may be combined with one or more features of any other embodiment without departing from the scope of the disclosure. Further, modifications, additions, or omissions may be made to any embodiment without departing from the scope of the disclosure. The components of any embodiment may be integrated or separated according to particular needs without departing from the scope of the disclosure.

Although the foregoing embodiments have been described in some detail for purposes of clarity of understanding, it will be apparent that certain changes and modifications may be practiced within the scope of the appended claims. It should be noted that there are many alternative ways of implementing the processes, systems, and apparatus of the present embodiments. Accordingly, the present embodiments are to be considered as illustrative and not restrictive, and the embodiments are not to be limited to the details given herein.

What is claimed is:

1. A system for transmitting power and data in a building, the system comprising:
(a) a communication network comprising a cable; and
(b) a power distribution system comprising a plurality of power transmission paths connecting one or more power sources, the plurality of power transmission paths comprises the cable, the cable being configured to (i) transmit electrical power and (ii) communication,
the communication network comprising (I) one or more communications interfaces to one or more processors and/or (II) one or more other communications networks;
wherein (A) the system comprises one or more displays disposed on and/or registered with an insulated glass unit (IGU), which one or more displays are communicatively coupled to the communication network, and (B) the communication network is configured to transmit wireless communications.

2. The system of claim 1, wherein the system is operatively coupled to one or more systems of the building, which one or more systems comprise a control system configured to control tintable windows, a video display system, a geofencing system, an identification tracking system, or a wireless power delivery system.

3. The system of claim 2, wherein the identification tracking system is based on a global positioning system or ultrawide band technology.

4. The system of claim 1, wherein the one or more communications interfaces interface with a data processing module of the one or more other communications networks.

5. The system of claim 1, further comprising one or more antennas communicatively connected to the one or more other communications networks.

6. The system of claim 5, wherein the one or more antennas are connected to the communications network via one or more controllers configured to control tintable windows of the building.

7. The system of claim 5, wherein the one or more antennas are directly connected to the communications network and not via a controller configured to control tintable windows of the building.

8. The system of claim 5, wherein the one or more antennas are configured to provide data and/or power for (a) mobile electronic devices and/or (b) one or more building systems.

9. The system of claim 5, wherein the one or more displays are communicatively coupled to the one or more other communications networks.

10. The system of claim 1, wherein the one or more displays comprise a transparent display disposed on, or registered with, at least one of a plurality of optically switchable windows.

11. The system of claim 10, wherein (A) the one or more displays are a plurality of displays that form a digital canvas and/or (B) are configured to facilitate whiteboard functionality.

12. The system of claim 10, wherein the one or more displays comprise a transparent organic light emitting diode (OLED) display.

13. The system of claim 10, wherein the one or more displays comprise a transparent high definition (HD) display configured to provide at least 960×540 pixels per frame.

14. The system of claim 1, wherein the one or more processors are included in one or more controllers configured to control, or direct control of, (a) tintable windows, (b) one or more devices controlled by a building management system, (c) security system, (d) door lock system, (e) elevator system, and/or (f) lighting system.

15. The system of claim 1, wherein the one or more other communications networks comprise a building management system network, a building lighting network, a security system network, a door lock network, an elevator network, or the Internet.

16. The system of claim 1, wherein the plurality of power transmission paths comprises one or more trunk lines that include the cable.

17. The system of claim 16, wherein the one or more trunk lines supply power and/or communications to a plurality of devices via one or more controllers.

18. The system of claim 17, wherein the plurality of devices includes a display, a lock, a camera, an elevator, an environmental sensor, a lighting device, a smartphone, a personal computer, an electronic tablet, or any combination or plurality thereof.

19. The system of claim 16, wherein the one or more trunk lines are part of a horizontal data plane for each floor of the building, and wherein the communication network comprises vertical data planes comprising high speed optical fiber communication lines.

20. The system of claim 1, wherein the plurality of power transmission paths comprises class one rated cable and/or class two rated cable.

21. The system of claim 1, wherein (a) the power distribution system is configured to deliver wireless power.

22. The system of claim 1, wherein the power transmission paths are arranged in (a) a hierarchical topology, (b) a topology that includes horizontal and/or vertical data planes, or (c) a hierarchical topology and in a topology that includes horizontal and/or vertical data planes.

23. The system of claim 1, wherein the one or more communications interfaces comprise network adaptors configured to permit the one or more data processors and/or the one or more other communications networks to communicate over the communication network using at least one defined network protocol.

24. The system of claim 23, wherein the at least one defined network protocol is configured to facilitate transmission of fifth generation (5G) cellular communication, short range wireless communication, and/or ultrawide band communications.

25. The system of claim 1, wherein the system is operatively coupled to one or more building systems comprising a building management system, an environmental conditioning system, a security system, a lighting system, a door lock system, a fire system, an elevator system, or a wireless communications system.

26. The system of claim 1, wherein the plurality of power transmission paths includes coaxial cables, twisted pair conductors and/or optical fibers.

27. The system of claim 1, wherein the one or more displays are communicatively coupled to the one or more other communication networks.

28. The system of claim 1, wherein the wireless communications are configured to comply with at least one defined network protocol that is configured to facilitate (i) transmission of fifth generation (5G) cellular communication, (ii) short range wireless communication, and/or (iii) ultrawide band communications.

29. A method of transmitting power and data in a building, the method comprising: providing a system comprising:
  (a) a communication network comprising a cable; and
  (b) a power distribution system comprising a plurality of power transmission paths connecting one or more power sources, the plurality of power transmission paths comprises the cable, the cable being configured to (i) transmit electrical power and (ii) communication,
  the communication network comprising (I) one or more communications interfaces to one or more processors and/or (II) one or more other communications networks; and
  using the system to transmit power and data in the building,
  wherein, (A) the system comprises one or more displays disposed on and/or registered with an insulated glass unit (IGU), which one or more displays are communicatively coupled to the communication network, and (B) the communication network is configured to transmit wireless communications.

30. The method of claim 29, further comprising receiving software and/or data, via a connection to an external network, from a remote site that is remote from the building.

31. The method of claim 30, wherein the software and/or data is a copy or instance of a master version of software and/or data stored on the remote site.

32. The method of claim 30, further comprising installing or storing the software and/or data on a first data storage device on a building data communications network.

33. The method of claim 32, wherein the building data communications network comprises a plurality of processors disposed within the building and a plurality of data storage devices, including the first data storage device, disposed within the building.

34. The method of claim 33, wherein the building data communications network further comprises communication lines connecting the plurality of processors and the plurality of data storage devices.

35. The method of claim 34, wherein the communication lines are disposed in or on outer walls and/or one or more façades of the building.

36. The method of claim 32, further comprising providing the software and/or data from the first storage device, or providing results of executing the software, to a computational device in the building via the building data communications network.

37. The method of claim 29, wherein providing the system comprises installing the system in the building.

38. The method of claim 37, further comprising installing a plurality of optically switchable windows at locations in the building.

39. The method of claim 29, wherein the wireless communications are configured to comply with at least one defined network protocol that is configured to facilitate (i) transmission of fifth generation (5G) cellular communication, (ii) short range wireless communication, and/or (iii) ultrawide band communications.

\* \* \* \* \*